(12) United States Patent
Ohki et al.

(10) Patent No.: US 9,553,152 B2
(45) Date of Patent: Jan. 24, 2017

(54) SEMICONDUCTOR DEVICE

(71) Applicant: FUJITSU LIMITED, Kawasaki-shi, Kanagawa (JP)

(72) Inventors: Toshihiro Ohki, Hadano (JP); Lei Zhu, Atsugi (JP); Naoya Okamoto, Isehara (JP); Yuichi Minoura, Zama (JP); Shirou Ozaki, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/560,425

(22) Filed: Dec. 4, 2014

(65) Prior Publication Data

US 2015/0194512 A1 Jul. 9, 2015

(30) Foreign Application Priority Data

Jan. 8, 2014 (JP) ................. 2014-001800

(51) Int. Cl.

| | |
|---|---|
| *H01L 29/66* | (2006.01) |
| *H01L 29/205* | (2006.01) |
| *H01L 29/423* | (2006.01) |
| *H01L 29/49* | (2006.01) |
| *H01L 29/778* | (2006.01) |
| *H01L 29/78* | (2006.01) |
| *H01L 29/10* | (2006.01) |
| *H01L 29/20* | (2006.01) |
| *H01L 29/51* | (2006.01) |
| *H01L 29/08* | (2006.01) |

(52) U.S. Cl.
CPC ......... *H01L 29/205* (2013.01); *H01L 29/1045* (2013.01); *H01L 29/4236* (2013.01);
(Continued)

(58) Field of Classification Search
CPC ... H01L 29/778; H01L 29/2003; H01L 29/205
(Continued)

(56) References Cited

U.S. PATENT DOCUMENTS

2010/0044752 A1* 2/2010 Marui ................. H01L 29/7787
257/192
2010/0314663 A1 12/2010 Ito
(Continued)

FOREIGN PATENT DOCUMENTS

JP 2002-359256 A1 12/2002
JP 2008-205414 A1 9/2008
(Continued)

OTHER PUBLICATIONS

Office Action of Taiwanese Patent Application No. 103142394 dated Feb. 15, 2016, with English summary of TWOA.

*Primary Examiner* — Tan N Tran
(74) *Attorney, Agent, or Firm* — Kratz, Quintos & Hanson, LLP

(57) ABSTRACT

A semiconductor device includes: a first semiconductor layer which is formed over a substrate and is formed from a nitride semiconductor; a second semiconductor layer which is formed over the first semiconductor layer and is formed from a nitride semiconductor; a third semiconductor layer which is formed over the second semiconductor layer and is formed from a nitride semiconductor; a source electrode and a drain electrode which are formed over the third semiconductor layer; an opening which is formed in the second semiconductor layer and the third semiconductor layer between the source electrode and the drain electrode; an insulating layer which is formed on a side surface and a bottom surface of the opening; and a gate electrode which is formed in the opening through the insulating layer.

10 Claims, 72 Drawing Sheets

(52) U.S. Cl.
CPC .... *H01L 29/4983* (2013.01); *H01L 29/66462* (2013.01); *H01L 29/66704* (2013.01); *H01L 29/7786* (2013.01); *H01L 29/7825* (2013.01); *H01L 29/0878* (2013.01); *H01L 29/2003* (2013.01); *H01L 29/517* (2013.01)

(58) Field of Classification Search
USPC .................................................. 257/194, 192
See application file for complete search history.

(56) References Cited

U.S. PATENT DOCUMENTS

| | | | | |
|---|---|---|---|---|
| 2011/0272708 A1* | 11/2011 | Yoshioka | .......... | H01L 21/28264 257/77 |
| 2012/0146097 A1* | 6/2012 | Endo | ................ | H01L 29/42356 257/194 |
| 2012/0218783 A1 | 8/2012 | Imada | | |
| 2013/0056746 A1 | 3/2013 | Joshin | | |
| 2013/0292790 A1 | 11/2013 | Minoura et al. | | |
| 2014/0073095 A1* | 3/2014 | Sato | ........................ | H01L 29/32 438/172 |

FOREIGN PATENT DOCUMENTS

| | | |
|---|---|---|
| JP | 2010-10584 A1 | 1/2010 |
| JP | 2010-287725 A1 | 12/2010 |
| JP | 2011-9493 A1 | 1/2011 |
| JP | 2013-55148 A1 | 3/2013 |
| TW | 201242026 A1 | 10/2012 |
| TW | 201312746 A1 | 3/2013 |
| WO | 2012/017389 A1 | 2/2012 |
| WO | 2012/098635 A1 | 7/2012 |

* cited by examiner

GATE ACTIVE REGION

FIG. 22

| ELEMENT | WORK FUNCTION (eV) |
|---|---|
| Pt | 5.65 |
| Ni | 5.15 |
| Au | 5.1 |
| Pd | 4.9 |
| Cu | 4.65 |
| Mo | 4.45 |
| Al | 4.28 |
| Ta | 4.19 |
| Ti | 4.14 |

SEMICONDUCTOR DEVICE

CROSS-REFERENCE TO RELATED APPLICATION

This application is based upon and claims the benefit of priority of the prior Japanese Patent Application No. 2014-001800, filed on Jan. 8, 2014, the entire contents of which are incorporated herein by reference.

FIELD

The embodiments discussed herein are related to a semiconductor device.

BACKGROUND

GaN, AlN, and InN which are nitride semiconductors, materials composed of a mixed crystal thereof, and the like have a wide band gap, and thus have been used as a high-output electronic device, a short-wavelength light-emitting device, and the like. For example, GaN, which is a nitride semiconductor, has a band gap of 3.4 eV. The band gap is larger than a Si band gap of 1.1 eV and a GaAs band gap of 1.4 eV.

Examples of the high-output electronic device include a high electron mobility transistor (HEMT) as a field effect transistor (FET). An HEMT using a nitride semiconductor may be used for a high-output and high-efficiency amplifier, a large-power switching device, and the like. For example, in an HEMT in which AlGaN is used in an electron supply layer and GaN is used in an electron travel layer, piezoelectric polarization and the like occur in AlGaN due to distortion caused by a difference in lattice constant between AlGaN and GaN, and thus a high-concentration two-dimensional electron gas (2DEG) is generated. The HEMT having the above-described structure, that is, in the HEMT having a structure, in which the electron supply layer is formed from AlGaN and is formed on the GaN formed as the electron transit layer, is typically normally-on. However, in the above-described high-output electronic device, there is an application in which normally-off is demanded from the viewpoint of cost or fail-safe.

On the other hand, even in a semiconductor device having the structure other than the HEMT, a high-output electronic device may be manufactured by using a nitride semiconductor such as GaN. In the semiconductor device, a semiconductor device having a structure capable of realizing normally-off is also disclosed.

However, in the disclosed semiconductor device using GaN and the like, normally-off is possible, but a withstand voltage may not be sufficient, and thus the semiconductor device may not be suitable as a high-power switching device in some cases.

The following are reference documents:
[Document 1] Japanese Laid-open Patent Publication No. 2002-359256,
[Document 2] Japanese Laid-open Patent Publication No. 2008-205414 and
[Document 3] Japanese Laid-open Patent Publication No. 2013-55148.

SUMMARY

According to an aspect of the invention, a semiconductor device includes: a first semiconductor layer which is formed over a substrate and is formed from a nitride semiconductor; a second semiconductor layer which is formed over the first semiconductor layer and is formed from a nitride semiconductor; a third semiconductor layer which is formed over the second semiconductor layer and is formed from a nitride semiconductor; a source electrode and a drain electrode which are formed over the third semiconductor layer; an opening which is formed in the second semiconductor layer and the third semiconductor layer between the source electrode and the drain electrode; an insulating layer which is formed on a side surface and a bottom surface of the opening; and a gate electrode which is formed in the opening through the insulating layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 22 is a drawing illustrating work function values of electrode materials;

DESCRIPTION OF EMBODIMENTS

Figure 1:
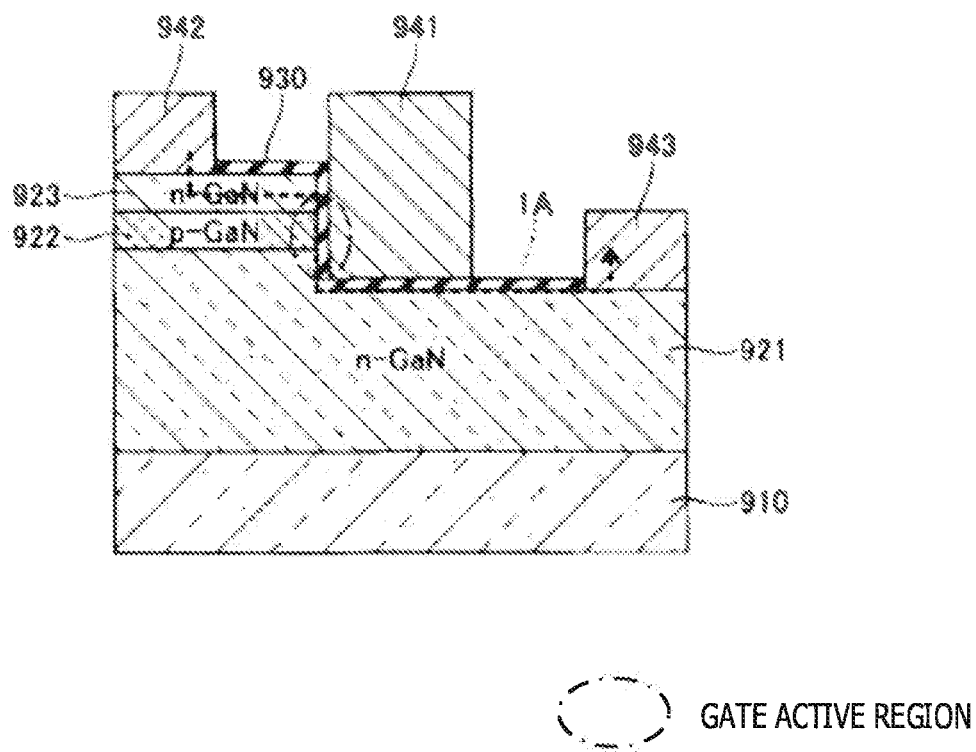
FIG. 1 is a structural diagram of a semiconductor device.

Exemplary embodiments will be described below. The same reference numerals will be given to the same members and the like, and description thereof will not be repeated.

First Embodiment

First, a semiconductor device which is formed from a nitride semiconductor and is capable of being normally-off will be described with reference to FIG. 1. In the semiconductor device, an n-GaN layer 921 is formed on a substrate 910 that is formed from a semiconductor material and the like, and a p-GaN layer 922 and an n-GaN layer 923 are laminated and formed on the n-GaN layer 921 on a source electrode 942 side in relation to a gate electrode 941 side. The source electrode 942 is formed on the n-GaN layer 923, and a drain electrode 943 is formed on the n-GaN layer 921.

An insulating layer 930 is formed from $Al_2O_3$ and the like and is formed on a front surface and a side surface of the n-GaN layer 923, a side surface of the p-GaN layer 922, and a front surface and the like of the n-GaN layer 921 between the source electrode 942 and the drain electrode 943. The gate electrode 941 is formed in such a manner that the bottom surface thereof is located on the n-GaN layer 921 through the insulating layer 930, and a part of a side surface on a source electrode 942 side comes into contact with the insulating layer 930 formed on side surfaces of the n-GaN layer 923 and the p-GaN layer 922. Accordingly, the n-GaN layer 921 and the n-GaN layer 923 which are conductive layers are formed on upper and lower sides of the p-GaN layer 922 that becomes a barrier layer against electrons.

In the semiconductor device having the above-described structure, a metal oxide semiconductor (MOS) structure is formed on a side-surface side of the p-GaN layer 922 by the p-GaN layer 922, the insulating layer 930, and the gate electrode 941. Accordingly, it is possible to realize a normally-off mode in which on-off control may be performed by a voltage applied to the gate electrode 941.

In the semiconductor device having the above-described structure, the p-GaN layer 922 and the n-GaN layer 923 are formed on a side surface on a source electrode 942 side of the gate electrode 941 through the insulating layer 930. In addition, on a drain electrode 943 side of the gate electrode 941, the drain electrode 943 is formed on the n-GaN layer 921 so as to allow a current to flow to the drain electrode 943 with a low resistance through the n-GaN layer 921. Accordingly, the p-GaN layer 922 and the n-GaN layer 923 are not formed on a drain electrode 943 side of the gate electrode 941. In addition, a broken arrow 1A in FIG. 1 represents a current path that flows when the semiconductor device is turned on.

Accordingly, a drain voltage applied to the drain electrode 943 is applied to the p-GaN layer 922, and thus a withstand voltage of the semiconductor device having the above-described structure depends on a breakdown withstand voltage of the p-GaN layer 922. Accordingly, in a case where the p-GaN layer 922 is formed to be relatively thin so as to lower an on-resistance, the withstand voltage decreases. In addition in a case where the p-GaN layer 922 is formed to be relatively thick so as to increase the withstand voltage, the on-resistance is raised. That is, in the semiconductor device having the structure illustrated in FIG. 1, the withstand voltage and the on-resistance are in a trade-off relation.

Semiconductor Device

Next, a semiconductor device according to the first embodiment will be described with reference to FIG. 2. In the semiconductor device in this embodiment, as nitride semiconductor layers, an i-GaN layer 21, a p-GaN layer 22, and an n-GaN layer 23 are formed on a substrate 10 that is formed from a semiconductor material and the like. In this embodiment, the i-GaN layer 21, the p-GaN layer 22, and the n-GaN layer 23 may be described as a first semiconductor layer, a second semiconductor layer, and a third semiconductor layer, respectively.

A source electrode 42 and a drain electrode 43 are formed on the n-GaN layer 23, and in a region in which a gate electrode 41 is formed, the n-GaN layer 23 and the p-GaN layer 22 are removed. However, in the region in which the gate electrode 41 is formed, the i-GaN layer 21 may be partially removed.

An insulating layer 30 is formed on a front surface and a side surface of the n-GaN layer 23, a side surface of the p-GaN layer 22, and a front surface and the like of the i-GaN layer 21, and the gate electrode 41 is formed on the insulating layer 30 in a region from which the n-GaN layer 23 and the p-GaN layer 22 are removed. Accordingly, a side surface on a source electrode 42 side and a side surface on a drain electrode 43 side of the gate electrode 41 are formed to come into contact with the insulating layer 30 so as to become side surfaces of the p-GaN layer 22 and the n-GaN layer 23 in combination with each other through the insulating layer 30.

In the semiconductor device in this embodiment, the i-GaN layer 21, which is the first semiconductor layer, does not contain impurities or contains few impurities. Accordingly, a resistance is high, and it is possible to improve the withstand voltage. However, when a voltage is applied to the gate electrode 41, a reverse channel is formed in the p-GaN layer 22 through the insulating layer 30, and a channel is formed in an i-GaN layer that is the i-GaN layer 21 through the insulating layer 30. Accordingly, a current flows through a current path indicated by a broken arrow 2A in FIG. 2.

In this embodiment, it is preferable that the i-GaN layer 21 that is the first semiconductor layer be a non-doped type. In addition, in a case where the i-GaN layer 21 is doped with an impurity element, it is preferable that a concentration of the impurity be $1 \times 10^{16}$ $cm^{-3}$ or less. In addition, it is preferable that a film thickness of the p-GaN layer 22 that is the second semiconductor layer be 50 nm to 1000 nm, and the p-GaN layer 22 be doped with Mg and the like as a p-type element impurity at a concentration of $1 \times 10^{18}$ $cm^{-3}$ or more. In addition, it is preferable that the n-GaN layer 23 that is the third semiconductor layer be doped with Si and the like as an n-type impurity element at a concentration of $1 \times 10^{18}$ $cm^{-3}$ or more. The insulating layer 30 is formed from a material that includes oxides, nitrides, and oxynitride of one or more elements selected from aluminum (Al), silicon (Si), tantalum (Ta), hafnium (Hf), titanium (Ti), and zirconium (Zr).

Next, the withstand voltage of the semiconductor device in this embodiment will be described. FIG. 3 illustrates a relation between a drain voltage (drain-source voltage) Vds and a drain current (drain-source current) Ids under a pinch-off condition in the semiconductor device having the structure illustrated in FIG. 1 and the semiconductor device of this embodiment illustrated in FIG. 2. In addition in FIG. 3, 3A represents characteristics of the semiconductor device having the structure illustrated in FIGS. 1, and 3B represents characteristics of the semiconductor device of this embodiment illustrated in FIG. 2. In FIG. 3, as indicated by 3A, in the semiconductor device having the structure illustrated in FIG. 1, breakdown occurs due to electric field concentration in the p-GaN layer 922 with a drain voltage of approximately 100 V. In contrast, as indicated by 3B, in the semiconductor device of this embodiment illustrated in FIG. 2, a breakdown voltage when a drain voltage is applied becomes approximately 600 V. Accordingly, in the semiconductor device in this embodiment, it is possible to improve the withstand voltage.

Method of Manufacturing Semiconductor Device

Next, a method of manufacturing the semiconductor device in this embodiment will be described.

Figure 4A:
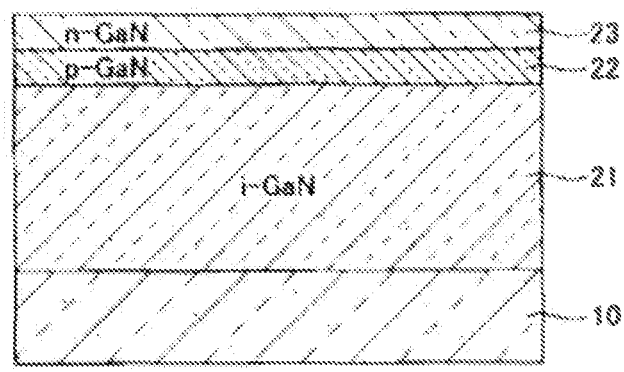
FIGS. 4A to 4C are process diagrams (Part 1) of a method of manufacturing the semiconductor device in the first embodiment.

First, as illustrated in FIG. 4A, the i-GaN layer 21 that is the first semiconductor layer, the p-GaN layer 22 that is the second semiconductor layer, and the n-GaN layer 23 that is the third semiconductor layer are formed on the substrate 10 by epitaxial growth. In this embodiment, the i-GaN layer 21, the p-GaN layer 22, and the n-GaN layer 23 are formed from a nitride semiconductor. In addition, the i-GaN layer 21, the p-GaN layer 22, and the n-GaN layer 23 are formed by epitaxial growth by metal-organic vapor phase epitaxy (MOVPE).

The substrate 10 is constituted by a silicon semiconductor substrate and the like, and the i-GaN layer 21 has a thickness of 3 μm. The p-GaN layer 22 has a thickness of 500 nm, and is doped with Mg as a p-type impurity element at a concentration of $1 \times 10^{19}$ cm$^{-3}$. The n-GaN layer 23 has a thickness of 500 nm and is doped with Si as an n-type impurity element at a concentration of $1 \times 10^{18}$ cm$^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 4B:
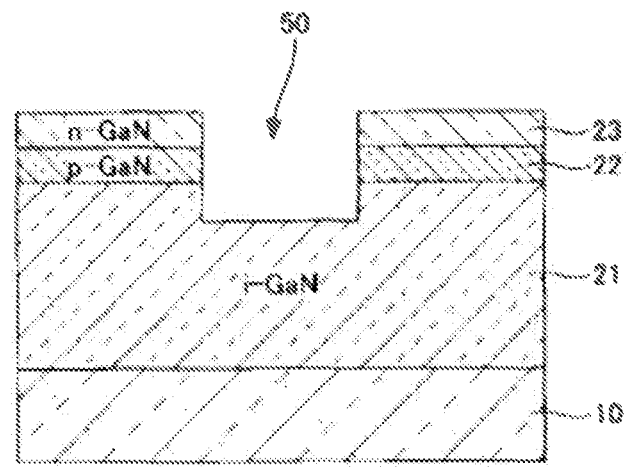

Next, as illustrated in FIG. 4B, parts of the n-GaN layer 23, the p-GaN layer 22, and the i-GaN layer 21 are removed to form an opening 50. Specifically, a photoresist is applied onto the n-GaN layer 23, and exposure by an exposure apparatus and development are performed to form a resist pattern (not shown) having an opening in a region in which the opening 50 is formed. Then, the n-GaN layer 23 and the p-GaN layer 22 are removed by dry etching such as reactive ion etching (RIE) using a chlorine-based gas to expose the i-GaN layer 21, thereby forming the opening 50. In this embodiment, when forming the opening 50, a part of the i-GaN layer 21 may be removed.

Figure 4C:
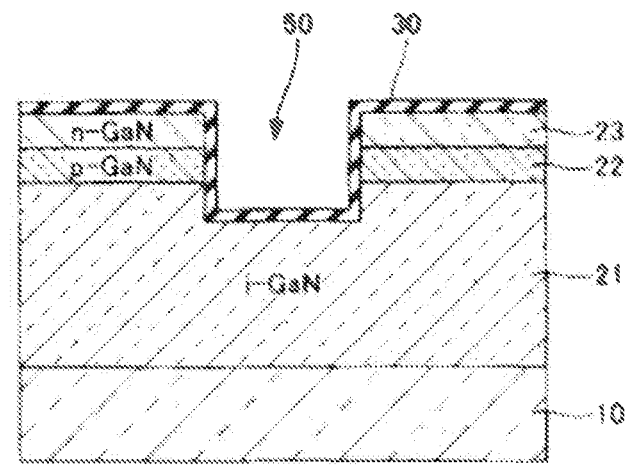

Next, as illustrated in FIG. 4C, the insulating layer 30 is formed on a bottom surface and a side surface of the opening 50, and on the n-GaN layer 23. The insulating layer 30 is formed from $Al_2O_3$ having a film thickness of 2 nm to 200 nm, for example, 20 nm. Examples of a method of forming the insulating layer 30 include atomic layer deposition (ALD), sputtering, plasma chemical vapor deposition (CVD), and the like. In this embodiment, the insulating layer 30 is formed by the ALD. According to this, the insulating layer 30 is formed on the i-GaN layer 21 that becomes a bottom surface of the opening 50, on side surfaces of the p-GaN layer 22 and the n-GaN layer 23 which become a side surface of the opening 50, and on the n-GaN layer 23.

Figure 5A:
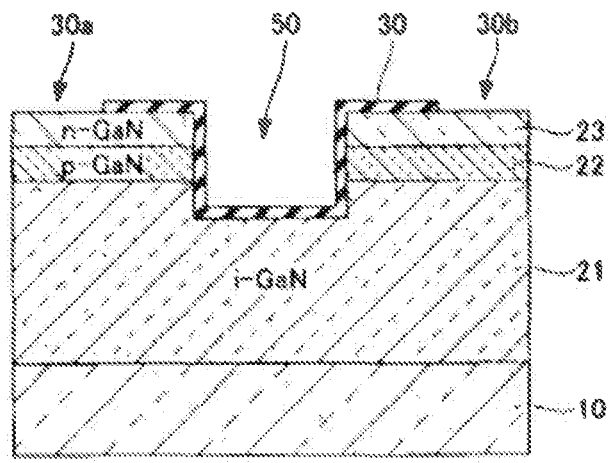
FIGS. 5A to 5C are process diagrams (Part 2) of the method of manufacturing the semiconductor device in the first embodiment.

Next, as illustrated in FIG. 5A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based or a chlorine-based gas or wet etching to expose a front surface of the n-GaN layer 23, thereby forming the openings 30a and 30b. Then, the resist pattern (not shown) is removed by an organic solvent and the like.

Figure 5B:
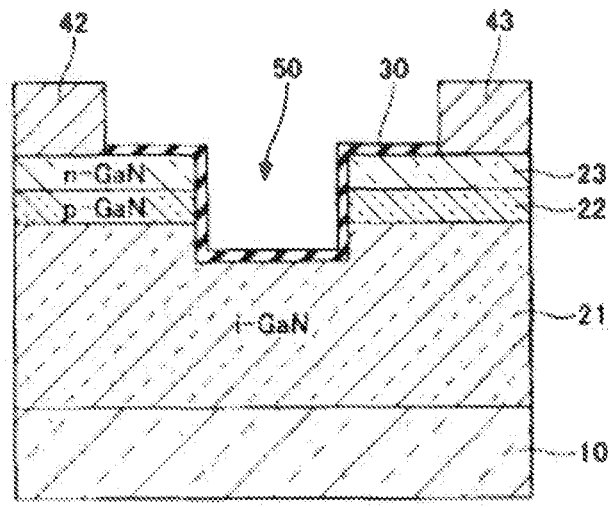

Next, as illustrated in FIG. 5B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, titanium (Ti) having a film thickness of 20 nm and aluminum (Al) having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 5C:
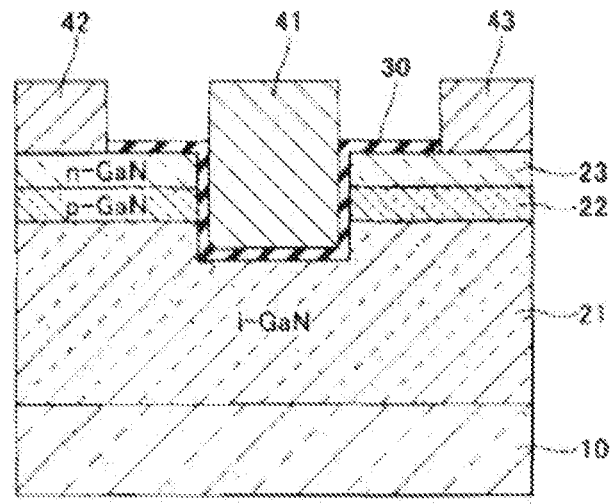

Next, as illustrated in FIG. 5C, the gate electrode 41 is formed on the insulating layer 30 in a region in which the opening 50 is formed. Specifically, a photoresist is applied onto the insulating layer 30, and exposure by an exposure apparatus and development are performed to form a resist pattern (not shown) having the opening 50 through the insulating layer 30, that is, an opening in a region in which the gate electrode 41 is formed. Then, nickel (Ni) having a film thickness of 30 nm and gold (Au) having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 50.

According to this, the semiconductor device in this embodiment may be manufactured.

Second Embodiment
Semiconductor Device

Figure 6:
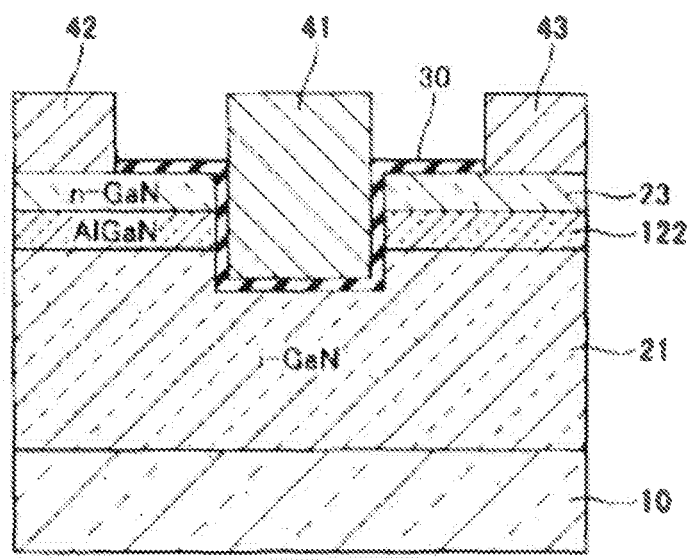
FIG. 6 is a structural diagram of a semiconductor device in a second embodiment.

Next, a semiconductor device in a second embodiment will be described with reference to FIG. 6. In the semiconductor device in this embodiment, as nitride semiconductor layers, an i-GaN layer 21, an AlGaN layer 122, and an n-GaN layer 23 are formed on a substrate 10 that is formed from a semiconductor material and the like. In this embodiment, the i-GaN layer 21, the AlGaN layer 122, and the n-GaN layer 23 may be described as a first semiconductor layer, a second semiconductor layer, and a third semiconductor layer, respectively.

A source electrode 42 and a drain electrode 43 are formed on the n-GaN layer 23, and in a region in which a gate electrode 41 is formed, the n-GaN layer 23 and the AlGaN layer 122 are removed. However, in the region in which the gate electrode 41 is formed, the i-GaN layer 21 may be partially removed.

An insulating layer 30 is formed on a front surface and a side surface of the n-GaN layer 23, a side surface of the AlGaN layer 122, and a front surface and the like of the i-GaN layer 21, and the gate electrode 41 is formed on the insulating layer 30 in a region in which the n-GaN layer 23 and the AlGaN layer 122 are removed. Accordingly, a side surface on a source electrode 42 side and a side surface on a drain electrode 43 side of the gate electrode 41 are formed to come into contact with the insulating layer 30 so as to become side surfaces of the AlGaN layer 122 and the n-GaN layer 23 in combination with each other through the insulating layer 30.

In this embodiment, it is preferable that the AlGaN layer 122 that is the second semiconductor layer have a film thickness of 50 nm to 1000 nm. In addition, the AlGaN layer 122 that is the second semiconductor layer is formed from a material having a band gap wider than that of the i-GaN layer 21 that is the first semiconductor layer and the n-GaN layer 23 that is the third semiconductor layer.

Method of Manufacturing Semiconductor Device

Next, a method of manufacturing the semiconductor device in this embodiment will be described.

Figure 7A:
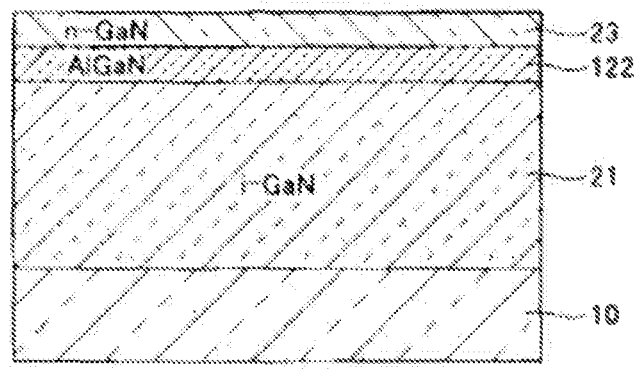
FIGS. 7A to 7C are process diagrams (Part 1) of a method of manufacturing the semiconductor device in the second embodiment.

First, as illustrated in FIG. 7A, the i-GaN layer 21 that is the first semiconductor layer, the AlGaN layer 122 that is the second semiconductor layer, and the n-GaN layer 23 that is the third semiconductor layer are formed on the substrate 10 by epitaxial growth. In this embodiment, the i-GaN layer 21, the AlGaN layer 122, and the n-GaN layer 23 are formed from a nitride semiconductor, and are formed by epitaxial growth by metal-organic vapor phase epitaxy (MOVPE).

The substrate 10 is constituted by a silicon semiconductor substrate and the like, and the i-GaN layer 21 has a thickness of 3 μm, and the AlGaN layer 122 has a thickness of 30 nm. The n-GaN layer 23 has a thickness of 500 nm and is doped with Si as an n-type impurity element at a concentration of $1 \times 10^{18}$ cm$^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 7B:
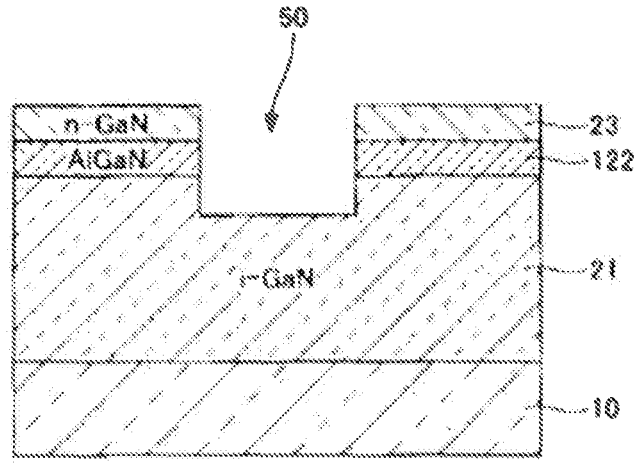

Next, as illustrated in FIG. 7B, parts of the n-GaN layer 23, the AlGaN layer 122, and the i-GaN layer 21 are removed to form an opening 50. Specifically, a photoresist is applied onto the n-GaN layer 23, and exposure by an exposure apparatus and development are performed to form a resist pattern (not shown) having an opening in a region in which the opening 50 is formed. Then, the n-GaN layer 23 and the AlGaN layer 122 are removed by dry etching such as RIE using a chlorine-based gas to expose the i-GaN layer 21, thereby forming the opening 50. In this embodiment, when forming the opening 50, a part of the i-GaN layer 21 may be removed.

Figure 7C:
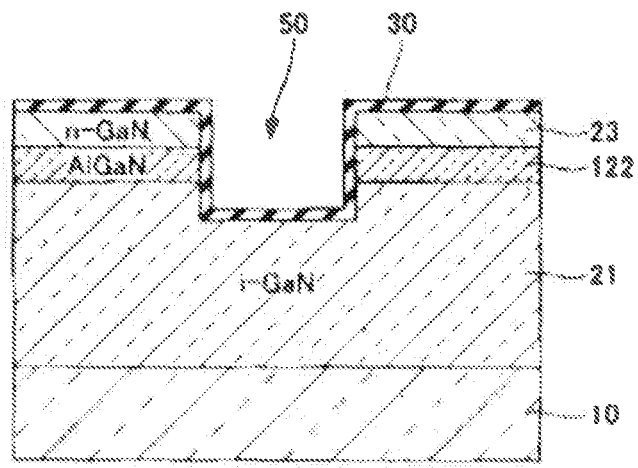

Next, as illustrated in FIG. 7C, the insulating layer 30 is formed on a bottom surface and a side surface of the opening 50, and on the n-GaN layer 23. The insulating layer 30 is formed from Al$_2$O$_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 50, on side surfaces of the AlGaN layer 122 and the n-GaN layer 23 which become a side surface of the opening 50, and on the n-GaN layer 23.

Figure 8A:
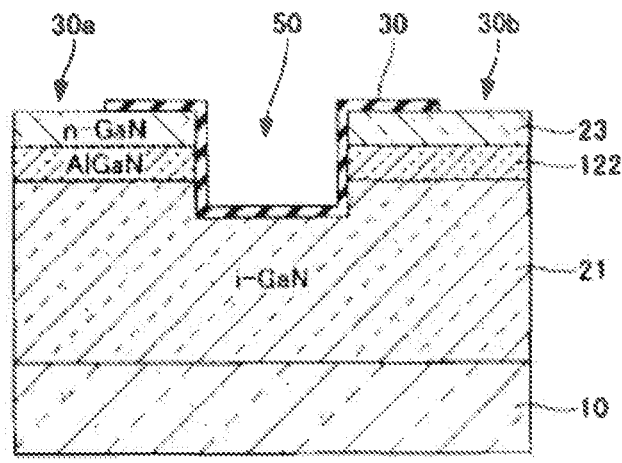
FIGS. 8A to 8C are process diagrams (Part 2) of the method of manufacturing the semiconductor device in the second embodiment.

Next, as illustrated in FIG. 8A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to be exposed to a front surface of the n-GaN layer 23, thereby forming the openings 30a and 30b. Then, the resist pattern (not shown) is removed by an organic solvent and the like.

Figure 8B:
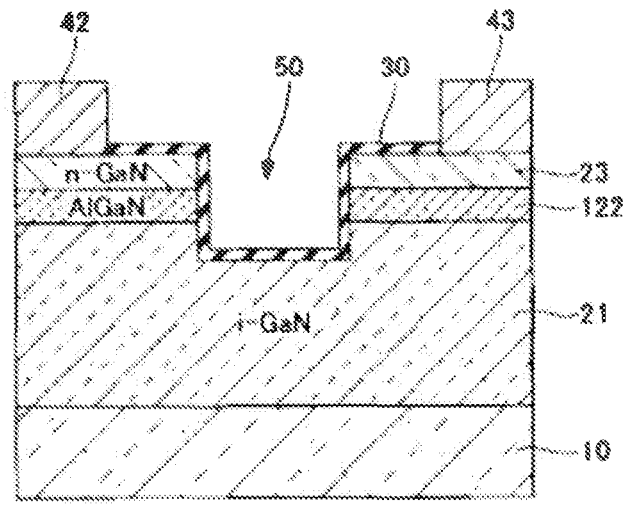

Next, as illustrated in FIG. 8B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 8C:
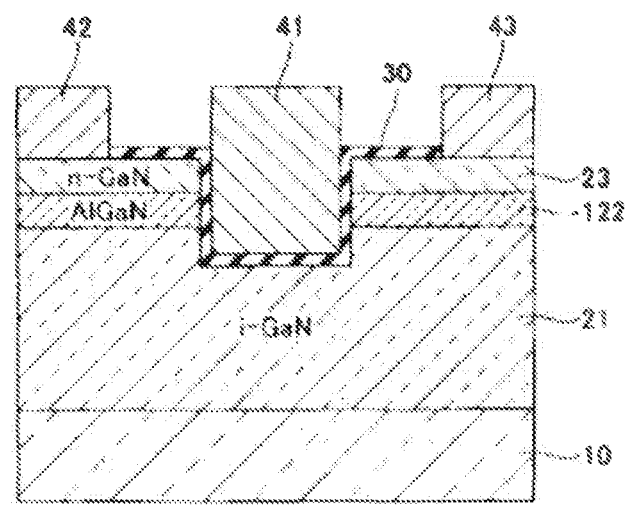

Next, as illustrated in FIG. 8C, the gate electrode 41 is formed on the insulating layer 30 in a region in which the opening 50 is formed. Specifically, a photoresist is applied onto the insulating layer 30, and exposure by an exposure apparatus and development are performed to form a resist pattern (not shown) having the opening 50 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 50.

According to this, the semiconductor device in this embodiment may be manufactured. It is noted that contents other than the above-described contents are the same as that of the first embodiment.

Third Embodiment

Semiconductor Device

Figure 9:
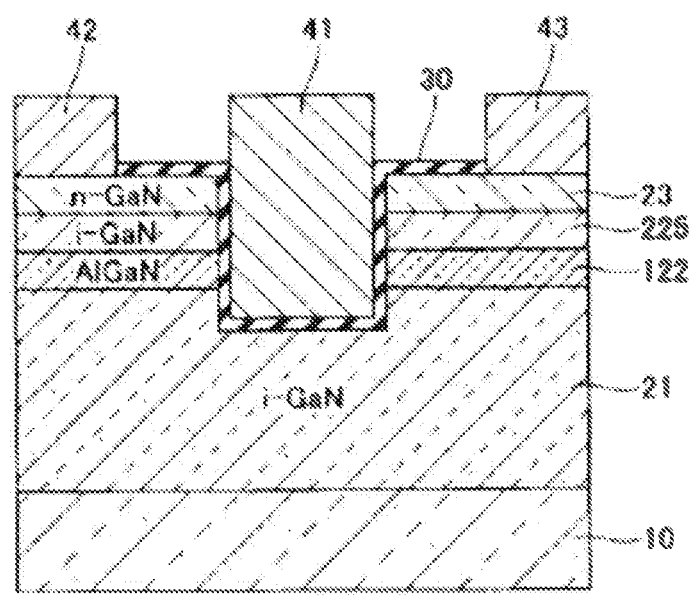
FIG. 9 is a structural diagram of a semiconductor device in a third embodiment.

Next, a semiconductor device in a third embodiment will be described with reference to FIG. 9. In the semiconductor device in this embodiment, as nitride semiconductor layers, an i-GaN layer 21, an AlGaN layer 122, an i-GaN layer 225, and an n-GaN layer 23 are formed on a substrate 10 that is formed from a semiconductor material and the like. In this embodiment, the i-GaN layer 21, the AlGaN layer 122, the i-GaN layer 225, and the n-GaN layer 23 may be described as a first semiconductor layer, a second semiconductor layer, a fifth semiconductor layer, and a third semiconductor layer, respectively.

A source electrode 42 and a drain electrode 43 are formed on the n-GaN layer 23, and in a region in which a gate electrode 41 is formed, the n-GaN layer 23, the i-GaN layer 225, and the AlGaN layer 122 are removed. However, in the region in which the gate electrode 41 is formed, the i-GaN layer 21 may be partially removed.

An insulating layer 30 is formed on a front surface and a side surface of the n-GaN layer 23, a side surface of the i-GaN layer 225, a side surface of the AlGaN layer 122, and a front surface and the like of the i-GaN layer 21. In addition, the gate electrode 41 is formed on the insulating layer 30 in a region from which the n-GaN layer 23, the i-GaN layer 225, and the AlGaN layer 122 are removed. Accordingly, a side surface on a source electrode 42 side and a side surface on a drain electrode 43 side of the gate electrode 41 are formed to come into contact with the insulating layer 30 so as to become side surfaces of the AlGaN layer 122, the i-GaN layer 225, and the n-GaN layer 23 in combination with each other through the insulating layer 30.

In this embodiment, the i-GaN layer 225 that is the fifth semiconductor layer is formed from a material having a band gap narrower than that of the AlGaN layer 122 that is the second semiconductor layer.

Method of Manufacturing Semiconductor Device

Next, a method of manufacturing the semiconductor device in this embodiment will be described.

Figure 10A:
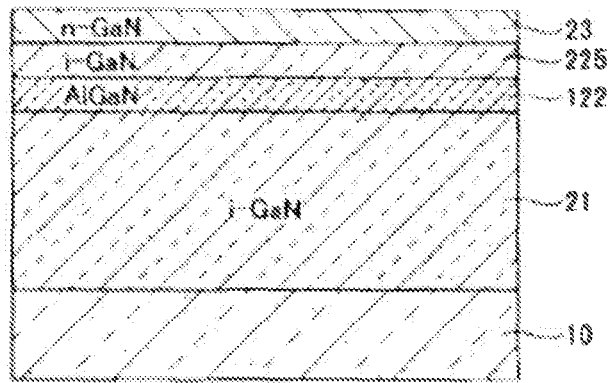
FIGS. 10A to 10C are process diagrams (Part 1) of a method of manufacturing the semiconductor device in the third embodiment.

First, as illustrated in FIG. 10A, the i-GaN layer 21 that is the first semiconductor layer, the AlGaN layer 122 that is the second semiconductor layer, the i-GaN layer 225 that is the fifth semiconductor layer, and the n-GaN layer 23 that is the third semiconductor layer are formed on the substrate 10 by epitaxial growth. In this embodiment, the i-GaN layer 21, the AlGaN layer 122, the i-GaN layer 225, and the n-GaN layer 23 are formed from a nitride semiconductor, and are formed by epitaxial growth by metal-organic vapor phase epitaxy (MOVPE).

The substrate 10 is constituted by a silicon semiconductor substrate and the like, and the i-GaN layer 21 has a thickness of 3 μm, the AlGaN layer 122 has a thickness of 30 nm, and the i-GaN layer 225 has a thickness of 50 nm. The n-GaN layer 23 has a thickness of 500 nm and is doped with Si as an n-type impurity element at a concentration of $1 \times 10^{18}$ $cm^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 10B:
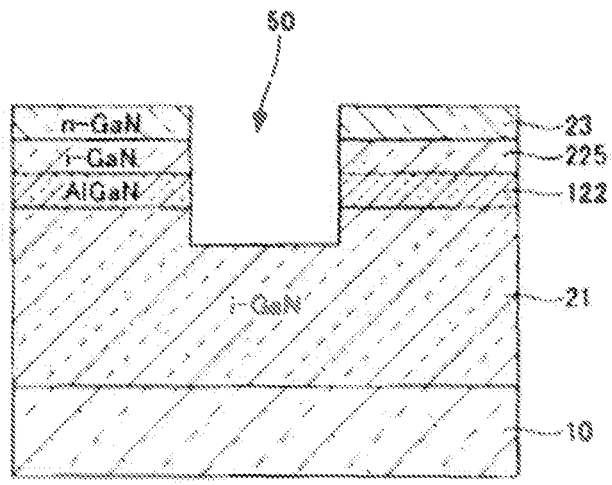

Next, as illustrated in FIG. 10B, parts of the n-GaN layer 23, the i-GaN layer 225, the AlGaN layer 122, and the i-GaN layer 21 are removed to form an opening 50. Specifically, a photoresist is applied onto the n-GaN layer 23, and exposure by an exposure apparatus and development are performed to form a resist pattern (not shown) having an opening in a region in which the opening 50 is formed. Then, the n-GaN layer 23, the i-GaN layer 225, and the AlGaN layer 122 are removed by dry etching such as RIE using a chlorine-based gas to expose the i-GaN layer 21, thereby forming the opening 50. In this embodiment, when forming the opening 50, a part of the i-GaN layer 21 may be removed.

Figure 10C:
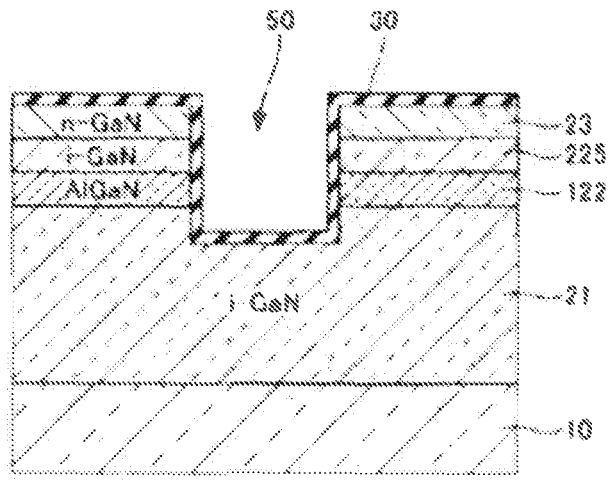

Next, as illustrated in FIG. 10C, the insulating layer 30 is formed on a bottom surface and a side surface of the opening 50, and on the n-GaN layer 23. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 50, on side surfaces of the AlGaN layer 122, the i-GaN layer 225, and the n-GaN layer 23 which become a side surface of the opening 50, and on the n-GaN layer 23.

Figure 11A:
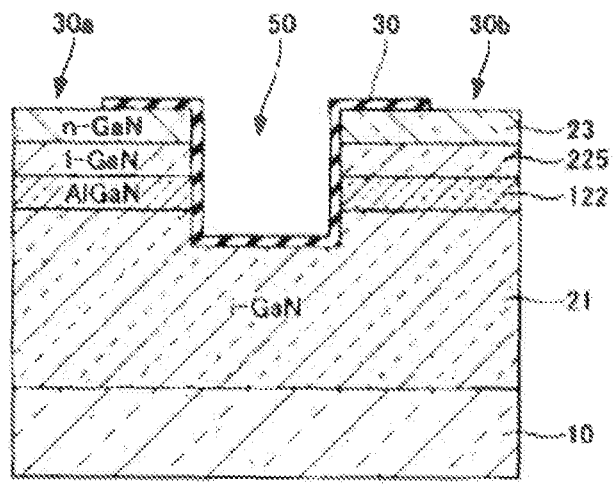
FIGS. 11A to 11C are process diagrams (Part 2) of the method of manufacturing the semiconductor device in the third embodiment.

Next, as illustrated in FIG. 11A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to be exposed to a front surface of the n-GaN layer 23, thereby forming the openings 30a and 30b. Then, the resist pattern (not shown) is removed by an organic solvent and the like.

Figure 11B:
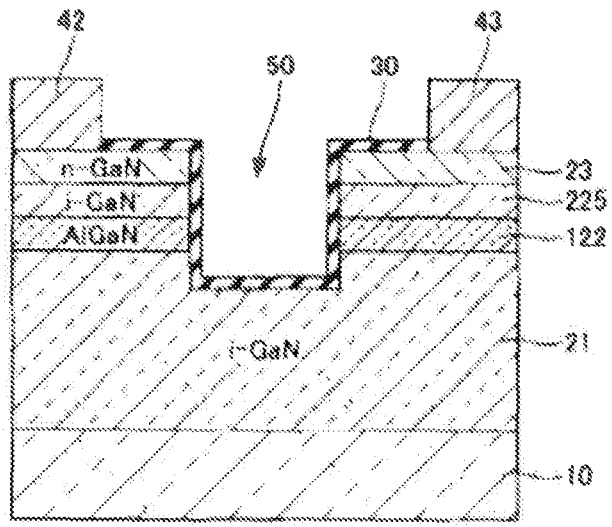

Next, as illustrated in FIG. 11B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 11C:
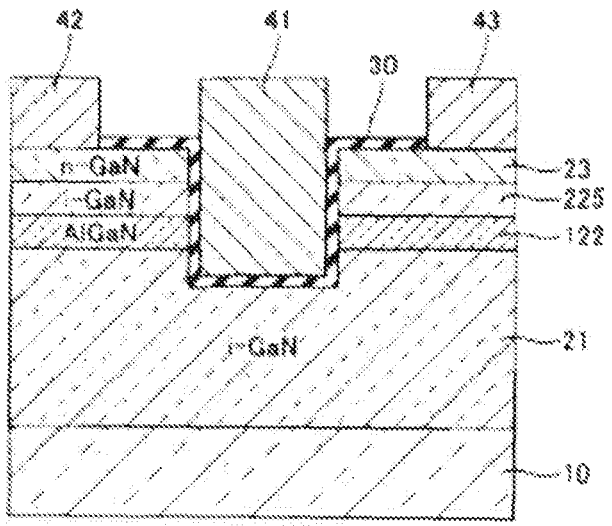

Next, as illustrated in FIG. 11C, the gate electrode 41 is formed on the insulating layer 30 in a region in which the opening 50 is formed. Specifically, a photoresist is applied onto the insulating layer 30, and exposure by an exposure apparatus and development are performed to form a resist pattern (not shown) having the opening 50 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 50.

According to this, the semiconductor device in this embodiment may be manufactured. It is noted that contents other than the above-described contents are the same as that of the second embodiment.

Fourth Embodiment

Semiconductor Device

Figure 12:
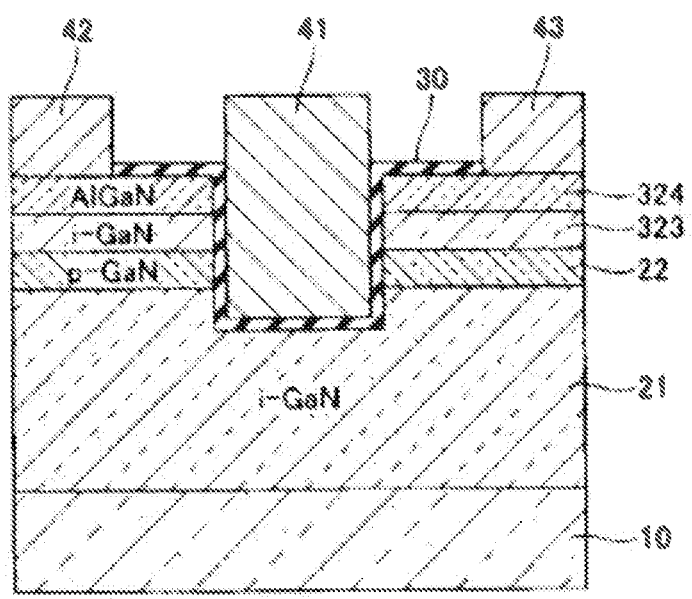
FIG. 12 is a structural diagram of a semiconductor device in a fourth embodiment.

Next, a semiconductor device in a fourth embodiment will be described with reference to FIG. 12. In the semiconductor device in this embodiment, as nitride semiconductor layers, an i-GaN layer 21, a p-GaN layer 22, an i-GaN layer 323, and an AlGaN layer 324 are formed on a substrate 10 that is formed from a semiconductor material and the like. In this embodiment, the i-GaN layer 21, the p-GaN layer 22, the i-GaN layer 323, and the AlGaN layer 324 may be described as a first semiconductor layer, a second semiconductor layer, a third semiconductor layer, and a fourth semiconductor layer, respectively.

A source electrode 42 and a drain electrode 43 are formed on the AlGaN layer 324, and in a region in which a gate electrode 41 is formed, the AlGaN layer 324, the i-GaN layer 323, and the p-GaN layer 22 are removed. However, in the region in which the gate electrode 41 is formed, the i-GaN layer 21 may be partially removed.

An insulating layer 30 is formed on a front surface and a side surface of the AlGaN layer 324, a side surface of the i-GaN layer 323, a side surface of the p-GaN layer 22, and a front surface and the like of the i-GaN layer 21. In addition, the gate electrode 41 is formed on the insulating layer 30 in a region from which the AlGaN layer 324, the i-GaN layer 323, and the p-GaN layer 22 are removed. Accordingly, a side surface on a source electrode 42 side and a side surface on a drain electrode 43 side of the gate electrode 41 are formed to come into contact with the insulating layer 30 so as to become side surfaces of the p-GaN layer 22, the i-GaN layer 323, and the AlGaN layer 324 in combination with each other through the insulating layer 30.

In this embodiment, the AlGaN layer 324 that is the fourth semiconductor layer is formed from a material having a band gap wider than that of the i-GaN layer 323 that is the third semiconductor layer. In addition, the AlGaN layer 324 that is the fourth semiconductor layer is formed from a material having a band gap wider than that of the p-GaN layer 22 that is the second semiconductor layer and the i-GaN layer 21 that is the first semiconductor layer.

As described above, in this embodiment, the third semiconductor layer is constituted by the i-GaN layer 323, and the fourth semiconductor layer is constituted by the AlGaN layer 324. Accordingly, in the third semiconductor layer, 2DEG (not shown) is generated in the vicinity of an interface between the third semiconductor layer and the fourth semiconductor layer, and thus it is possible to lower a resistance of this region, and thus it is possible to lower an on-resistance.

Method of Manufacturing Semiconductor Device

Next, a method of manufacturing the semiconductor device in this embodiment will be described.

Figure 13A:
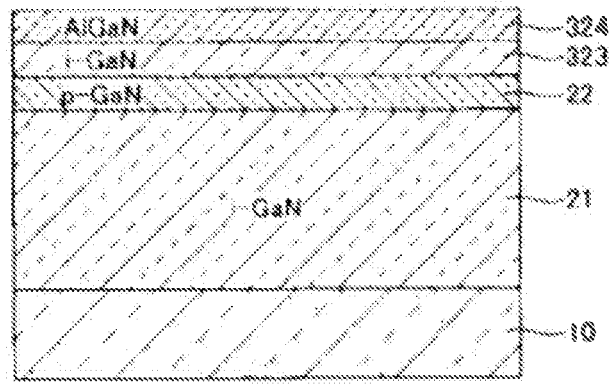
FIGS. 13A to 13C are process diagrams (Part 1) of a method of manufacturing the semiconductor device in the fourth embodiment.

First, as illustrated in FIG. 13A, the i-GaN layer 21 that is the first semiconductor layer, the p-GaN layer 22 that is the second semiconductor layer, the i-GaN layer 323 that is the third semiconductor layer, and the AlGaN layer 324 that is the fourth semiconductor layer are formed on the substrate 10 by epitaxial growth. In this embodiment, the i-GaN layer 21, the p-GaN layer 22, the i-GaN layer 323, and the AlGaN layer 324 are formed from a nitride semiconductor, and are formed by epitaxial growth by metal-organic vapor phase epitaxy (MOVPE).

The substrate 10 is constituted by a silicon semiconductor substrate and the like, and the i-GaN layer 21 has a thickness of 3 km. The p-GaN layer 22 has a thickness of 500 nm and is doped with Mg as a p-type impurity element at a concentration of $1 \times 10^{19}$ cm$^{-3}$. The i-GaN layer 323 has a thickness of 300 nm, and the AlGaN layer 324 has a thickness of 30 nm.

Then, although not shown, an element isolation region may be formed. Specifically, a photoresist is applied onto the AlGaN layer 324, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 13B:
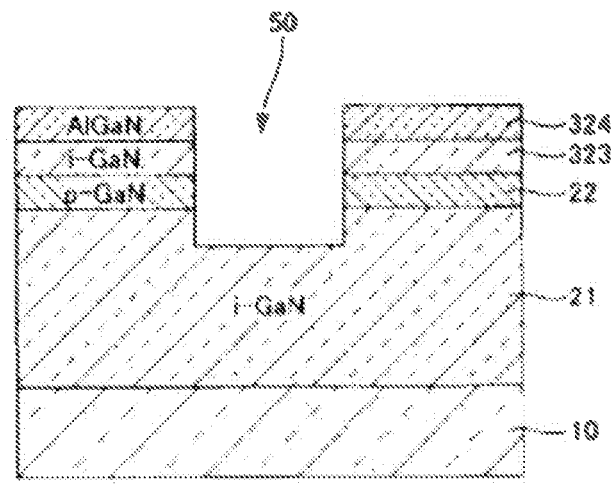

Next, as illustrated in FIG. 13B, parts of the AlGaN layer 324, the i-GaN layer 323, the p-GaN layer 22, and the i-GaN layer 21 are removed to form an opening 50. Specifically, a photoresist is applied onto the AlGaN layer 324, and exposure by an exposure apparatus and development are performed to form a resist pattern (not shown) having an opening in a region in which the opening 50 is formed. Then, the AlGaN layer 324, the i-GaN layer 323, and the p-GaN layer 22 are removed by dry etching such as RIE using a chlorine-based gas to expose the i-GaN layer 21, thereby forming the opening 50. In this embodiment, when forming the opening 50, a part of the i-GaN layer 21 may be removed.

Figure 13C:
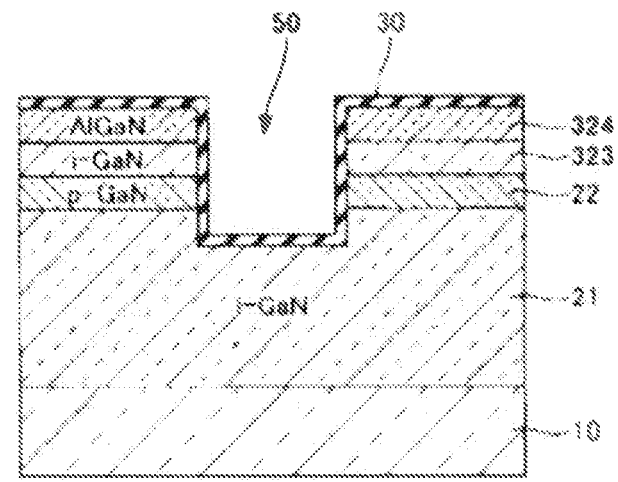

Next, as illustrated in FIG. 13C, the insulating layer 30 is formed on a bottom surface and a side surface of the opening 50, and on the AlGaN layer 324. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 50, on side surfaces of the p-GaN layer 22, the i-GaN layer 323, and the AlGaN layer 324 which become a side surface of the opening 50, and on the AlGaN layer 324.

Figure 14A:
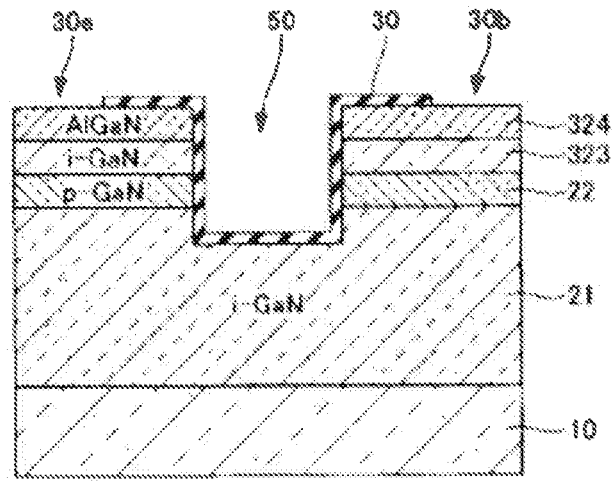
FIGS. 14A to 14C are process diagrams (Part 2) of the method of manufacturing the semiconductor device in the fourth embodiment.

Next, as illustrated in FIG. 14A, the insulating layer 30 in regions in which the source electrode 42 and the drain electrode 43 are formed is removed to expose the AlGaN layer 324, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the AlGaN layer 324, thereby forming the openings 30a and 30b. Then, the resist pattern (not shown) is removed by an organic solvent and the like.

Figure 14B:
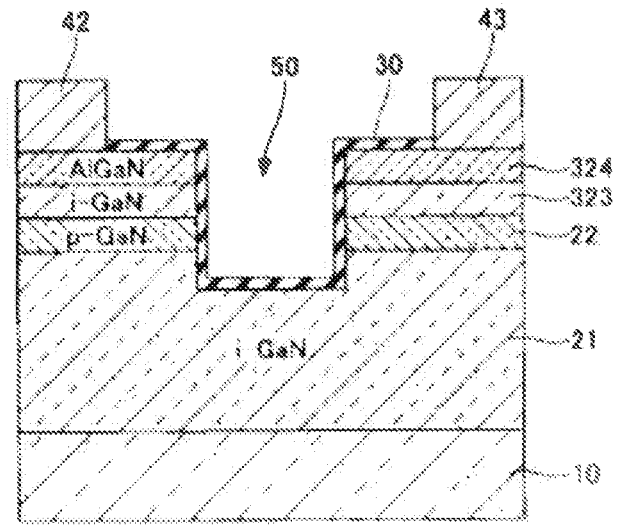

Next, as illustrated in FIG. 14B, the source electrode 42 and the drain electrode 43 are formed in the openings 30a and 30b of the insulating layer 30 through which the AlGaN layer 324 is exposed. Specifically, a photoresist is applied onto the AlGaN layer 324 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 14C:
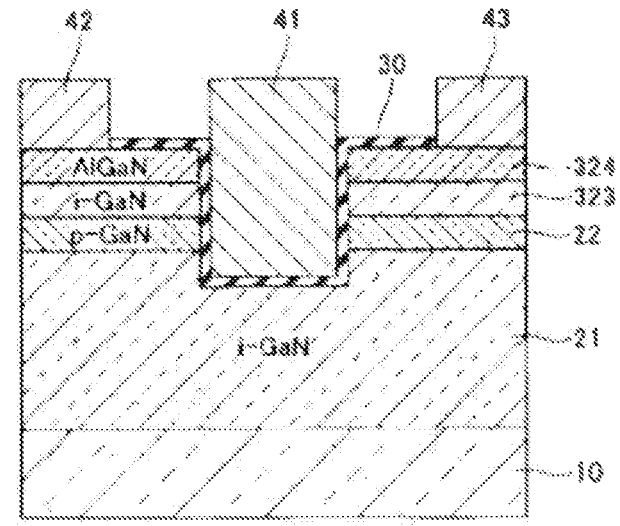

Next, as illustrated in FIG. 14C, the gate electrode 41 is formed on the insulating layer 30 in a region in which the opening 50 is formed. Specifically, a photoresist is applied onto the insulating layer 30, and exposure by an exposure apparatus and development are performed to form a resist pattern (not shown) having the opening 50 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 50.

According to this, the semiconductor device in this embodiment may be manufactured.

It is noted that contents other than the above-described contents are the same as that of the first embodiment.

Fifth Embodiment

Semiconductor Device

Figure 15:
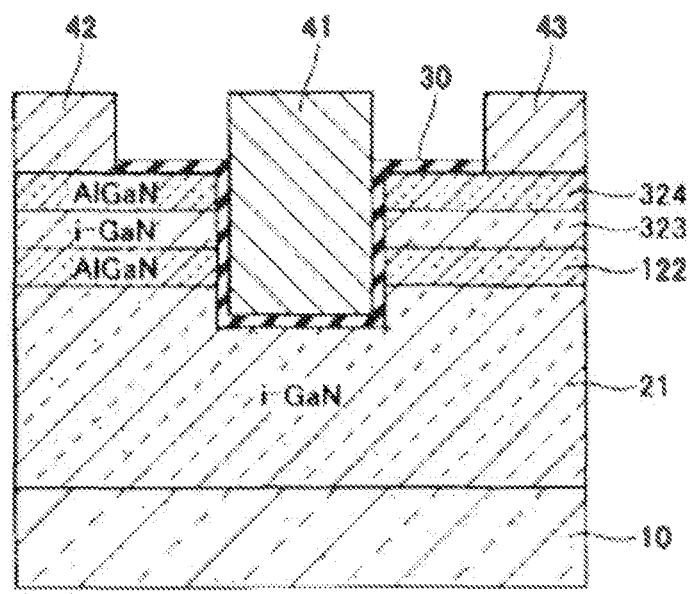
FIG. 15 is a structural diagram of a semiconductor device in a fifth embodiment.

Next, a semiconductor device in a fifth embodiment will be described with reference to FIG. 15. In the semiconductor device in this embodiment, as nitride semiconductor layers, an i-GaN layer 21, an AlGaN layer 122, an i-GaN layer 323, and an AlGaN layer 324 are formed on a substrate 10 that is formed from a semiconductor material and the like. In this embodiment, the i-GaN layer 21, the AlGaN layer 122, the i-GaN layer 323, and the AlGaN layer 324 may be described as a first semiconductor layer, a second semiconductor layer, a third semiconductor layer, and a fourth semiconductor layer, respectively.

A source electrode 42 and a drain electrode 43 are formed on the AlGaN layer 324, and in a region in which a gate electrode 41 is formed, the AlGaN layer 324, the i-GaN layer 323, and the AlGaN layer 122 are removed. However, in the region in which the gate electrode 41 is formed, the i-GaN layer 21 may be partially removed.

An insulating layer 30 is formed on a front surface and a side surface of the AlGaN layer 324, a side surface of the i-GaN layer 323, a side surface of the AlGaN layer 122, and a front surface and the like of the i-GaN layer 21. In addition, the gate electrode 41 is formed on the insulating layer 30 in a region from which the AlGaN layer 324, the i-GaN layer 323, and the AlGaN layer 122 are removed. Accordingly, a side surface on a source electrode 42 side and a side surface on a drain electrode 43 side of the gate electrode 41 are formed to come into contact with the insulating layer 30 so as to become side surfaces of the AlGaN layer 122, the i-GaN layer 323, and the AlGaN layer 324 in combination with each other through the insulating layer 30.

In this embodiment, the AlGaN layer 324 that is the fourth semiconductor layer is formed from a material having a band gap wider than that of the i-GaN layer 323 that is the third semiconductor layer. In addition, the AlGaN layer 324 that is the fourth semiconductor layer is formed from a material having a band gap wider than that of the i-GaN layer 21 that is the first semiconductor layer. In addition, the AlGaN layer 122 that is the second semiconductor layer is formed from a material having a band gap wider than that of the i-GaN layer 323 that is the third semiconductor layer and the i-GaN layer 21 that is the first semiconductor layer.

As described above, in this embodiment, the third semiconductor layer is constituted by the i-GaN layer 323, and the fourth semiconductor layer is constituted by the AlGaN layer 324. Accordingly, in the third semiconductor layer, 2DEG (not shown) is generated in the vicinity of an interface between the third semiconductor layer and the fourth semiconductor layer, and thus it is possible to lower a resistance of this region, and thus it is possible to lower an on-resistance.

Method of Manufacturing Semiconductor Device

Next, a method of manufacturing the semiconductor device in this embodiment will be described.

Figure 16A:
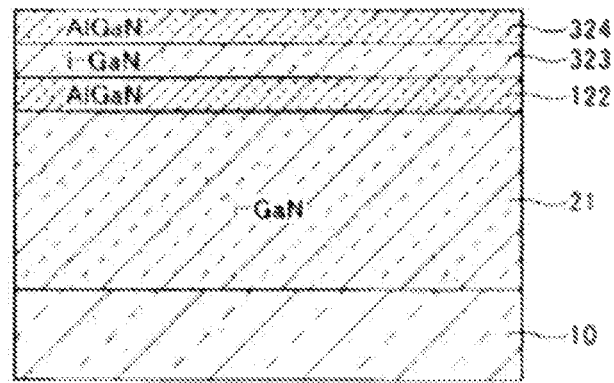
FIGS. 16A to 16C are process diagrams (Part 1) of a method of manufacturing the semiconductor device in the fifth embodiment.

First, as illustrated in FIG. 16A, the i-GaN layer 21 that is the first semiconductor layer, the AlGaN layer 122 that is the second semiconductor layer, the i-GaN layer 323 that is the third semiconductor layer, and the AlGaN layer 324 that is the fourth semiconductor layer are formed on the substrate 10 by epitaxial growth. In this embodiment, the i-GaN layer 21, the AlGaN layer 122, the i-GaN layer 323, and the AlGaN layer 324 are formed from a nitride semiconductor, and are formed by epitaxial growth by metal-organic vapor phase epitaxy (MOVPE).

The substrate 10 is constituted by a silicon semiconductor substrate and the like, the i-GaN layer 21 has a thickness of 3 μm, the AlGaN layer 122 has a thickness of 30 nm, the i-GaN layer 323 has a thickness of 300 nm, and the AlGaN layer 324 has a thickness of 30 nm.

Then, although not shown, an element isolation region may be formed. Specifically, a photoresist is applied onto the AlGaN layer 324, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 16B:
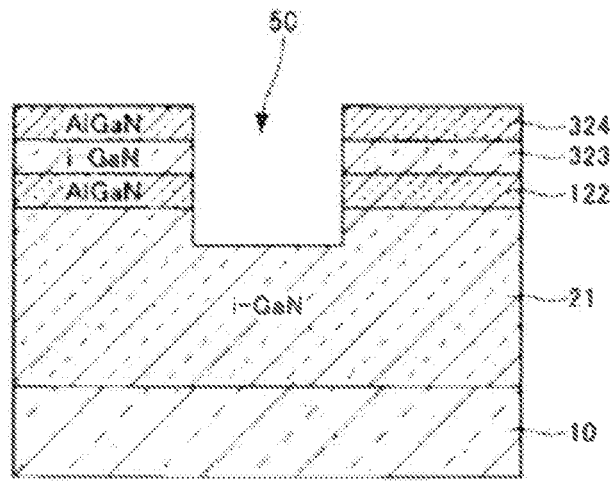

Next, as illustrated in FIG. 16B, parts of the AlGaN layer 324, the i-GaN layer 323, the AlGaN layer 122, and the i-GaN layer 21 are removed to form an opening 50. Specifically, a photoresist is applied onto the AlGaN layer 324, and exposure by an exposure apparatus and development are performed to form a resist pattern (not shown) having an opening in a region in which the opening 50 is formed. Then, the AlGaN layer 324, the i-GaN layer 323, and the AlGaN layer 122 are removed by dry etching such as RIE using a chlorine-based gas to expose the i-GaN layer 21, thereby forming the opening 50. In this embodiment, when forming the opening 50, a part of the i-GaN layer 21 may be removed.

Figure 16C:
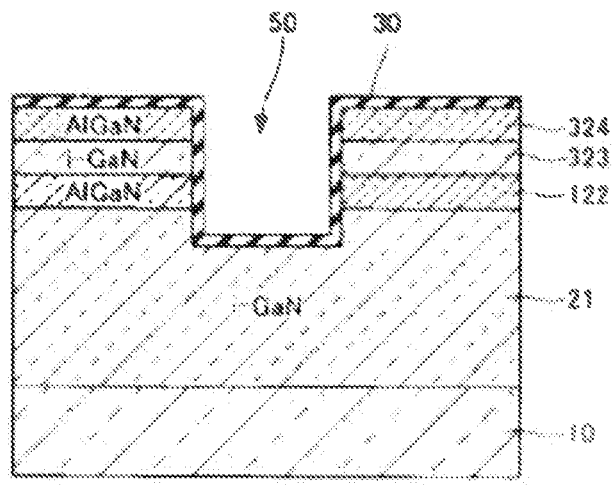

Next, as illustrated in FIG. 16C, the insulating layer 30 is formed on a bottom surface and a side surface of the opening 50, and on the AlGaN layer 324. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 50, on side surfaces of the AlGaN layer 122, the i-GaN layer 323, and the AlGaN layer 324 which become a side surface of the opening 50, and on the AlGaN layer 324.

Figure 17A:
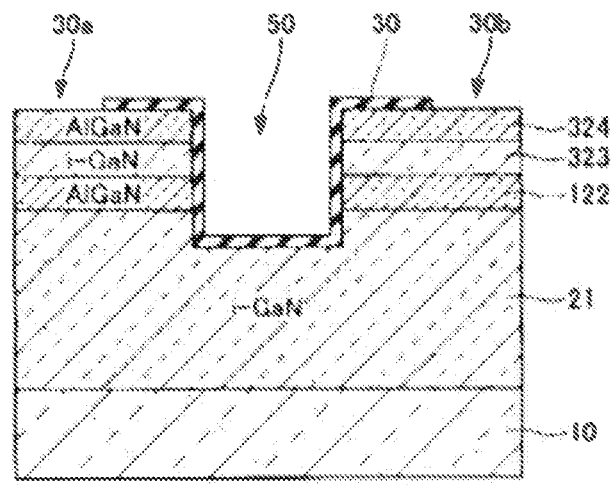
FIGS. 17A to 17C are process diagrams (Part 2) of the method of manufacturing the semiconductor device in the fifth embodiment.

Next, as illustrated in FIG. 17A, the insulating layer 30 in regions in which the source electrode 42 and the drain electrode 43 are formed is removed to expose the AlGaN layer 324, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the AlGaN layer 324, thereby forming the openings 30a and 30b. Then, the resist pattern (not shown) is removed by an organic solvent and the like.

Figure 17B:
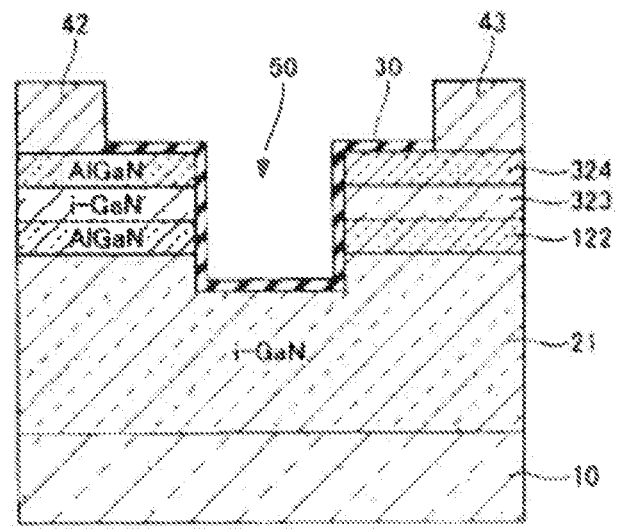

Next, as illustrated in FIG. 17B, the source electrode 42 and the drain electrode 43 are formed in the openings 30a and 30b of the insulating layer 30 through which the AlGaN layer 324 is exposed. Specifically, a photoresist is applied onto the AlGaN layer 324 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 17C:
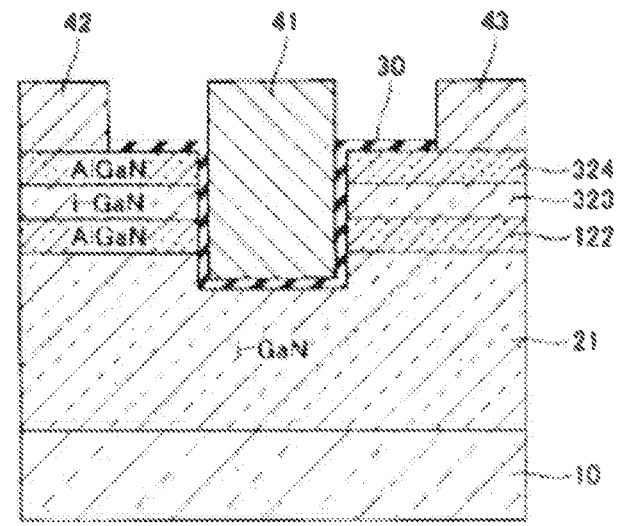

Next, as illustrated in FIG. 17C, the gate electrode 41 is formed on the insulating layer 30 in a region in which the opening 50 is formed. Specifically, a photoresist is applied onto the insulating layer 30, and exposure by an exposure apparatus and development are performed to form a resist pattern (not shown) having the opening 50 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 50.

According to this, the semiconductor device in this embodiment may be manufactured.

It is noted that contents other than the above-described contents are the same as that of the second embodiment.

Sixth Embodiment

Semiconductor Device

Figure 18:
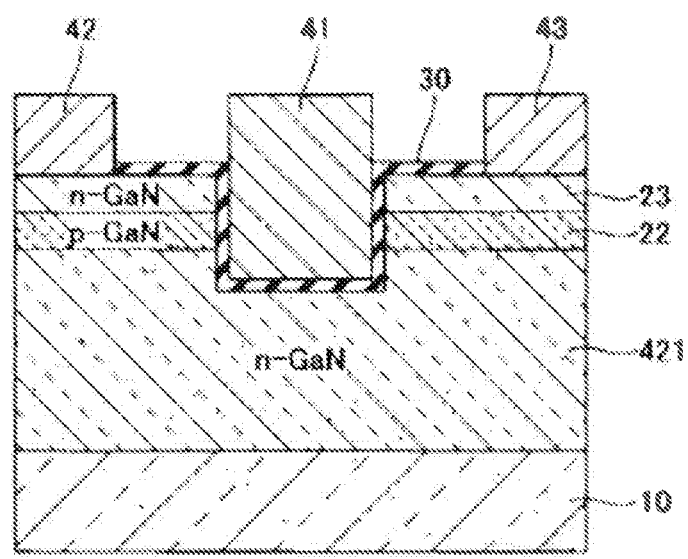
FIG. 18 is a structural diagram of a semiconductor device in a sixth embodiment.

Next, a semiconductor device in the sixth embodiment will be described with reference FIG. 18. In the semiconductor device in this embodiment, as nitride semiconductor layers, an n-GaN layer 421, a p-GaN layer 22, and an n-GaN layer 23 are formed on a substrate 10 that is formed from a semiconductor material and the like. In this embodiment, the n-GaN layer 421, the p-GaN layer 22, and the n-GaN layer 23 may be described as a first semiconductor layer, a second semiconductor layer, and a third semiconductor layer, respectively.

A source electrode 42 and a drain electrode 43 are formed on the n-GaN layer 23, and in a region in which a gate electrode 41 is formed, the n-GaN layer 23 and the p-GaN layer 22 are removed. However, in the region in which the gate electrode 41 is formed, the n-GaN layer 421 may be partially removed.

An insulating layer 30 is formed on a front surface and a side surface of the n-GaN layer 23, a side surface of the p-GaN layer 22, and a front surface and the like of the n-GaN layer 421, and the gate electrode 41 is formed on the insulating layer 30 in a region from which the n-GaN layer 23 and the p-GaN layer 22 are removed. Accordingly, a side surface on a source electrode 42 side and a side surface on a drain electrode 43 side of the gate electrode 41 are formed to come into contact with the insulating layer 30 so as to become side surfaces of the p-GaN layer 22 and the n-GaN layer 23 in combination with each other through the insulating layer 30.

In this embodiment, it is preferable that the n-GaN layer 421 that is the first semiconductor layer be doped with Si and the like as an n-type impurity element at a concentration of $1 \times 10^{18}$ cm$^{-3}$ or more.

Method of Manufacturing Semiconductor Device

Next, a method of manufacturing the semiconductor device in this embodiment will be described.

Figure 19A:
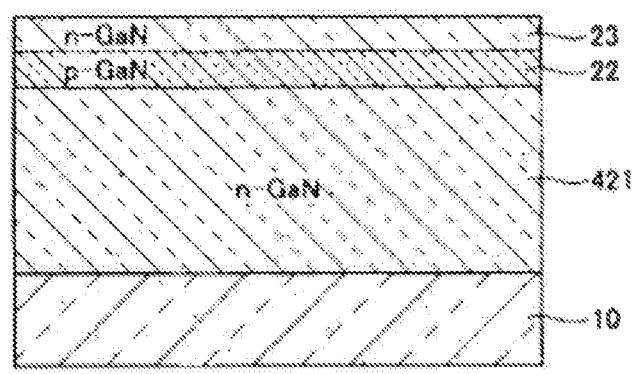
FIGS. 19A to 19C are process diagrams (Part 1) of a method of manufacturing the semiconductor device in the sixth embodiment.

First, as illustrated in FIG. 19A, the n-GaN layer 421 that is the first semiconductor layer, the p-GaN layer 22 that is the second semiconductor layer, and the n-GaN layer 23 that is the third semiconductor layer are formed on the substrate 10 by epitaxial growth. In this embodiment, the n-GaN layer 421, the p-GaN layer 22, and the n-GaN layer 23 are formed from a nitride semiconductor, and are formed by epitaxial growth by metal-organic vapor phase epitaxy (MOVPE).

The substrate 10 is constituted by a silicon semiconductor substrate and the like. The n-GaN layer 421 has a thickness of 3 μm and is doped with Si as an n-type impurity element at a concentration of $1 \times 10^{17}$ cm$^{-3}$. The p-GaN layer 22 has a thickness of 500 nm and is doped with Mg as a p-type impurity element at a concentration of $1 \times 10^{19}$ cm$^{-3}$. The n-GaN layer 23 has a thickness of 500 nm and is doped with Si as an n-type impurity element at a concentration of $1 \times 10^{18}$ cm$^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 19B:
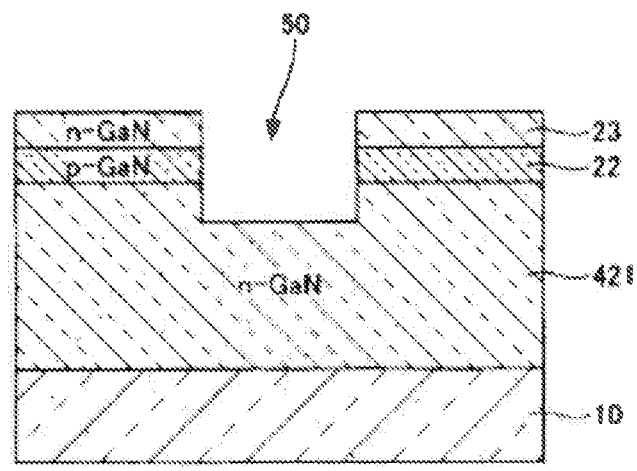

Next, as illustrated in FIG. 19B, parts of the n-GaN layer 23, the p-GaN layer 22, and the n-GaN layer 421 are removed to form an opening 50. Specifically, a photoresist is applied onto the n-GaN layer 23, and exposure by an exposure apparatus and development are performed to form a resist pattern (not shown) having an opening in a region in which the opening 50 is formed. Then, the n-GaN layer 23 and the p-GaN layer 22 are removed by dry etching such as RIE using a chlorine-based gas to expose the n-GaN layer 421, thereby forming the opening 50. In this embodiment, when forming the opening 50, a part of the n-GaN layer 421 may be removed.

Figure 19C:
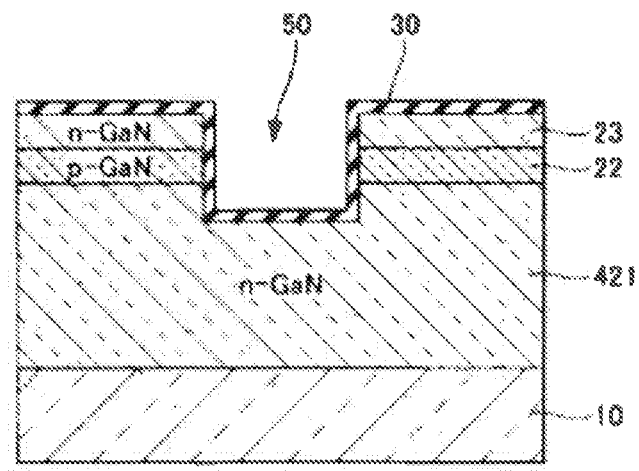

Next, as illustrated in FIG. 19C, the insulating layer 30 is formed on a bottom surface and a side surface of the opening 50, and on the n-GaN layer 23. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the n-GaN layer 421 that becomes a bottom surface of the opening 50, on side surfaces of the p-GaN layer 22 and the n-GaN layer 23 which become a side surface of the opening 50, and on the n-GaN layer 23.

Figure 20A:
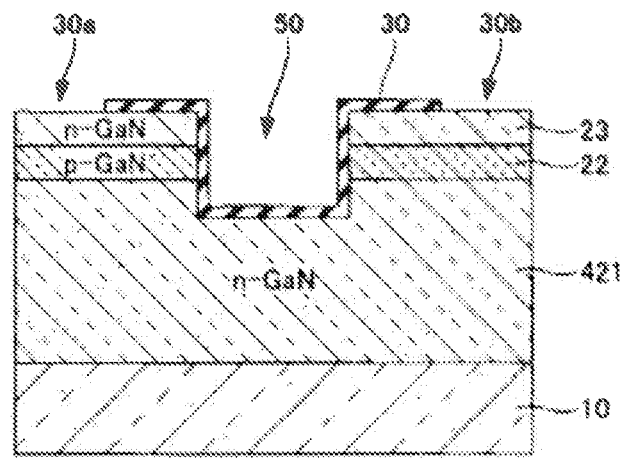
FIGS. 20A to 20C are process diagrams (Part 2) of the method of manufacturing the semiconductor device in the sixth embodiment.

Next, as illustrated in FIG. 20A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or chlorine-based gas or wet etching to expose to a front surface of the n-GaN layer 23, thereby forming the openings 30a and 30b. Then, the resist pattern (not shown) is removed by an organic solvent and the like.

Figure 20B:
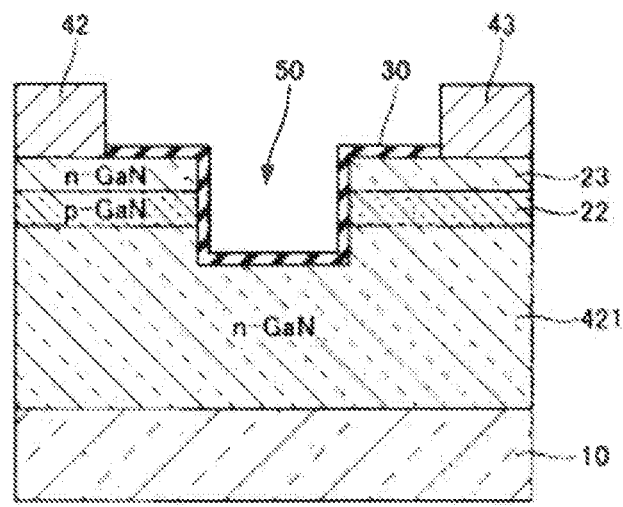

Next, as illustrated in FIG. 20B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 20C:
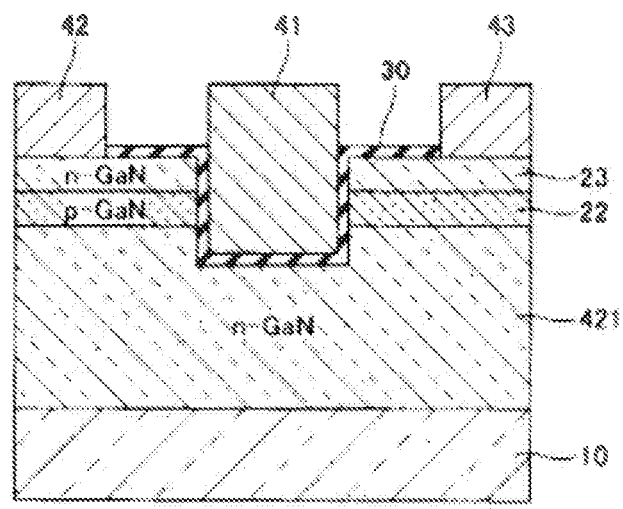

Next, as illustrated in FIG. 20C, the gate electrode 41 is formed on the insulating layer 30 in a region in which the opening 50 is formed. Specifically, a photoresist is applied onto the insulating layer 30, and exposure by an exposure apparatus and development are performed to form a resist pattern (not shown) having the opening 50 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 50.

According to this, the semiconductor device in this embodiment may be manufactured.

It is noted that contents other than the above-described contents are the same as that of the first embodiment.

Seventh Embodiment

Figure 2:
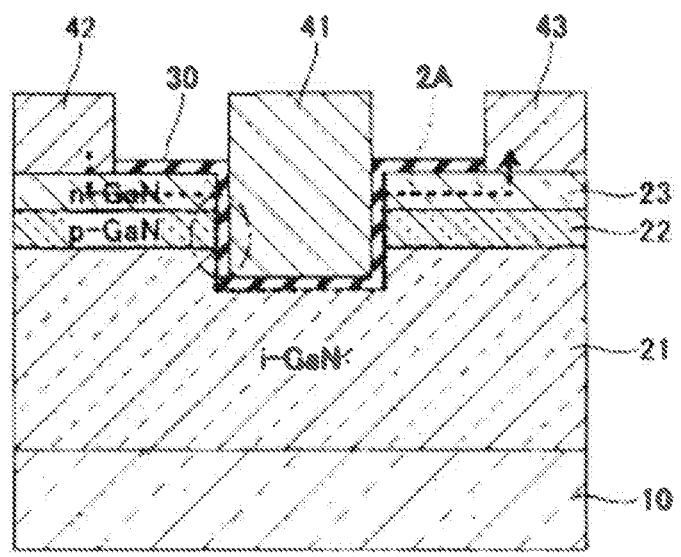
FIG. 2 is a structural diagram of a semiconductor device in a first embodiment.
Figure 2:
Figure 3:
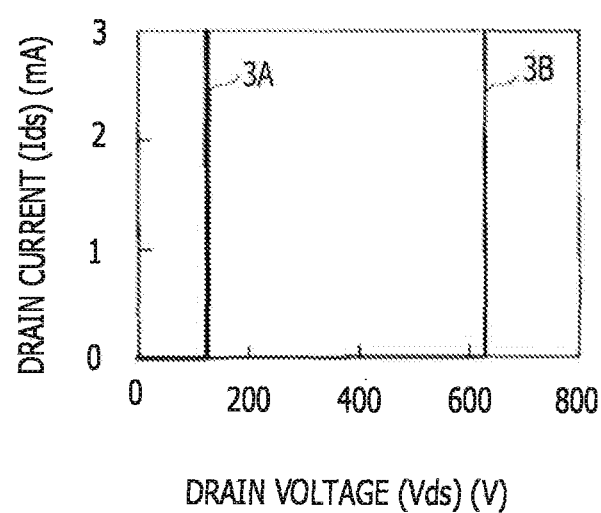
FIG. 3 is an explanatory diagram of Ids-Vds characteristics in the first semiconductor device.

In the semiconductor device in the first embodiment illustrated in FIG. 2, the gate electrode 41 is formed to come into contact with the insulating layer 30 that is formed on the side surface of the p-GaN layer 22 and the side surface of the n-GaN layer 23 on both of the source electrode 42 side and the drain electrode 43 side. Accordingly, on-off control that is performed by applying a voltage to the gate electrode 41 is performed on both of the source electrode 42 side and the drain electrode 43 side. However, on the drain electrode 43 side, the p-GaN layer 22 and the n-GaN layer 23 are affected by a drain voltage that is applied to the drain electrode 43. Therefore, it is less likely to be turned on in accordance with conditions such as a bias that is applied, and thus there is a tendency that an on-resistance is high and an on-current is low. Accordingly, it is preferable that the on-off control be performed in the p-GaN layer 22 and the n-GaN layer 23 on the source electrode 42 side. This is also true of the semiconductor devices in the second embodiment to the sixth embodiment.

Semiconductor Device

Figure 21:
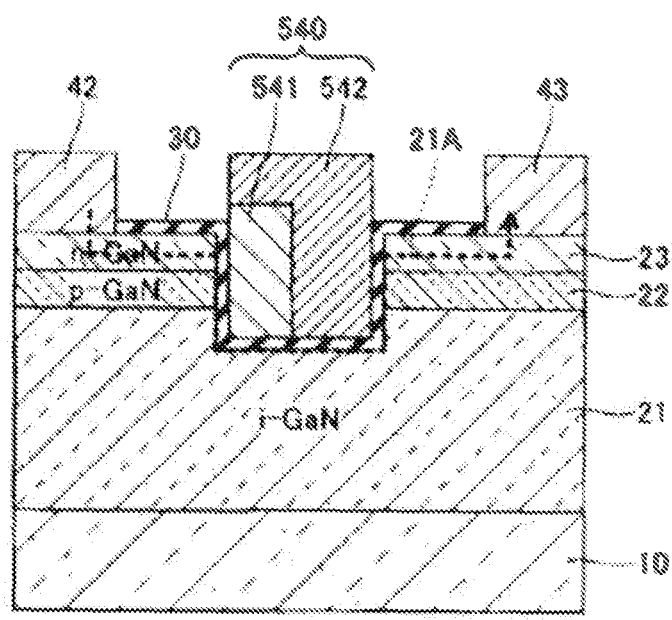
FIG. 21 is a structural diagram of a semiconductor device in a seventh embodiment.

Next, a semiconductor device in a seventh embodiment will be described based on FIG. 21. In the semiconductor device in this embodiment, as nitride semiconductor layers, an i-GaN layer 21, a p-GaN layer 22, and an n-GaN layer 23 are formed on a substrate 10 that is formed from a semiconductor material and the like. In this embodiment, the i-GaN layer 21, the p-GaN layer 22, and the n-GaN layer 23 may be described as a first semiconductor layer, a second semiconductor layer, and a third semiconductor layer, respectively.

A source electrode 42 and a drain electrode 43 are formed on the n-GaN layer 23, and in a region in which a gate electrode 540 is formed, the n-GaN layer 23 and the p-GaN layer 22 are removed. However, in the region in which the gate electrode 540 is formed, the i-GaN layer 21 may be partially removed.

An insulating layer 30 is formed on a front surface and a side surface of the n-GaN layer 23, a side surface of the p-GaN layer 22, and a front surface and the like of the i-GaN layer 21, and the gate electrode 540 is formed on the insulating layer 30 in a region from which the n-GaN layer 23 and the p-GaN layer 22 are removed. In this embodiment, the gate electrode 540 is constituted by a first gate electrode portion 541 on a source electrode 42 side and a second gate electrode portion 542 on a drain electrode 43 side, and the first gate electrode portion 541 and the second gate electrode portion 542 are formed from materials different from each other. Accordingly, a side surface on a source electrode 42 side of the gate electrode 540 is formed to come into contact with the insulating layer 30 so as to become side surfaces of the p-GaN layer 22 and the n-GaN layer 23 on a source electrode 42 side through the insulating layer 30. In addition, a side surface on a drain electrode 43 side of the gate electrode 540 is formed to come into contact with the insulating layer 30 so as to become side surfaces of the p-GaN layer 22 and the n-GaN layer 23 on a drain electrode 43 side through the insulating layer 30.

However, in the semiconductor device in this embodiment, the i-GaN layer 21, which is the first semiconductor layer, does not contain impurities or contains few impurities. Accordingly, a resistance is high, and it is possible to improve the withstand voltage. In addition, when a voltage is applied to the gate electrode 540, a reverse channel is formed in the p-GaN layer 22 through the insulating layer 30, and a channel is formed in an i-GaN layer that is the i-GaN layer 21 through the insulating layer 30. Accordingly, a current flows through a current path indicated by a broken arrow 21A in FIG. 21.

In this embodiment, it is preferable that a material used to form the first gate electrode portion 541 have a work function higher than that of a material used to form the second gate electrode portion 542. In addition, it is preferable that the first gate electrode portion 541 be formed from a material having a work function of 4.5 eV or more, and more preferably 5.0 eV or more. In addition, it is preferable that the second gate electrode portion 542 be formed from a material having a work function of less than 4.5 eV.

Accordingly, with reference to FIG. 22 it is preferable that the first gate electrode portion 541 be formed from a material containing any of Pt, Ni, Au, Pd, and Cu which have a work function of 4.5 eV or more. In addition, it is more preferable that the first gate electrode portion 541 be formed from a material containing any of Pt, Ni, and Au which have a work function of 5.0 eV or more. In addition, it is preferable that the second gate electrode portion 542 be formed from a material containing any of Mo, Al, Ta, and Ti which have a work function of less than 4.5 eV.

Figure 23:
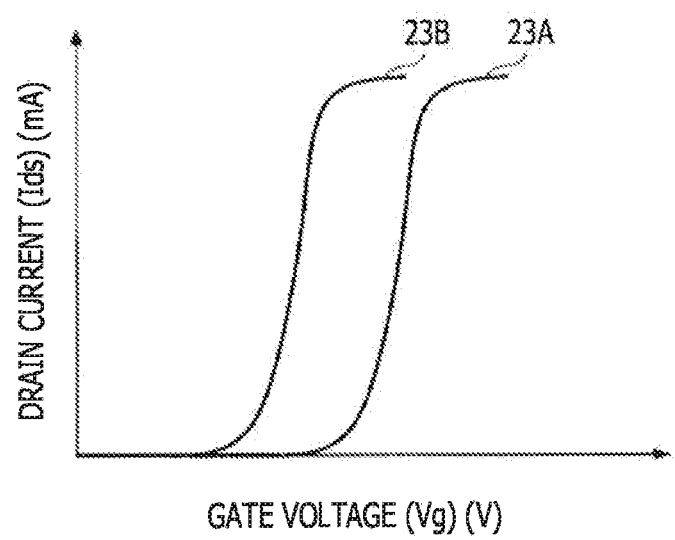
FIG. 23 is an explanatory diagram illustrating an Ids-Vg relation of the semiconductor device in the seventh embodiment.

In this embodiment, the first gate electrode portion 541 is formed from a material having a higher work function in comparison to the second gate electrode portion 542, and thus it is possible to make a gate threshold voltage higher on the first gate electrode portion 541 side in comparison to the second gate electrode portion 542 side. FIG. 23 illustrates a relation between a gate voltage Vg and a drain current Ids on the first gate electrode portion 541 side and the second gate electrode portion 542 side. In FIG. 23, 23A represents characteristics on the first gate electrode portion 541 side which is formed from a material having a high work function, and 23B represents characteristics on the second gate electrode portion 542 side which is formed from a material having a low work function. In FIG. 23, the gate threshold voltage on the first gate electrode portion 541 side which is indicated by 23A is set to be higher than a gate threshold voltage on the second gate electrode portion 542 side indicated by 23B. Accordingly, when the first gate electrode portion 541 side is turned on from an off-state, the second gate electrode portion 542 side already enters an on-state, and thus it is possible to lower an on-resistance in the second gate electrode portion 542 side and it is possible to allow much on-current to flow.

Figure 24:
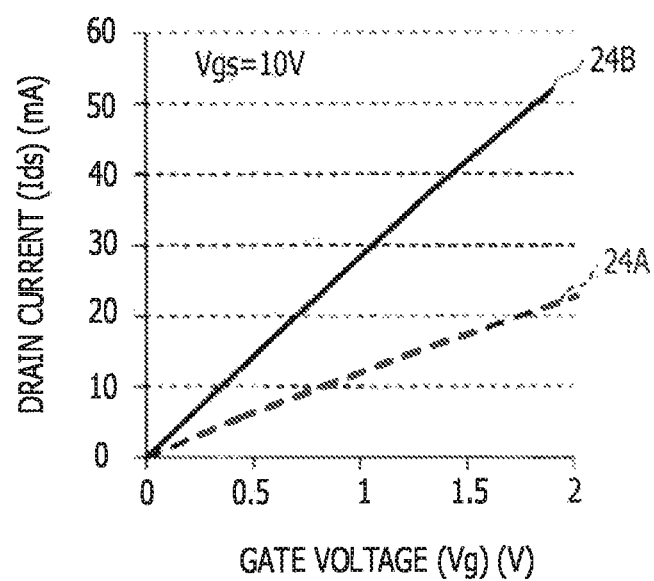
FIG. 24 is an explanatory diagram illustrating an Ids-Vds characteristic of the semiconductor device in the seventh embodiment.

Next, the on-current that flows through the semiconductor device in this embodiment will be described. FIG. 24 illustrates a relation between a drain voltage and a drain current in a case where a gate voltage Vgs of 10 V is applied between a gate and a source in the semiconductor device illustrated in FIG. 2 and the semiconductor device in this embodiment illustrated in FIG. 21. In FIG. 24, 24A represents characteristics of the semiconductor device illustrated in FIGS. 2, and 24B represents characteristics of the semiconductor device in this embodiment illustrated in FIG. 21. As illustrated in FIG. 24, in the same drain voltage, 24B may allow a drain current 2.5 or more times that of 24A to flow. That is, in the same drain voltage, a drain current flowing through the semiconductor device in this embodiment as indicated by 24B becomes 2.5 or more times a drain current flowing through the semiconductor device illustrated in FIG. 2 as indicated by 24A. Accordingly, in the semiconductor device in this embodiment, the on-current may be increased, and thus the on-resistance may be decreased.

Method of Manufacturing Semiconductor Device

Next, a method of manufacturing a semiconductor device in this embodiment will be described.

Figure 25A:
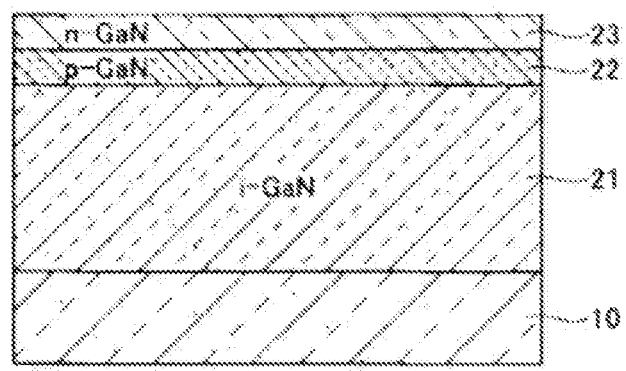
FIGS. 25A to 25C are process diagrams (Part 1) of a method of manufacturing the semiconductor device in the seventh embodiment.

First, as illustrated in FIG. 25A, the i-GaN layer 21 that is the first semiconductor layer, the p-GaN layer 22 that is the second semiconductor layer, the n-GaN layer 23 that is the third semiconductor layer are formed on the substrate 10 by epitaxial growth. In this embodiment, the i-GaN layer 21, the p-GaN layer 22, and the n-GaN layer 23 are formed from a nitride semiconductor, and are formed by epitaxial growth by metal-organic vapor phase epitaxy (MOVPE).

The substrate 10 is constituted by a silicon semiconductor substrate and the like, and the i-GaN layer 21 has a thickness of 3 μm. The p-GaN layer 22 has a thickness of 500 nm, and is doped with Mg as a p-type impurity element at a concentration of $1\times10^{19}$ $cm^{-3}$. The n-GaN layer 23 has a thickness of 500 nm and is doped with Si as an n-type impurity element at a concentration of $1\times10^{18}$ $cm^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 25B:
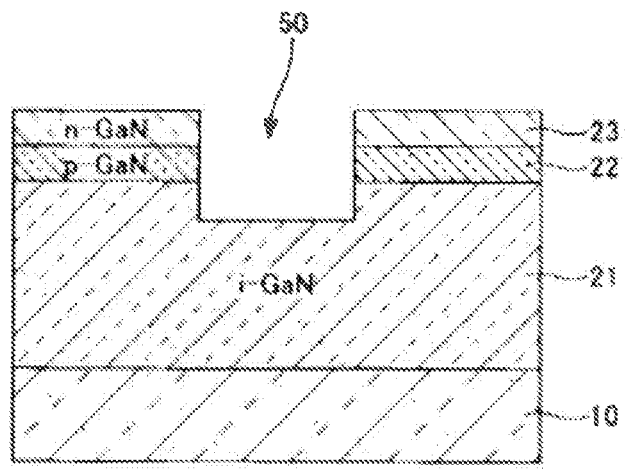

Next, as illustrated in FIG. 25B, parts of the n-GaN layer 23, the p-GaN layer 22, and the i-GaN layer 21 are removed to form an opening 50.

Specifically, a photoresist is applied onto the n-GaN layer 23, and exposure by an exposure apparatus and development are performed to form a resist pattern (not shown) having an opening in a region in which the opening 50 is formed. Then, the n-GaN layer 23 and the p-GaN layer 22 are removed by dry etching such as RIE using a chlorine-based gas to expose the i-GaN layer 21, thereby forming the opening 50. In this embodiment, when forming the opening 50, a part of the i-GaN layer 21 may be removed.

Figure 25C:
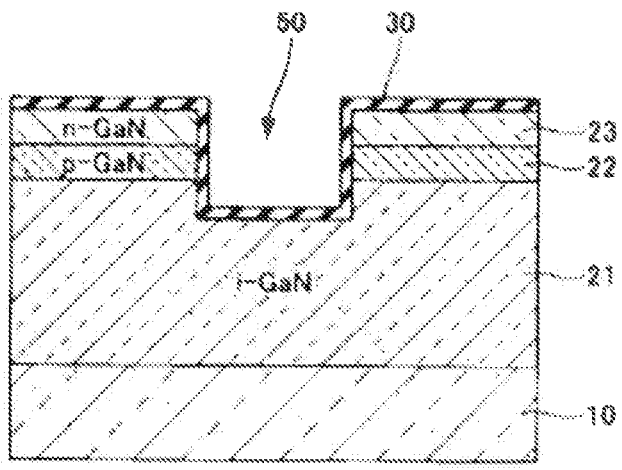

Next, as illustrated in FIG. 25C, the insulating layer 30 is formed on a bottom surface and a side surface of the opening 50, and on the n-GaN layer 23. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like, but in this embodiment, the insulating layer 30 is formed by the ALD. According to this, the insulating layer 30 is formed on the i-GaN layer 21 that becomes a bottom surface of the opening 50, on side surfaces of the p-GaN layer 22 and the n-GaN layer 23 which become a side surface of the opening 50, and on the n-GaN layer 23.

Figure 26A:
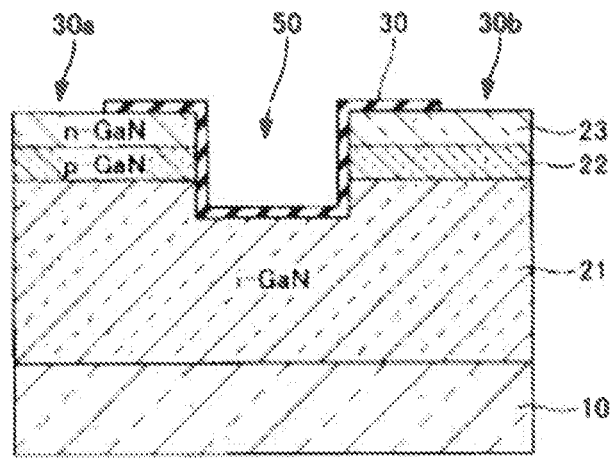
FIGS. 26A to 26C are process diagrams (Part 2) of the method of manufacturing the semiconductor device in the seventh embodiment.

Next, as illustrated in FIG. 26A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the n-GaN layer 23, thereby forming the openings 30a and 30b. Then, the resist pattern (not shown) is removed by an organic solvent and the like.

Figure 26B:
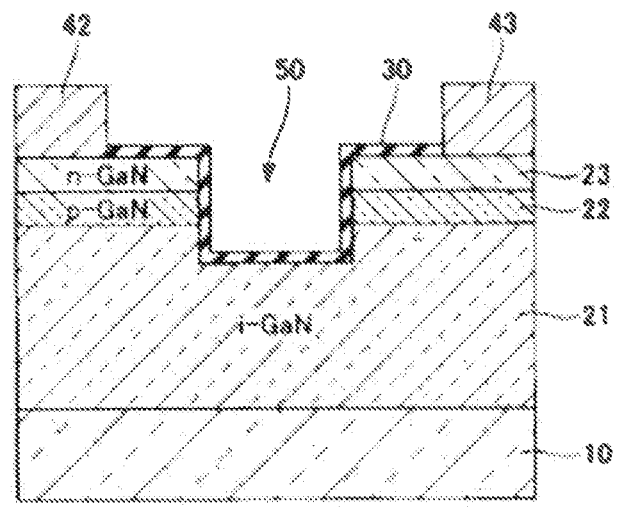

Next, as illustrated in FIG. 26B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 26C:
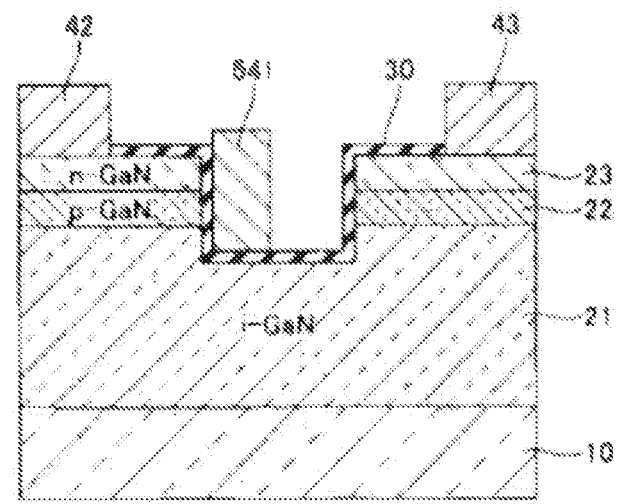

Next, as illustrated in FIG. 26C, the first gate electrode portion 541 is formed on a source electrode 42 side on the insulating layer 30 in a region in which the opening 50 is formed. Specifically, a photoresist is applied onto the insulating layer 30, and exposure by an exposure apparatus and development are performed to form a resist pattern (not shown) having an opening in the region in which the first gate electrode portion 541 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the first gate electrode portion 541 by the metal laminated film that remains.

Figure 27:
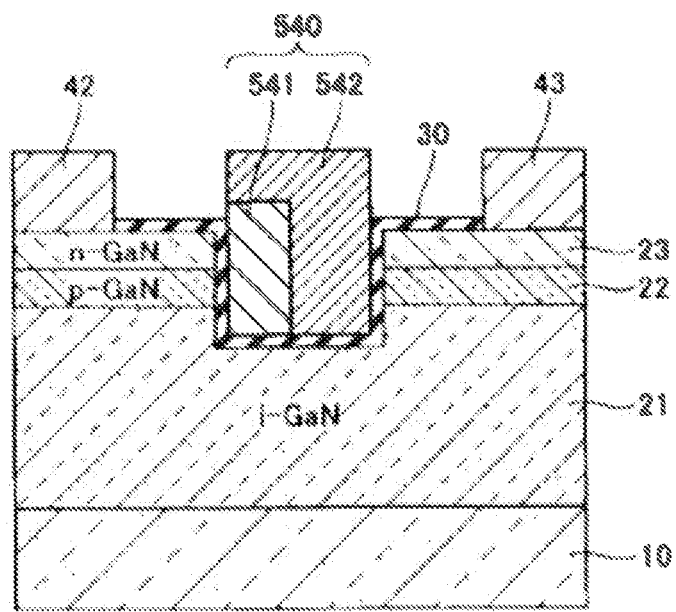
FIG. 27 is a process diagram (Part 3) of the method of manufacturing the semiconductor device in the seventh embodiment.

Next, as illustrated in FIG. 27, the second gate electrode portion 542 is formed on a drain electrode 43 side on the insulating layer 30 in the region in which the opening 50 is formed. Specifically, a photoresist is applied onto the first gate electrode portion 541 and the insulating layer 30, and exposure by an exposure apparatus and development are performed to form a resist pattern (not shown) having an opening in the region in which the second gate electrode portion 542 is formed. Then, Ti having a film thickness of 20 nm and Al having a film thickness of 200 nm are laminated by vacuum deposition and the like to form a metal laminated film (Ti/Al). Then, the metal laminated film formed on the resist pattern is removed together with the resist pattern by immersion in an organic solvent and the like to form the second gate electrode portion 542 by the metal laminated film that remains.

According to this, the gate electrode 540 in the opening 50 is constituted by the first gate electrode portion 541 that is formed on a source electrode 42 side, and the second gate electrode portion 542 that is formed on a drain electrode 43 side. According to the above-described processes, the semiconductor device in this embodiment may be manufactured.

It is noted that contents other than the above-described contents are the same as that of the first embodiment.

Eighth Embodiment

Semiconductor Device

Figure 28:
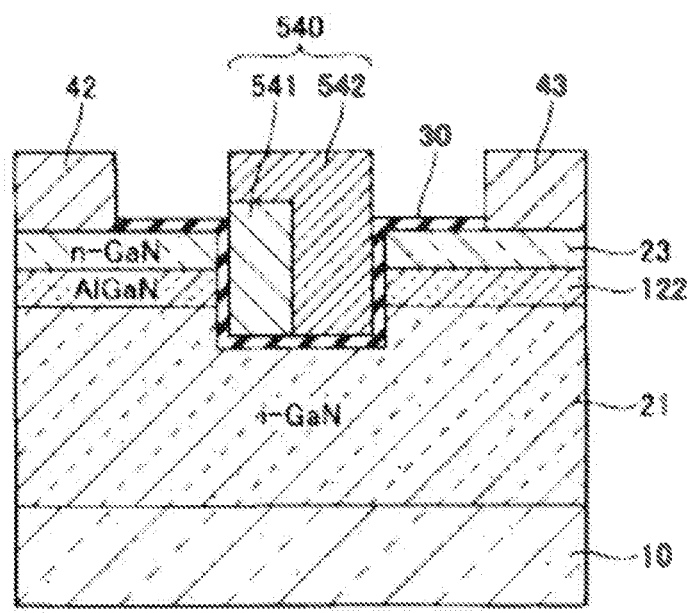
FIG. 28 is a structural diagram of a semiconductor device in an eighth embodiment.

Next, a semiconductor device in an eighth embodiment will be described with reference to FIG. 28. In the semiconductor device in this embodiment, as nitride semiconductor layers, an i-GaN layer 21, an AlGaN layer 122, and an n-GaN layer 23 are formed on a substrate 10 that is formed from a semiconductor material and the like. In this embodiment, the i-GaN layer 21, the AlGaN layer 122, and the n-GaN layer 23 may be described as a first semiconductor layer, a second semiconductor layer, and a third semiconductor layer, respectively.

A source electrode 42 and a drain electrode 43 are formed on the n-GaN layer 23, and in a region in which a gate electrode 540 is formed, the n-GaN layer 23 and the AlGaN layer 122 are removed. However, in the region in which the gate electrode 540 is formed, the i-GaN layer 21 may be partially removed.

An insulating layer 30 is formed on a front surface and a side surface of the n-GaN layer 23, a side surface of the AlGaN layer 122, and a front surface and the like of the i-GaN layer 21, and the gate electrode 540 is formed on the insulating layer 30 in a region from which the n-GaN layer 23 and the AlGaN layer 122 are removed. In this embodiment, the gate electrode 540 is constituted by a first gate electrode portion 541 on a source electrode 42 side and a second gate electrode portion 542 on a drain electrode 43 side, and the first gate electrode portion 541 and the second gate electrode portion 542 are formed from materials different from each other. Accordingly, a side surface on a source electrode 42 side of the gate electrode 540 is formed to come into contact with the insulating layer 30 so as to become side surfaces of the AlGaN layer 122 and the n-GaN layer 23 on a source electrode 42 side through the insulating layer 30. In addition, a side surface on a drain electrode 43 side of the gate electrode 540 is formed to come into contact with the insulating layer 30 so as to become side surfaces of the AlGaN layer 122 and the n-GaN layer 23 on a drain electrode 43 side through the insulating surface 30.

In this embodiment, it is preferable that the AlGaN layer 122 that is the second semiconductor layer have a film thickness of 50 nm to 1000 nm. In addition, the AlGaN layer 122 that is the second semiconductor layer is formed from a material having a band gap wider than that of the i-GaN layer 21 that is the first semiconductor layer and the n-GaN layer 23 that is the third semiconductor layer.

In this embodiment, it is preferable that a material used to form the first gate electrode portion 541 have a work function higher than that of a material used to form the second gate electrode portion 542. In addition, it is preferable that the first gate electrode portion 541 be formed from a material having a work function of 4.5 eV or more, and more preferably 5.0 eV or more. In addition, it is preferable that the second gate electrode portion 542 be formed from a material having a work function of less than 4.5 eV.

Method of Manufacturing Semiconductor Device

Next, a method of manufacturing a semiconductor device in this embodiment will be described.

Figure 29A:
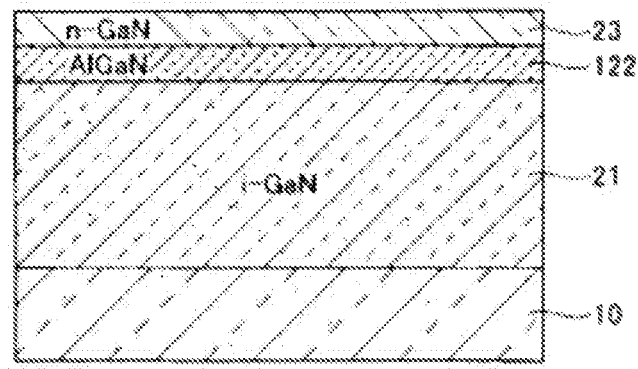
FIGS. 29A to 29C are process diagrams (Part 1) of a method of manufacturing the semiconductor device in the eighth embodiment.

First, as illustrated in FIG. 29A, the i-GaN layer 21 that is the first semiconductor layer, the AlGaN layer 122 that is the second semiconductor layer, the n-GaN layer 23 that is the third semiconductor layer are formed on the substrate 10 by epitaxial growth. In this embodiment, the i-GaN layer 21, the AlGaN layer 122, and the n-GaN layer 23 are formed from a nitride semiconductor, and are formed by epitaxial growth by metal-organic vapor phase epitaxy (MOVPE).

The substrate 10 is constituted by a silicon semiconductor substrate and the like, and the i-GaN layer 21 has a thickness of 3 μm, and the AlGaN layer 122 has a thickness of 30 nm. The n-GaN layer 23 has a thickness of 500 nm and is doped with Si as an n-type impurity element at a concentration of $1 \times 10^{18}$ cm$^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 29B:
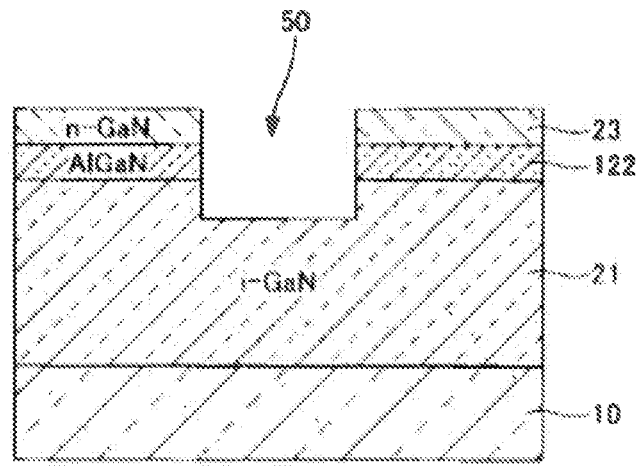

Next, as illustrated in FIG. 29B, parts of the n-GaN layer 23, the AlGaN layer 122, and the i-GaN layer 21 are removed to form an opening 50. Specifically, a photoresist is applied onto the n-GaN layer 23, and exposure by an exposure apparatus and development are performed to form a resist pattern (not shown) having an opening in a region in which the opening 50 is formed. Then, the n-GaN layer 23 and the AlGaN layer 122 are removed by dry etching such as RIE using a chlorine-based gas to expose the i-GaN layer 21, thereby forming the opening 50. In this embodiment, when forming the opening 50, a part of the i-GaN layer 21 may be removed.

Figure 29C:
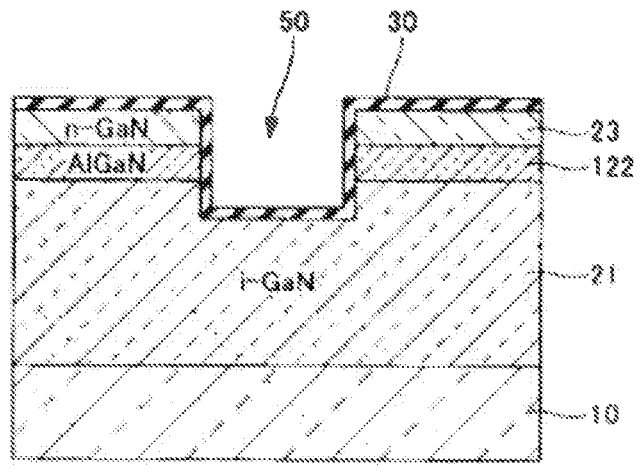

Next, as illustrated in FIG. 29C, the insulating layer 30 is formed on a bottom surface and a side surface of the opening 50, and on the n-GaN layer 23. The insulating layer 30 is formed from Al$_2$O$_3$ having a film thickness of 2 nm to 200 nm, for example, 20 nm. Examples of a method of forming the insulating layer 30 include ALD, sputtering, plasma CVD, and the like, and in this embodiment, the insulating layer 30 is formed by the ALD. According to this, the insulating layer 30 is formed on the i-GaN layer 21 that becomes a bottom surface of the opening 50, on side surfaces of the AlGaN layer 122 and the n-GaN layer 23 which become a side surface of the opening 50, and on the n-GaN layer 23.

Figure 30A:
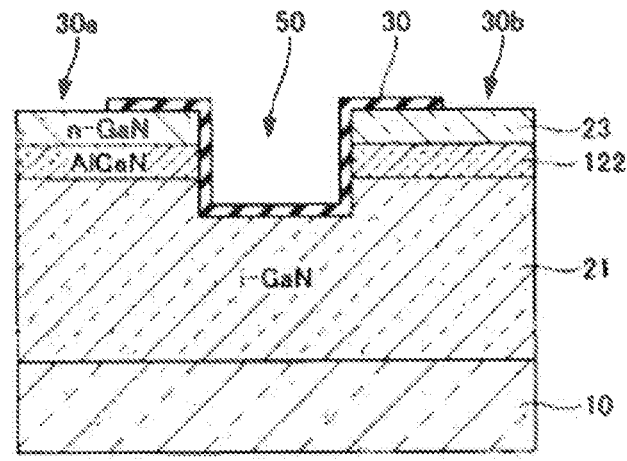
FIGS. 30A to 30C are process diagrams (Part 2) of the method of manufacturing the semiconductor device in the eighth embodiment.

Next, as illustrated in FIG. 30A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the n-GaN layer 23, thereby forming the openings 30a and 30b. Then, the resist pattern (not shown) is removed by an organic solvent and the like.

Figure 30B:
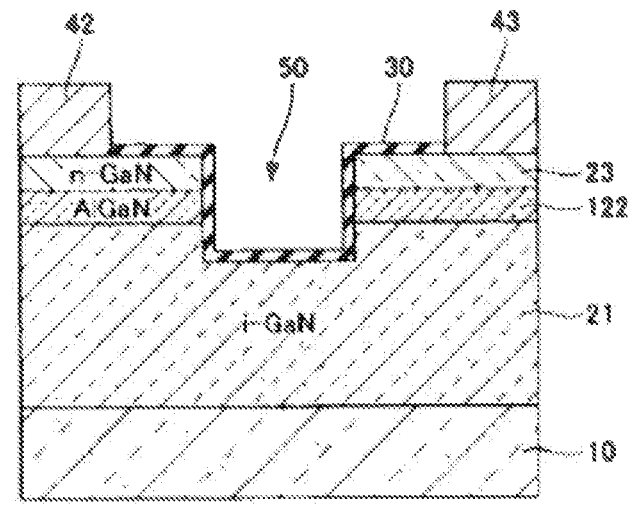

Next, as illustrated in FIG. 30B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 30C:
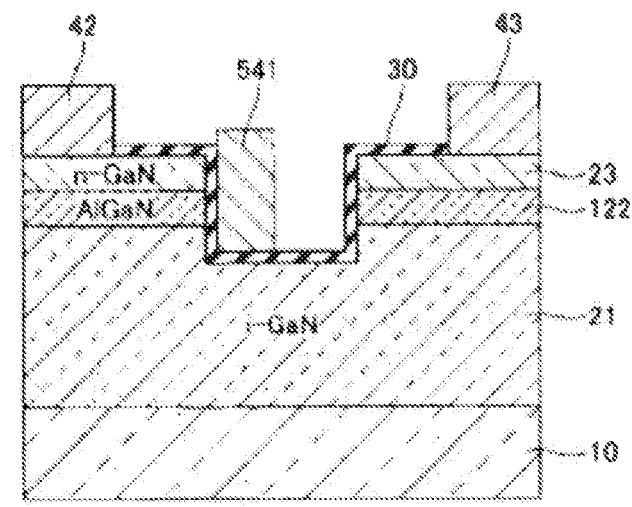

Next, as illustrated in FIG. 30C, the first gate electrode portion 541 is formed on a source electrode 42 side on the insulating layer 30 in a region in which the opening 50 is formed. Specifically, a photoresist is applied onto the insulating layer 30, and exposure by an exposure apparatus and development are performed to form a resist pattern (not shown) having an opening in the region in which the first gate electrode portion 541 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the first gate electrode portion 541 by the metal laminated film that remains.

Figure 31:
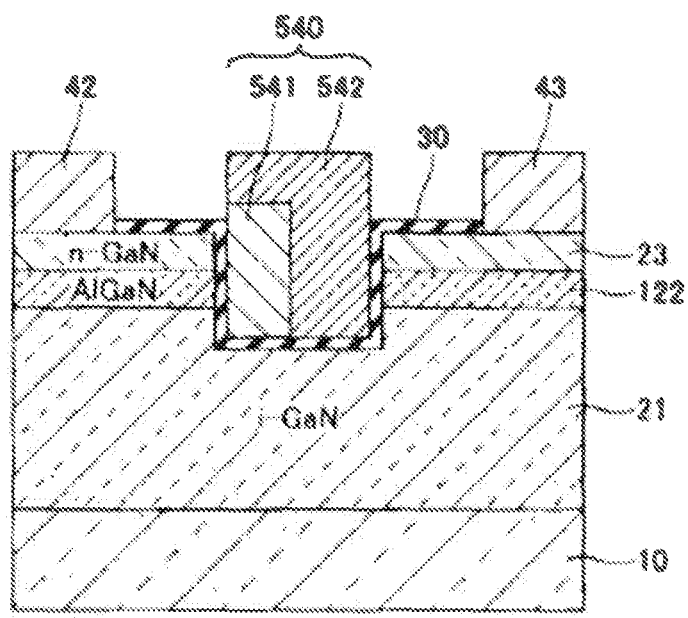
FIG. 31 is a process diagram (Part 3) of the method of manufacturing the semiconductor device in the eighth embodiment.

Next, as illustrated in FIG. 31, the second gate electrode portion 542 is formed on a drain electrode 43 side on the insulating layer 30 in the region in which the opening 50 is formed. Specifically, a photoresist is applied onto the first gate electrode portion 541 and the insulating layer 30, and exposure by an exposure apparatus and development are performed to form a resist pattern (not shown) having an opening in the region in which the second gate electrode portion 542 is formed. Then, Ti having a film thickness of 20 nm and Al having a film thickness of 200 nm are laminated by vacuum deposition and the like to form a metal laminated film (Ti/Al). Then, the metal laminated film formed on the resist pattern is removed together with the resist pattern by immersion in an organic solvent and the like to form the second gate electrode portion 542 by the metal laminated film that remains.

According to this, the gate electrode 540 in the opening 50 is constituted by the first gate electrode portion 541 that is formed on a source electrode 42 side, and the second gate electrode portion 542 that is formed on a drain electrode 43 side. According to the above-described processes, the semiconductor device in this embodiment may be manufactured.

It is noted that contents other than the above-described contents are the same as that of the seventh embodiment.

Ninth Embodiment
Semiconductor Device

Figure 32:
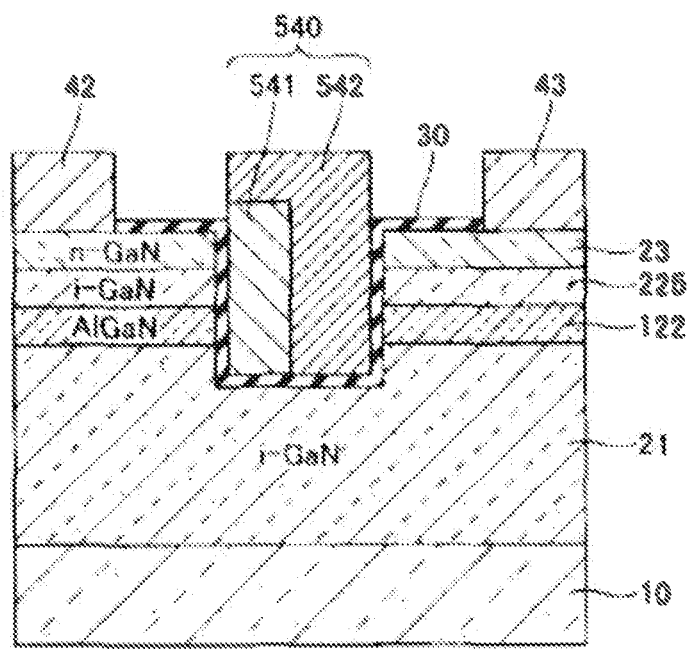
FIG. 32 is a structural diagram of a semiconductor device in a ninth embodiment.

Next, a semiconductor device in a ninth embodiment will be described with reference to FIG. 32. In the semiconductor device in this embodiment, as nitride semiconductor layers, an i-GaN layer 21, an AlGaN layer 122, an i-GaN layer 225, and an n-GaN layer 23 are formed on a substrate 10 that is formed from a semiconductor material and the like. In this embodiment, the i-GaN layer 21, the AlGaN layer 122, the i-GaN layer 225, and the n-GaN layer 23 may be described as a first semiconductor layer, a second semiconductor layer, a fifth semiconductor layer, and a third semiconductor layer, respectively.

A source electrode 42 and a drain electrode 43 are formed on the n-GaN layer 23, and in a region in which a gate electrode 540 is formed, the n-GaN layer 23, the i-GaN layer 225, and the AlGaN layer 122 are removed. However, in the region in which the gate electrode 540 is formed, the i-GaN layer 21 may be partially removed.

An insulating layer 30 is formed on a front surface and a side surface of the n-GaN layer 23, a side surface of the i-GaN layer 225, a side surface of the AlGaN layer 122, and a front surface and the like of the i-GaN layer 21. The gate electrode 540 is formed on the insulating layer 30 in a region from which the n-GaN layer 23, the i-GaN layer 225, and the AlGaN layer 122 are removed. In this embodiment, the gate electrode 540 is constituted by a first gate electrode portion 541 on a source electrode 42 side and a second gate electrode portion 542 on a drain electrode 43 side, and the first gate electrode portion 541 and the second gate electrode portion 542 are formed from materials different from each other. Accordingly, a side surface on a source electrode 42 side of the gate electrode 540 is formed to come into contact with the insulating layer 30 so as to become side surfaces of the AlGaN layer 122, the i-GaN layer 225, and the n-GaN layer 23 on a source electrode 42 side through the insulating layer 30. In addition, a side surface on a drain electrode 43 side of the gate electrode 540 is formed to come into contact with the insulating layer 30 so as to become side surfaces of the AlGaN layer 122, the i-GaN layer 225, and the n-GaN layer 23 on a drain electrode 43 side through the insulating surface 30.

In this embodiment, the i-GaN layer 225 that is the fifth semiconductor layer is formed from a material having a band gap narrower than that of the AlGaN layer 122 that is the second semiconductor layer.

In this embodiment, it is preferable that a material used to form the first gate electrode portion 541 have a work function higher than that of a material used to form the second gate electrode portion 542. In addition, it is preferable that the first gate electrode portion 541 be formed from a material having a work function of 4.5 eV or more, and more preferably 5.0 eV or more. In addition, it is preferable that the second gate electrode portion 542 be formed from a material having a work function of less than 4.5 eV.

Method of Manufacturing Semiconductor Device

Next, a method of manufacturing a semiconductor device in this embodiment will be described.

Figure 33A:
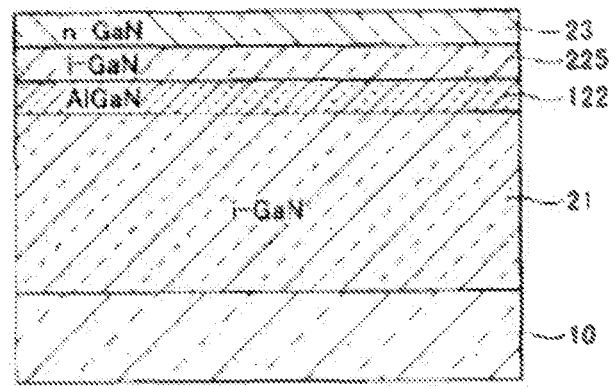
FIGS. 33A to 33C are process diagrams (Part 1) of a method of manufacturing the semiconductor device in the ninth embodiment.

First, as illustrated in FIG. 33A, the i-GaN layer 21 that is the first semiconductor layer, the AlGaN layer 122 that is the second semiconductor layer, the i-GaN layer 225 that is the fifth semiconductor layer, and the n-GaN layer 23 that is a third semiconductor layer are formed on the substrate 10 by epitaxial growth. In this embodiment, the i-GaN layer 21, the AlGaN layer 122, the i-GaN layer 225, and the n-GaN layer 23 are formed from a nitride semiconductor, and are formed by epitaxial growth by metal-organic vapor phase epitaxy (MOVPE).

The substrate 10 is constituted by a silicon semiconductor substrate and the like, and the i-GaN layer 21 has a thickness of 3 μm, the AlGaN layer 122 has a thickness of 30 nm, and the i-GaN layer 225 has a thickness of 50 nm. The n-GaN layer 23 has a thickness of 500 nm and is doped with Si as an n-type impurity element at a concentration of $1\times10^{18}$ $cm^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 33B:
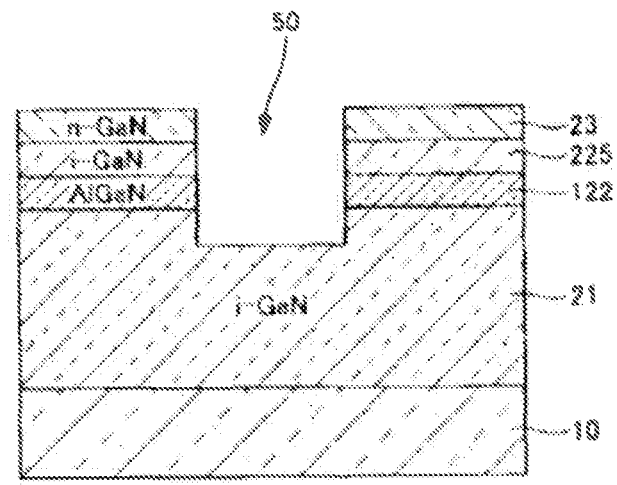

Next, as illustrated in FIG. 33B, parts of the n-GaN layer 23, the i-GaN layer 225, the AlGaN layer 122, and the i-GaN layer 21 are removed to form an opening 50. Specifically, a photoresist is applied onto the n-GaN layer 23, and exposure by an exposure apparatus and development are performed to form a resist pattern (not shown) having an opening in a region in which the opening 50 is formed. Then, the n-GaN layer 23, the i-GaN layer 225, and the AlGaN layer 122 are removed by dry etching such as RIE using a chlorine-based gas to expose the i-GaN layer 21, thereby forming the opening 50. In this embodiment, when forming the opening 50, a part of the i-GaN layer 21 may be removed.

Figure 33C:
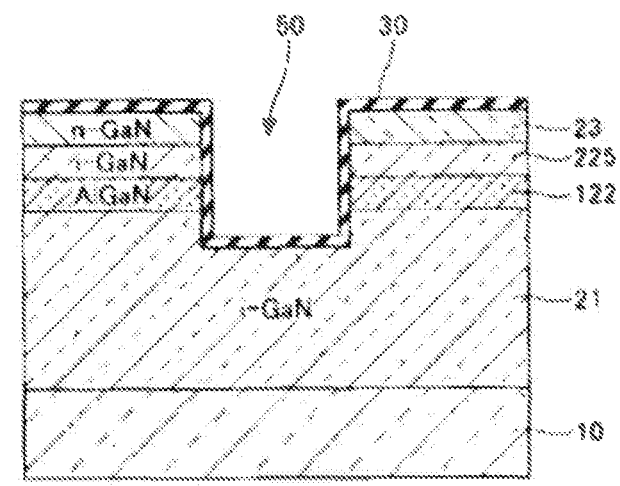

Next, as illustrated in FIG. 33C, the insulating layer 30 is formed on a bottom surface and a side surface of the opening 50, and on the n-GaN layer 23. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like, but in this embodiment, the insulating layer 30 is formed by the ALD. According to this, the insulating layer 30 is formed on the i-GaN layer 21 that becomes a bottom surface of the opening 50, on side surfaces of the AlGaN layer 122, the i-GaN layer 225, and the n-GaN layer 23 which become a side surface of the opening 50, and on the n-GaN layer 23.

Figure 34A:
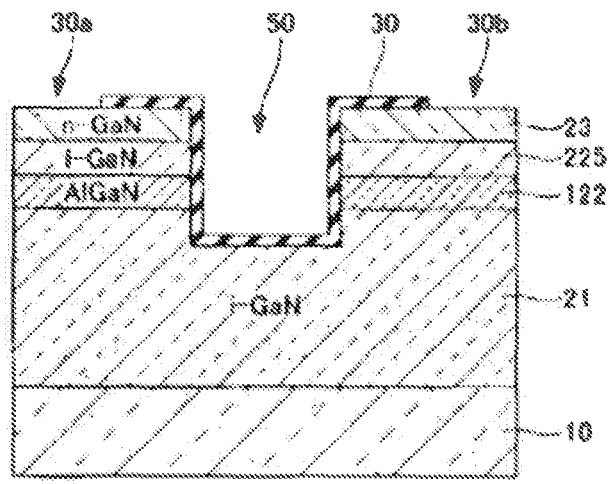
FIGS. 34A to 34C are process diagrams (Part 2) of the method of manufacturing the semiconductor device in the ninth embodiment.

Next, as illustrated in FIG. 34A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the n-GaN layer 23, thereby forming the openings 30a and 30b. Then, the resist pattern (not shown) is removed by an organic solvent and the like.

Figure 34B:
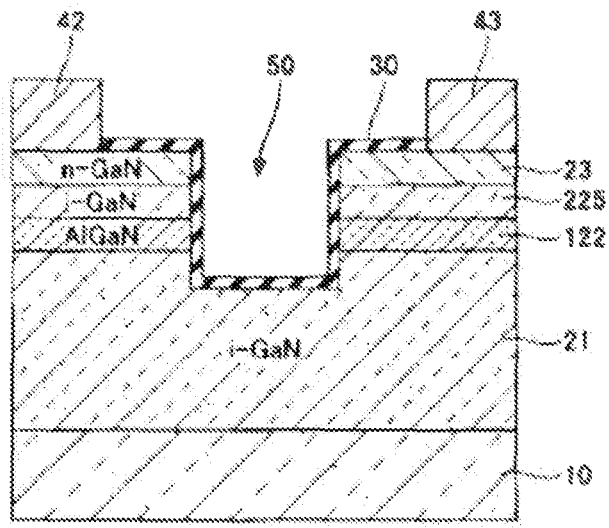

Next, as illustrated in FIG. 34B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 34C:
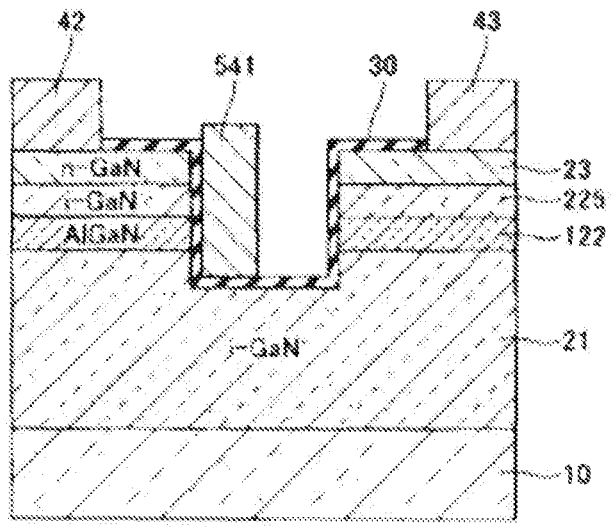

Next, as illustrated in FIG. 34C, the first gate electrode portion 541 is formed on a source electrode 42 side on the insulating layer 30 in a region in which the opening 50 is formed. Specifically, a photoresist is applied onto the insulating layer 30, and exposure by an exposure apparatus and development are performed to form a resist pattern (not shown) having an opening in the region in which the first gate electrode portion 541 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the first gate electrode portion 541 by the metal laminated film that remains.

Figure 35:
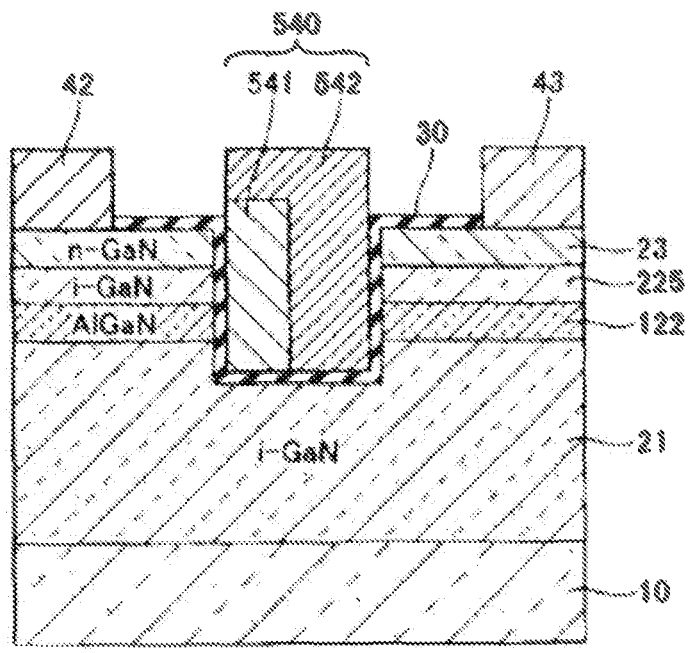
FIG. 35 is a process diagram (Part 3) of the method of manufacturing the semiconductor device in the ninth embodiment.

Next, as illustrated in FIG. 35, the second gate electrode portion 542 is formed on a drain electrode 43 side on the insulating layer 30 in the region in which the opening 50 is formed. Specifically, a photoresist is applied onto the first gate electrode portion 541 and the insulating layer 30, and exposure by an exposure apparatus and development are performed to form a resist pattern (not shown) having an opening in the region in which the second gate electrode portion 542 is formed. Then, Ti having a film thickness of 20 nm and Al having a film thickness of 200 nm are laminated by vacuum deposition and the like to form a metal laminated film (Ti/Al). Then, the metal laminated film formed on the resist pattern is removed together with the resist pattern by immersion in an organic solvent and the like to form the second gate electrode portion 542 by the metal laminated film that remains.

According to this, the gate electrode 540 in the opening 50 is constituted by the first gate electrode portion 541 that is formed on a source electrode 42 side, and the second gate electrode portion 542 that is formed on a drain electrode 43 side. According to the above-described processes, the semiconductor device in this embodiment may be manufactured.

It is noted that contents other than the above-described contents are the same as that of the eighth embodiment.

Tenth Embodiment

Semiconductor Device

Figure 36:
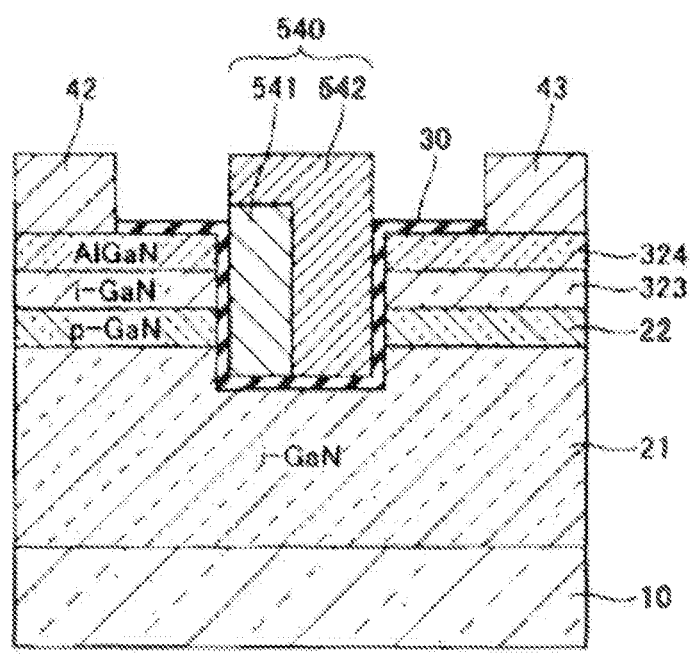
FIG. 36 is a structural diagram of a semiconductor device in a tenth embodiment.

Next, a semiconductor device in a tenth embodiment will be described with reference to FIG. 36. In the semiconductor device in this embodiment, as nitride semiconductor layers, an i-GaN layer 21, a p-GaN layer 22, an i-GaN layer 323, and an AlGaN layer 324 are formed on a substrate 10 that is formed from a semiconductor material and the like. In this embodiment, the i-GaN layer 21, the p-GaN layer 22, the i-GaN layer 323, and the AlGaN layer 324 may be described as a first semiconductor layer, a second semiconductor layer, a third semiconductor layer, and a fourth semiconductor layer, respectively.

A source electrode 42 and a drain electrode 43 are formed on the AlGaN layer 324, and in a region in which a gate electrode 540 is formed, the AlGaN layer 324, the i-GaN layer 323, and the p-GaN layer 22 are removed. However, in the region in which the gate electrode 540 is formed, the i-GaN layer 21 may be partially removed.

An insulating layer 30 is formed on a front surface and a side surface of the AlGaN layer 324, a side surface of the i-GaN layer 323, a side surface of the p-GaN layer 22, and a front surface and the like of the i-GaN layer 21. The gate electrode 540 is formed on the insulating layer 30 in a region from which the AlGaN layer 324, the i-GaN layer 323, and the p-GaN layer 22 are removed. In this embodiment, the gate electrode 540 is constituted by a first gate electrode portion 541 on a source electrode 42 side and a second gate electrode portion 542 on a drain electrode 43 side, and the first gate electrode portion 541 and the second gate electrode portion 542 are formed from materials different from each other. Accordingly, a side surface on a source electrode 42 side of the gate electrode 540 is formed to come into contact with the insulating layer 30 so as to become side surfaces of the p-GaN layer 22, the i-GaN layer 323, and the AlGaN layer 324 on a source electrode 42 side through the insulating layer 30. In addition, a side surface on a drain electrode 43 side of the gate electrode 540 is formed to come into contact with the insulating layer 30 so as to become side surfaces of the p-GaN layer 22, the i-GaN layer 323, and the AlGaN layer 324 on a drain electrode 43 side through the insulating surface 30.

In this embodiment, the third semiconductor layer is constituted by the i-GaN layer 323, and the fourth semiconductor layer is constituted by the AlGaN layer 324. According to this, in the third semiconductor layer, 2DEG (not shown) is generated in the vicinity of an interface between the third semiconductor layer and the fourth semiconductor layer, and thus it is possible to lower a resistance of this region, and thus it is possible to lower an on-resistance.

In this embodiment, it is preferable that a material used to form the first gate electrode portion 541 have a work function higher than that of a material used to form the second gate electrode portion 542. In addition, it is preferable that the first gate electrode portion 541 be formed from a material having a work function of 4.5 eV or more, and more preferably 5.0 eV or more. In addition, it is preferable that the second gate electrode portion 542 be formed from a material having a work function of less than 4.5 eV.

Method of Manufacturing Semiconductor Device

Next, a method of manufacturing a semiconductor device in this embodiment will be described.

Figure 37A:
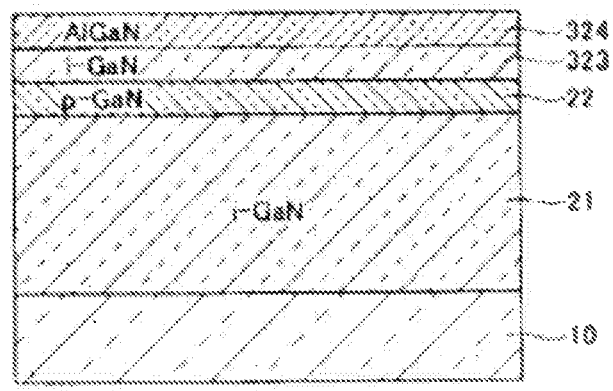
FIGS. 37A to 37C are process diagrams (Part 1) of a method of manufacturing the semiconductor device in the tenth embodiment.

First, as illustrated in FIG. 37A, the i-GaN layer 21 that is the first semiconductor layer, the p-GaN layer 22 that is the second semiconductor layer, the i-GaN layer 323 that is the third semiconductor layer, and the AlGaN layer 324 that is the fourth semiconductor layer are formed on the substrate 10 by epitaxial growth. In this embodiment, the i-GaN layer 21, the p-GaN layer 22, the i-GaN layer 323, and the AlGaN layer 324 are formed from a nitride semiconductor and are formed by epitaxial growth by metal-organic vapor phase epitaxy (MOVPE).

The substrate 10 is constituted by a silicon semiconductor substrate and the like, and the i-GaN layer 21 has a thickness of 3 μm. The p-GaN layer 22 has a thickness of 500 nm and is doped with Mg as a p-type impurity element at a concentration of $1 \times 10^{19}$ cm$^{-3}$. The i-GaN layer 323 has a thickness of 300 nm, and the AlGaN layer 324 has a thickness of 30 nm.

Then, although not shown, an element isolation region may be formed. Specifically, a photoresist is applied onto the AlGaN layer 324, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 37B:
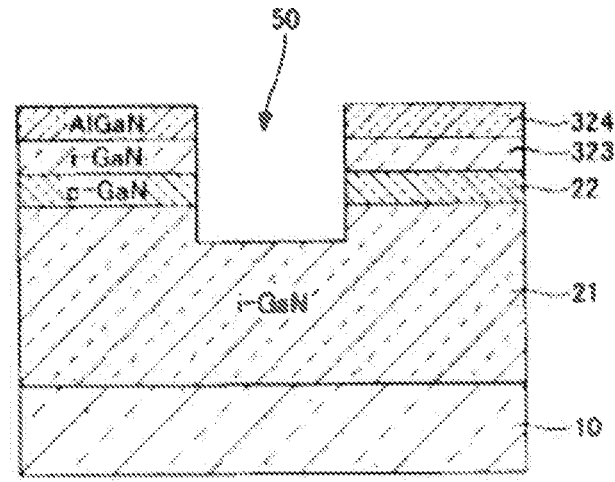

Next, as illustrated in FIG. 37B, parts of the AlGaN layer 324, the i-GaN layer 323, the p-GaN layer 22, and the i-GaN layer 21 are removed to form an opening 50. Specifically, a photoresist is applied onto the AlGaN layer 324, and exposure by an exposure apparatus and development are performed to form a resist pattern (not shown) having an opening in a region in which the opening 50 is formed. Then, the AlGaN layer 324, the i-GaN layer 323, and the p-GaN layer 22 are removed by dry etching such as RIE using a chlorine-based gas to expose the i-GaN layer 21, thereby forming the opening 50. In this embodiment, when forming the opening 50, a part of the i-GaN layer 21 may be removed.

Figure 37C:
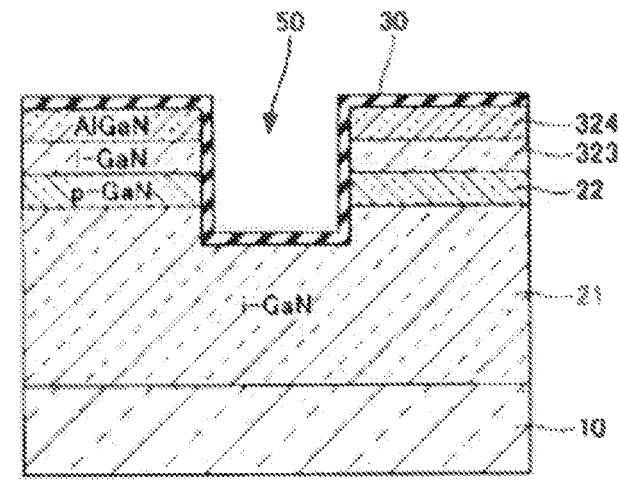

Next, as illustrated in FIG. 37C, the insulating layer 30 is formed on a bottom surface and a side surface of the opening 50, and on the AlGaN layer 324. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like, and in this embodiment, the insulating layer 30 is formed by the ALD. According to this, the insulating layer 30 is formed on the i-GaN layer 21 that becomes a bottom surface of the opening 50, on side surfaces of the p-GaN layer 22, the i-GaN layer 323, and the AlGaN layer 324 which become a side surface of the opening 50, and on the AlGaN layer 324.

Figure 38A:
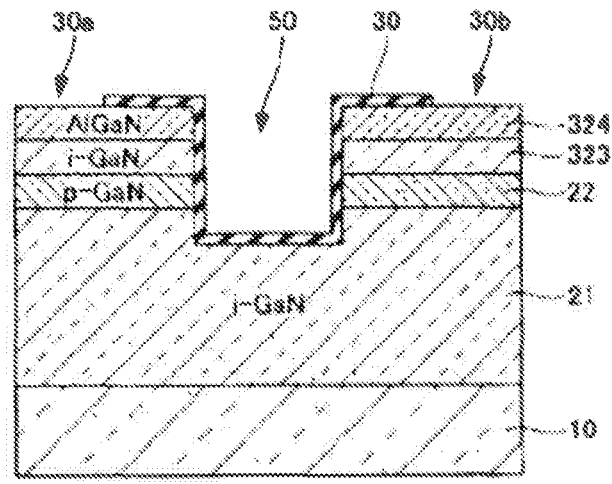
FIGS. 38A to 38C are process diagrams (Part 2) of the method of manufacturing the semiconductor device in the tenth embodiment.

Next, as illustrated in FIG. 38A, the insulating layer 30 in regions in which the source electrode 42 and the drain electrode 43 are formed is removed to expose the AlGaN layer 324, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the AlGaN layer 324, thereby forming the openings 30a and 30b. Then, the resist pattern (not shown) is removed by an organic solvent and the like.

Figure 38B:
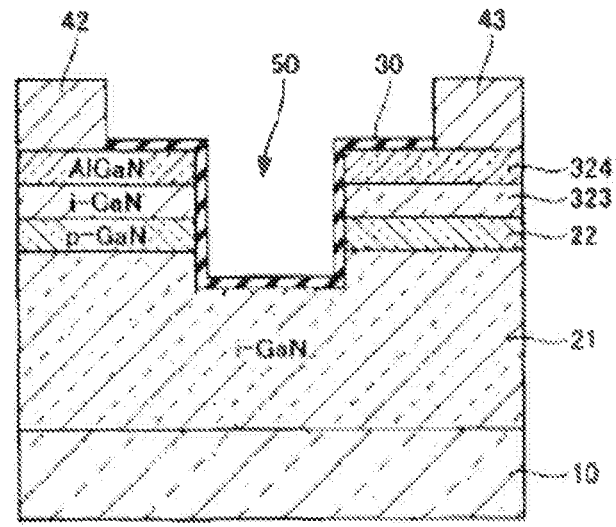

Next, as illustrated in FIG. 38B, the source electrode 42 and the drain electrode 43 are formed in the openings 30a and 30b of the insulating layer 30 through which the AlGaN layer 324 is exposed. Specifically, a photoresist is applied onto the AlGaN layer 324 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 38C:
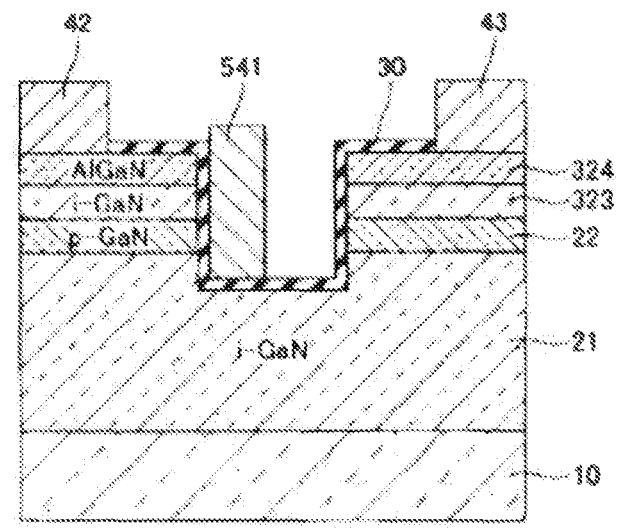

Next, as illustrated in FIG. 38C, the first gate electrode portion 541 is formed on a source electrode 42 side on the insulating layer 30 in a region in which the opening 50 is formed. Specifically, a photoresist is applied onto the insulating layer 30, and exposure by an exposure apparatus and development are performed to form a resist pattern (not shown) having an opening in the region in which the first gate electrode portion 541 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the first gate electrode portion 541 by the metal laminated film that remains.

Figure 39:
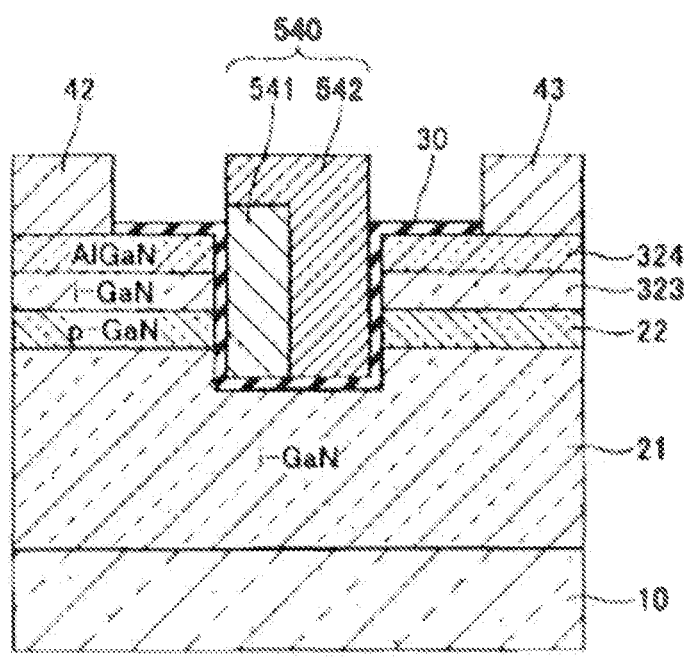
FIG. 39 is a process diagram (Part 3) of the method of manufacturing the semiconductor device in the tenth embodiment.

Next, as illustrated in FIG. 39, the second gate electrode portion 542 is formed on a drain electrode 43 side on the insulating layer 30 in the region in which the opening 50 is formed. Specifically, a photoresist is applied onto the first gate electrode portion 541 and the insulating layer 30, and exposure by an exposure apparatus and development are performed to form a resist pattern (not shown) having an opening in the region in which the second gate electrode portion 542 is formed. Then, Ti having a film thickness of 20 nm and Al having a film thickness of 200 nm are laminated by vacuum deposition and the like to form a metal laminated film (Ti/Al). Then, the metal laminated film formed on the resist pattern is removed together with the resist pattern by immersion in an organic solvent and the like to form the second gate electrode portion 542 by the metal laminated film that remains.

According to this, the gate electrode 540 in the opening 50 is constituted by the first gate electrode portion 541 that is formed on a source electrode 42 side, and the second gate electrode portion 542 that is formed on a drain electrode 43 side. According to the above-described processes, the semiconductor device in this embodiment may be manufactured.

It is noted that contents other than the above-described contents are the same as that of the seventh embodiment.

Eleventh Embodiment

Semiconductor Device

Figure 40:
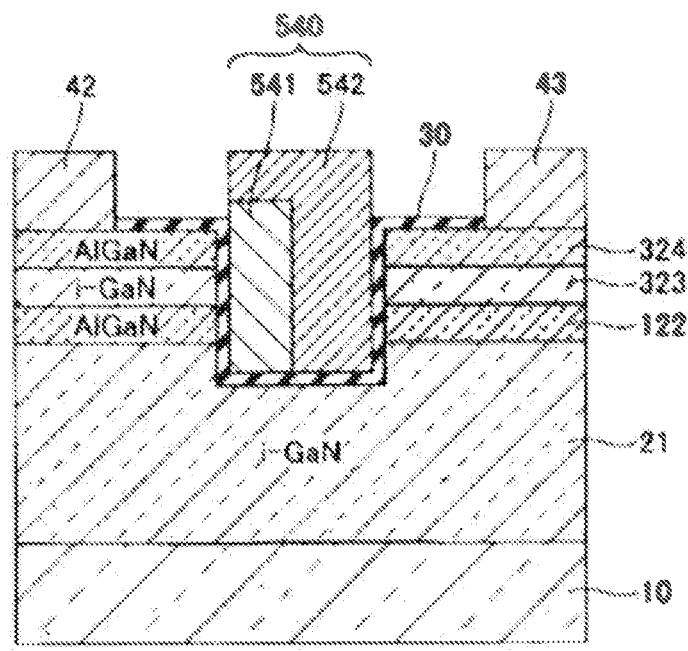
FIG. 40 is a structural diagram of a semiconductor device in an eleventh embodiment.

Next, a semiconductor device in an eleventh embodiment will be described with reference to FIG. 40. The semiconductor device in this embodiment, as nitride semiconductor layers, an i-GaN layer 21, an AlGaN layer 122, an i-GaN layer 323, and an AlGaN layer 324 are formed on a substrate 10 that is formed from a semiconductor material and the like. In this embodiment, the i-GaN layer 21, the AlGaN layer 122, the i-GaN layer 323, and the AlGaN layer 324 may be described as a first semiconductor layer, a second semiconductor layer, a third semiconductor layer, and a fourth semiconductor layer, respectively.

A source electrode 42 and a drain electrode 43 are formed on the AlGaN layer 324, and in a region in which a gate electrode 540 is formed, the AlGaN layer 324, the i-GaN layer 323, and the AlGaN layer 122 are removed. However, in the region in which the gate electrode 540 is formed, the i-GaN layer 21 may be partially removed.

An insulating layer 30 is formed on a front surface and a side surface of the AlGaN layer 324, a side surface of the i-GaN layer 323, a side surface of the AlGaN layer 122, and a front surface and the like of the i-GaN layer 21. The gate electrode 540 is formed on the insulating layer 30 in a region from which the AlGaN layer 324, the i-GaN layer 323, and the AlGaN layer 122 are removed. In this embodiment, the gate electrode 540 is constituted by a first gate electrode portion 541 on a source electrode 42 side and a second gate electrode portion 542 on a drain electrode 43 side, and the first gate electrode portion 541 and the second gate electrode portion 542 are formed from materials different from each other. Accordingly, a side surface on a source electrode 42 side of the gate electrode 540 is formed to come into contact with the insulating layer 30 so as to become side surfaces of the AlGaN layer 122, the i-GaN layer 323, and the AlGaN layer 324 on a source electrode 42 side through the insulating layer 30. In addition, a side surface on a drain electrode 43 side of the gate electrode 540 is formed to come into contact with the insulating layer 30 so as to become side surfaces of the AlGaN layer 122, the i-GaN layer 323, and the AlGaN layer 324 on a drain electrode 43 side through the insulating surface 30.

In this embodiment, the third semiconductor layer is constituted by the i-GaN layer 323, and the fourth semiconductor layer is constituted by the AlGaN layer 324. According to this, in the third semiconductor layer, 2DEG (not shown) is generated in the vicinity of an interface between the third semiconductor layer and the fourth semiconductor layer, and thus it is possible to lower a resistance of this region, and thus it is possible to lower an on-resistance.

In this embodiment, it is preferable that a material used to form the first gate electrode portion 541 have a work function higher than that of a material used to form the second gate electrode portion 542. In addition, it is preferable that the first gate electrode portion 541 be formed from a material having a work function of 4.5 eV or more, and more preferably 5.0 eV or more. In addition, it is preferable that the second gate electrode portion 542 be formed from a material having a work function of less than 4.5 eV.

Method of Manufacturing Semiconductor Device

Next, a method of manufacturing a semiconductor device in this embodiment will be described.

Figure 41A:
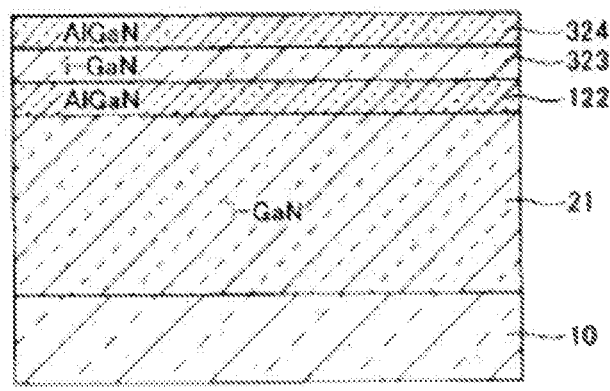
FIGS. 41A to 41C are process diagrams (Part 1) of a method of manufacturing the semiconductor device in the eleventh embodiment.

First, as illustrated in FIG. 41A, the i-GaN layer 21 that is the first semiconductor layer, the AlGaN layer 122 that is the second semiconductor layer, the i-GaN layer 323 that is the third semiconductor layer, and the AlGaN layer 324 that is the fourth semiconductor layer are formed on the substrate 10 by epitaxial growth. In this embodiment, the i-GaN layer 21, the AlGaN layer 122, the i-GaN layer 323, and the AlGaN layer 324 are formed from a nitride semiconductor and are formed by epitaxial growth by metal-organic vapor phase epitaxy (MOVPE).

The substrate 10 is constituted by a silicon semiconductor substrate and the like, and the i-GaN layer 21 has a thickness of 3 μm. The AlGaN layer 122 has a thickness of 30 nm, the i-GaN layer 323 has a thickness of 300 nm, and the AlGaN layer 324 has a thickness of 30 nm.

Then, although not shown, an element isolation region may be formed. Specifically, a photoresist is applied onto the AlGaN layer 324, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 41B:
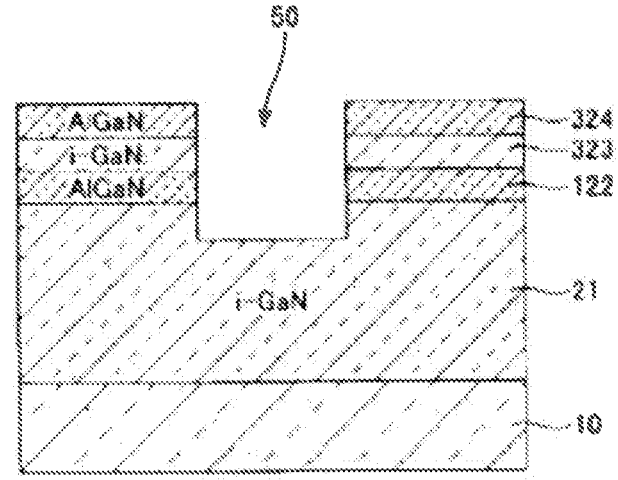

Next, as illustrated in FIG. 41B, parts of the AlGaN layer 324, the i-GaN layer 323, the AlGaN layer 122, and the i-GaN layer 21 are removed to form an opening 50. Specifically, a photoresist is applied onto the AlGaN layer 324, and exposure by an exposure apparatus and development are performed to form a resist pattern (not shown) having an opening in a region in which the opening 50 is formed. Then, the AlGaN layer 324, the i-GaN layer 323, and the AlGaN layer 122 are removed by dry etching such as RIE using a chlorine-based gas to expose the i-GaN layer 21, thereby forming the opening 50. In this embodiment, when forming the opening 50, a part of the i-GaN layer 21 may be removed.

Figure 41C:
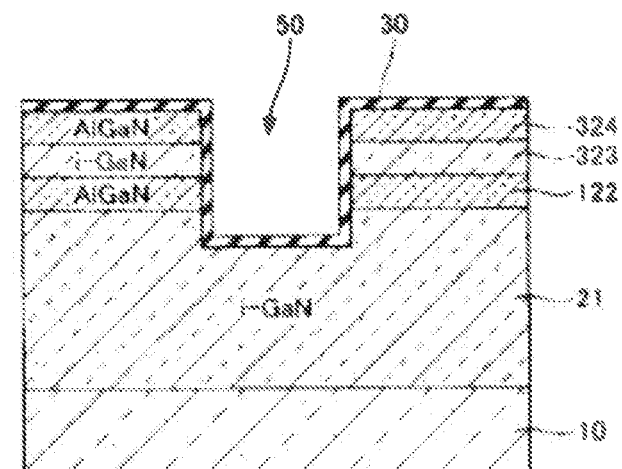

Next, as illustrated in FIG. 41C, the insulating layer 30 is formed on a bottom surface and a side surface of the opening 50, and on the AlGaN layer 324. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like, and in this embodiment, the insulating layer 30 is formed by the ALD. According to this, the insulating layer 30 is formed on the i-GaN layer 21 that becomes a bottom surface of the opening 50, on side surfaces of the AlGaN layer 122, the i-GaN layer 323, and the AlGaN layer 324 which become a side surface of the opening 50, and on the AlGaN layer 324.

Figure 42A:
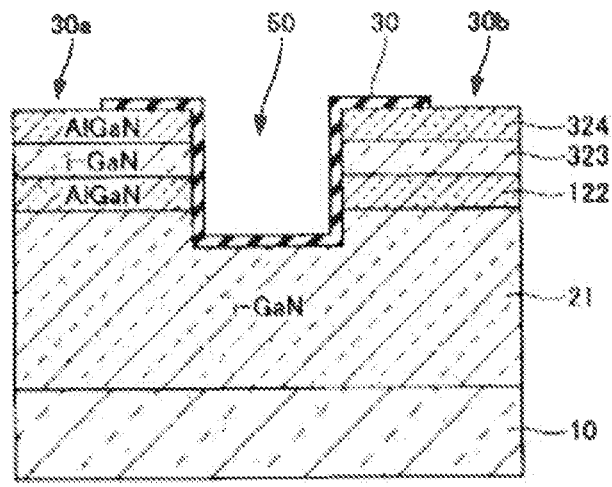
FIGS. 42A to 42C are process diagrams (Part 2) of the method of manufacturing the semiconductor device in the eleventh embodiment.

Next, as illustrated in FIG. 42A, the insulating layer 30 in regions in which the source electrode 42 and the drain electrode 43 are formed is removed to expose the AlGaN layer 324, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the AlGaN layer 324, thereby forming the openings 30a and 30b. Then, the resist pattern (not shown) is removed by an organic solvent and the like.

Figure 42B:
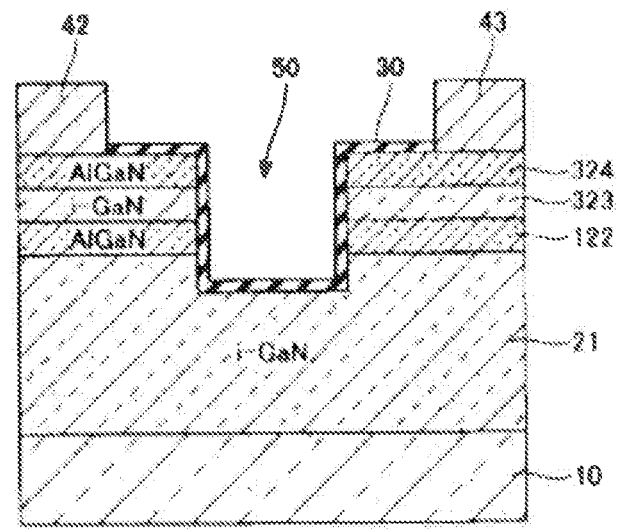

Next, as illustrated in FIG. 42B, the source electrode 42 and the drain electrode 43 are formed in the openings 30a and 30b of the insulating layer 30 through which the AlGaN layer 324 is exposed. Specifically, a photoresist is applied onto the AlGaN layer 324 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 42C:
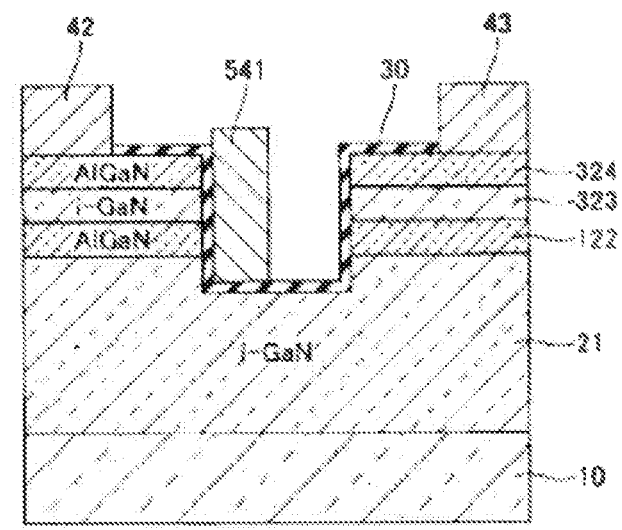

Next, as illustrated in FIG. 42C, the first gate electrode portion 541 is formed on a source electrode 42 side on the insulating layer 30 in a region in which the opening 50 is formed. Specifically, a photoresist is applied onto the insulating layer 30, and exposure by an exposure apparatus and development are performed to form a resist pattern (not shown) having an opening in the region in which the first gate electrode portion 541 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the first gate electrode portion 541 by the metal laminated film that remains.

Figure 43:
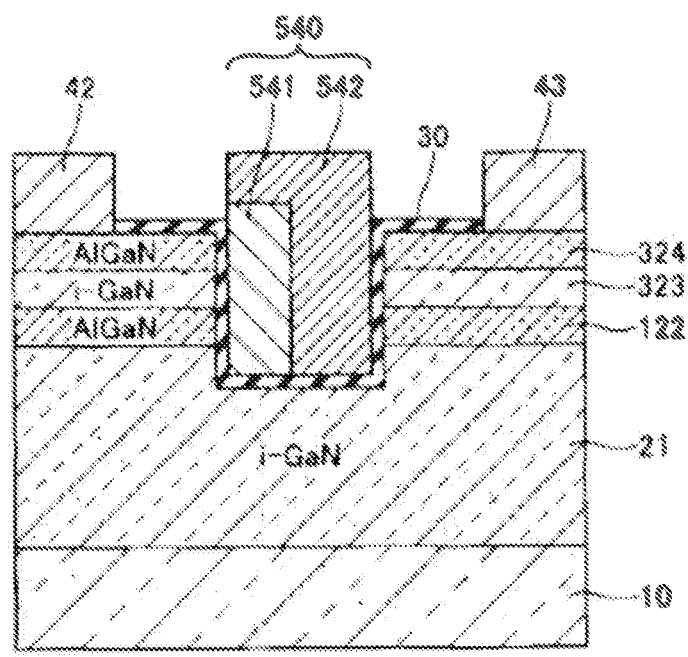
FIG. 43 is a process diagram (Part 3) of the method of manufacturing the semiconductor device in the eleventh embodiment.

Next, as illustrated in FIG. 43, the second gate electrode portion 542 is formed on a drain electrode 43 side on the insulating layer 30 in the region in which the opening 50 is formed. Specifically, a photoresist is applied onto the first gate electrode portion 541 and the insulating layer 30, and exposure by an exposure apparatus and development are performed to form a resist pattern (not shown) having an opening in the region in which the second gate electrode portion 542 is formed. Then, Ti having a film thickness of 20 nm and Al having a film thickness of 200 nm are laminated by vacuum deposition and the like to form a metal laminated film (Ti/Al). Then, the metal laminated film formed on the resist pattern is removed together with the resist pattern by immersion in an organic solvent and the like to form the second gate electrode portion 542 by the metal laminated film in the opening 50.

According to this, the gate electrode 540 is constituted by the first gate electrode portion 541 that is formed on a source electrode 42 side, and the second gate electrode portion 542 that is formed on a drain electrode 43 side. According to the above-described processes, the semiconductor device in this embodiment may be manufactured.

It is noted that contents other than the above-described contents are the same as that of the eighth embodiment.

Twelfth Embodiment

Semiconductor Device

Figure 44:
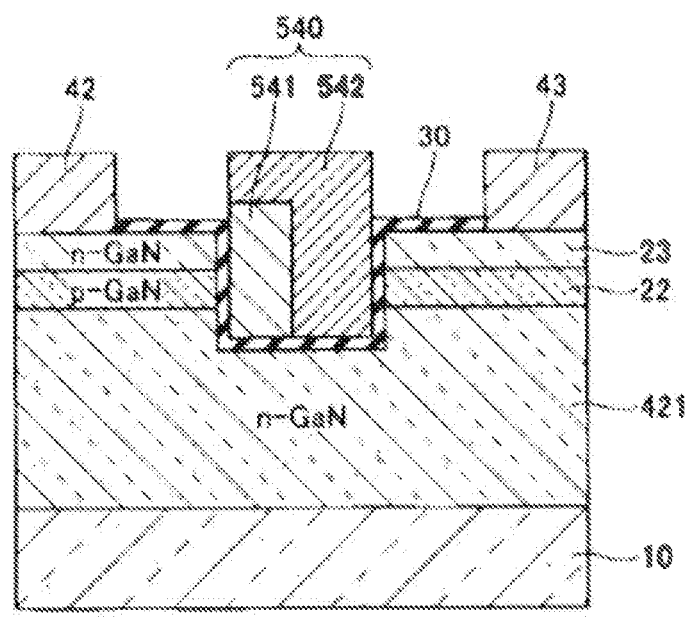
FIG. 44 is a structural diagram of a semiconductor device in a twelfth embodiment.

Next, a semiconductor device in a twelfth embodiment will be described with reference to FIG. 44. In the semiconductor device in this embodiment, as nitride semiconductor layers, an n-GaN layer 421, a p-GaN layer 22, and an n-GaN layer 23 are formed on a substrate 10 that is formed from a semiconductor material and the like. In this embodiment, the n-GaN layer 421, the p-GaN layer 22, and the n-GaN layer 23 may be described as a first semiconductor layer, a second semiconductor layer, and a third semiconductor layer, respectively.

A source electrode 42 and a drain electrode 43 are formed on the n-GaN layer 23, and in a region in which a gate electrode 540 is formed, the n-GaN layer 23 and the p-GaN layer 22 are removed. However, in the region in which the gate electrode 540 is formed, the n-GaN layer 421 may be partially removed.

An insulating layer 30 is formed on a front surface and a side surface of the n-GaN layer 23, a side surface of the p-GaN layer 22, and a front surface and the like of the n-GaN layer 421, and the gate electrode 540 is formed on the insulating layer 30 in the region from which the n-GaN layer 23 and the p-GaN layer 22 are removed. In this embodiment, the gate electrode 540 is constituted by a first gate electrode portion 541 on a source electrode 42 side and a second gate electrode portion 542 on a drain electrode 43 side, and the first gate electrode portion 541 and the second gate electrode portion 542 are formed from materials different from each other. Accordingly, a side surface on a source electrode 42 side of the gate electrode 540 is formed to come into contact with the insulating layer 30 so as to become side surfaces of the p-GaN layer 22 and the n-GaN layer 23 on a source electrode 42 side through the insulating layer 30. In addition, a side surface on a drain electrode 43 side of the gate electrode 540 is formed to come into contact with the insulating layer 30 so as to become side surfaces of the p-GaN layer 22 and the n-GaN layer 23 on a drain electrode 43 side through the insulating surface 30.

In this embodiment, the n-GaN layer 421 that is the first semiconductor layer is preferably doped with Si as an n-type impurity element at a concentration of $1\times10^{18}$ cm$^{-3}$ or more.

In this embodiment, it is preferable that a material used to form the first gate electrode portion 541 have a work function higher than that of a material used to form the second gate electrode portion 542. In addition, it is preferable that the first gate electrode portion 541 be formed from a material having a work function of 4.5 eV or more, and more preferably 5.0 eV or more. In addition, it is preferable that the second gate electrode portion 542 be formed from a material having a work function of less than 4.5 eV.

Method of Manufacturing Semiconductor Device

Next, a method of manufacturing a semiconductor device in this embodiment will be described.

Figure 45A:
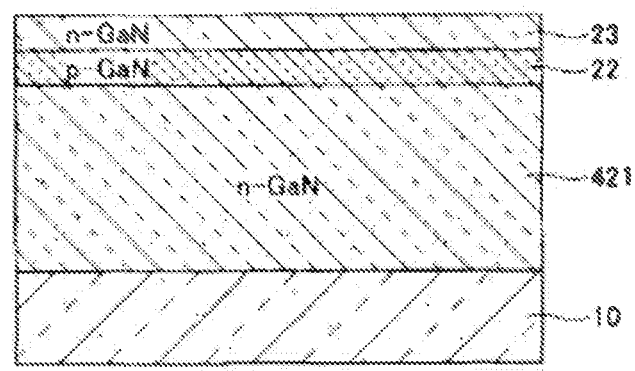
FIGS. 45A to 45C are process diagrams (Part 1) of a method of manufacturing the semiconductor device in the twelfth embodiment.

First, as illustrated in FIG. 45A, the n-GaN layer 421 that is the first semiconductor layer, the p-GaN layer 22 that is the second semiconductor layer, and the n-GaN layer 23 that is the third semiconductor layer are formed on the substrate 10 by epitaxial growth. In this embodiment, the n-GaN layer 421, the p-GaN layer 22, and the n-GaN layer 23 are formed from a nitride semiconductor, and are formed by epitaxial growth by metal-organic vapor phase epitaxy (MOVPE).

The substrate 10 is constituted by a silicon semiconductor substrate and the like, and the n-GaN layer 421 has a thickness of 3 μm and is doped with Si as an n-type impurity element at a concentration of $1\times10^{17}$ cm$^{-3}$. The p-GaN layer 22 has a thickness of 500 nm and is doped with Mg as a p-type impurity element at a concentration of $1\times1019$ cm$^{-3}$. The n-GaN layer 23 has a thickness of 500 nm and is doped with Si as an n-type impurity element at a concentration of $1\times10^{18}$ cm$^{-3}$.

Then, although not shown, an element isolation region may be formed. Specifically, a photoresist is applied onto the n-GaN layer 23, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 45B:
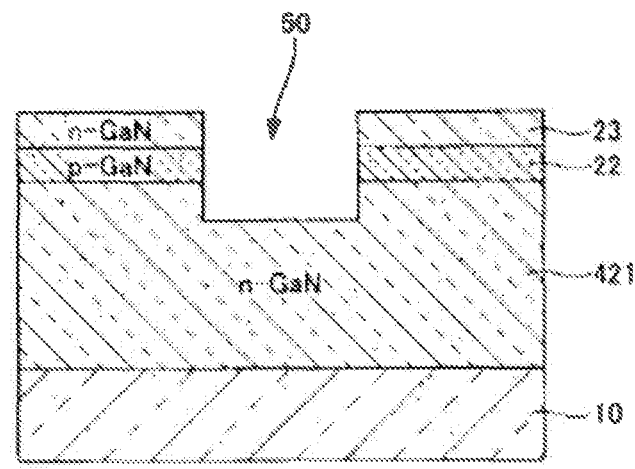

Next, as illustrated in FIG. 45B, parts of the n-GaN layer 23, the p-GaN layer 22, and the n-GaN layer 421 are removed to form an opening 50. Specifically, a photoresist is applied onto the n-GaN layer 23, and exposure by an exposure apparatus and development are performed to form a resist pattern (not shown) having an opening in a region in which the opening 50 is formed. Then, the n-GaN layer 23 and the p-GaN layer 22 are removed by dry etching such as RIE using a chlorine-based gas to expose the n-GaN layer 421, thereby forming the opening 50. In this embodiment, when forming the opening 50, a part of the n-GaN layer 421 may be removed.

Figure 45C:
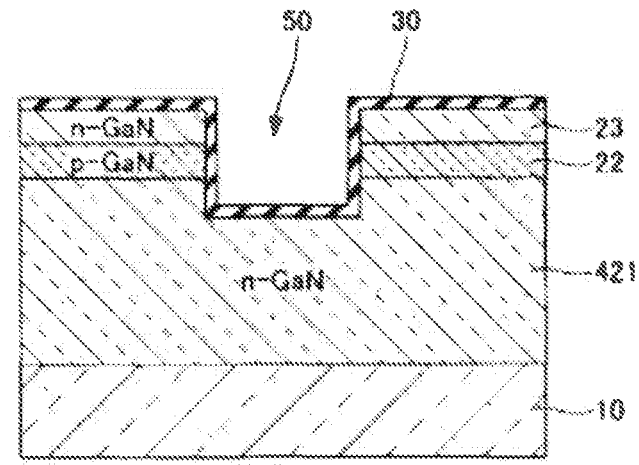

Next, as illustrated in FIG. 45C, the insulating layer 30 is formed on a bottom surface and a side surface of the opening 50, and on the n-GaN layer 23. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the n-GaN layer 421 that becomes a bottom surface of the opening 50, on side surfaces of the p-GaN layer 22 and the n-GaN layer 23 which become a side surface of the opening 50, and on the n-GaN layer 23.

Figure 46A:
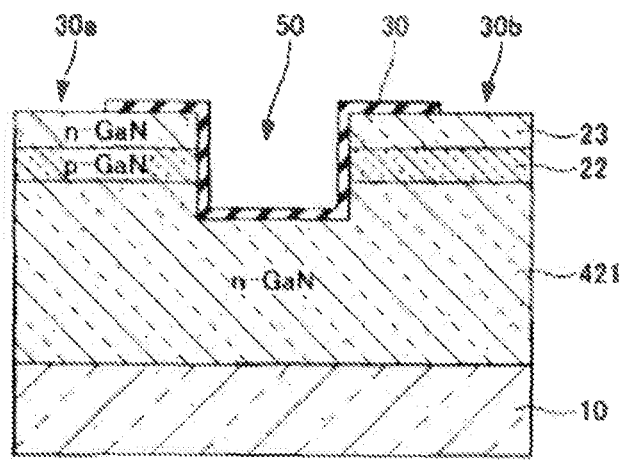
FIGS. 46A to 46C are process diagrams (Part 2) of the method of manufacturing the semiconductor device in the twelfth embodiment.

Next, as illustrated in FIG. 46A, the insulating layer 30 in regions in which the source electrode 42 and the drain electrode 43 are formed is removed to expose the n-GaN layer 23, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the n-GaN layer 23, thereby forming the openings 30a and 30b. Then, the resist pattern (not shown) is removed by an organic solvent and the like.

Figure 46B:
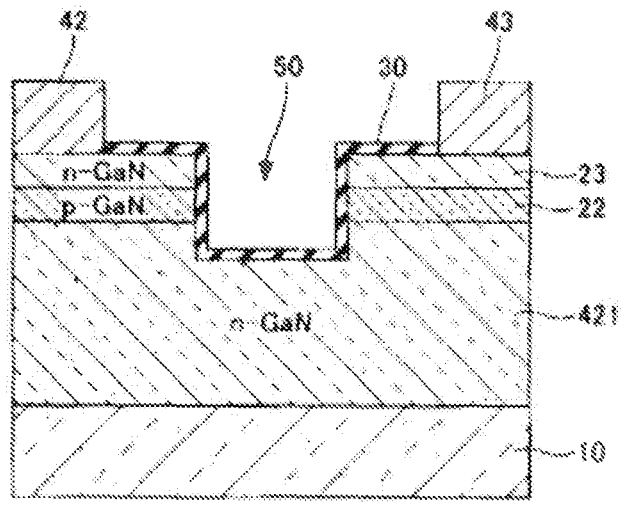

Next, as illustrated in FIG. 46B, the source electrode 42 and the drain electrode 43 are formed in the openings 30a and 30b of the insulating layer 30 through which the n-GaN layer 23 is exposed. Specifically, a photoresist is applied onto the n-GaN layer 23 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 46C:
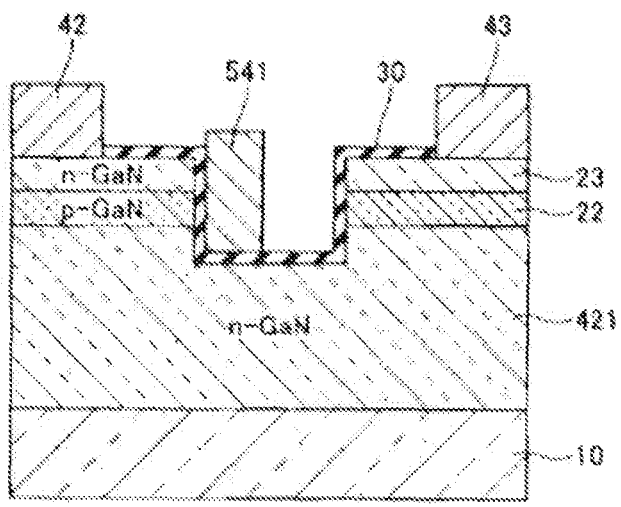

Next, as illustrated in FIG. 46C, the first gate electrode portion 541 is formed on a source electrode 42 side on the insulating layer 30 in a region in which the opening 50 is formed. Specifically, a photoresist is applied onto the insulating layer 30, and exposure by an exposure apparatus and development are performed to form a resist pattern (not shown) having an opening in the region in which the first gate electrode portion 541 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the first gate electrode portion 541 by the metal laminated film that remains.

Figure 47:
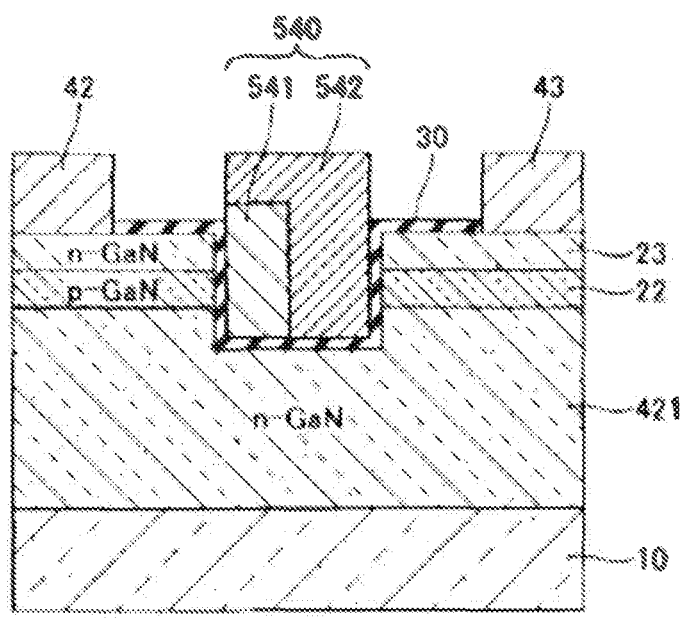
FIG. 47 is a process diagram (Part 3) of the method of manufacturing the semiconductor device in the twelfth embodiment.

Next, as illustrated in FIG. 47, the second gate electrode portion 542 is formed on a drain electrode 43 side on the insulating layer 30 in the region in which the opening 50 is formed. Specifically, a photoresist is applied onto the first gate electrode portion 541 and the insulating layer 30, and exposure by an exposure apparatus and development are performed to form a resist pattern (not shown) having an opening in the region in which the second gate electrode portion 542 is formed. Then, Ti having a film thickness of 20 nm and Al having a film thickness of 200 nm are laminated by vacuum deposition and the like to form a metal laminated film (Ti/Al). Then, the metal laminated film formed on the resist pattern is removed together with the resist pattern by immersion in an organic solvent and the like to form the second gate electrode portion 542 by the metal laminated film in the opening 50.

According to this, the gate electrode 540 is constituted by the first gate electrode portion 541 that is formed on a source electrode 42 side, and the second gate electrode portion 542 that is formed on a drain electrode 43 side. According to the above-described processes, the semiconductor device in this embodiment may be manufactured.

It is noted that contents other than the above-described contents are the same as that of the seventh embodiment.

Thirteenth Embodiment

Figure 48:
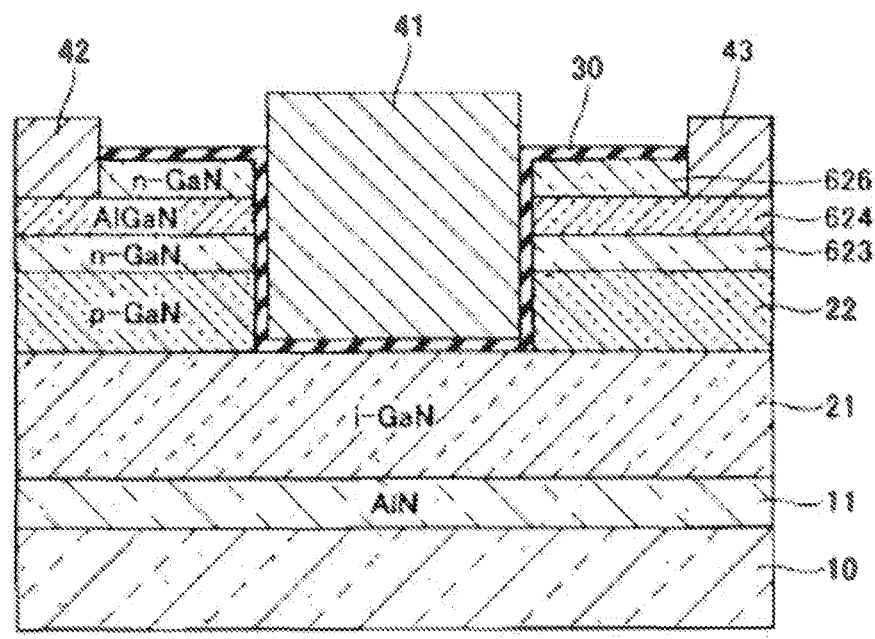
FIG. 48 is a structural diagram of another semiconductor device in the fourth embodiment.

FIG. 48 illustrates a structure of a semiconductor device which is a kind of the semiconductor device in the fourth embodiment and is similar to the semiconductor device described in the fourth embodiment. In the semiconductor device, as nitride semiconductor layers, an AlN layer 11, an i-GaN layer 21, a p-GaN layer 22, an n-GaN layer 623, an AlGaN layer 624, and an n-GaN layer 626 are formed on a substrate 10 that is formed from a semiconductor material and the like.

A source electrode 42 and a drain electrode 43 are formed on the AlGaN layer 624, and in a region in which a gate electrode 41 is formed, the n-GaN layer 626, the AlGaN layer 624, the n-GaN layer 623, and the p-GaN layer 22 are removed. However, in the region in which the gate electrode 41 is formed, the i-GaN layer 21 may be partially removed.

In addition, an insulating layer 30 is formed on a front surface and a side surface of the n-GaN layer 626, a side surface of the AlGaN layer 624, a side surface of the n-GaN layer 623, a side surface of the p-GaN layer 22, and a front surface and the like of the i-GaN layer 21. In addition, the gate electrode 41 is formed on the insulating layer 30 in a region from which the n-GaN layer 626, the AlGaN layer 624, the n-GaN layer 623, the p-GaN layer 22, and the like are removed. Accordingly, a side surface on a source electrode 42 side and a side surface on a drain electrode 43 side of the gate electrode 41 are formed to come into contact with the insulating layer 30 so as to become side surfaces of the p-GaN layer 22, the n-GaN layer 623, the AlGaN layer 624, and the n-GaN layer 626 in combination with each other through the insulating layer 30.

Figure 49:
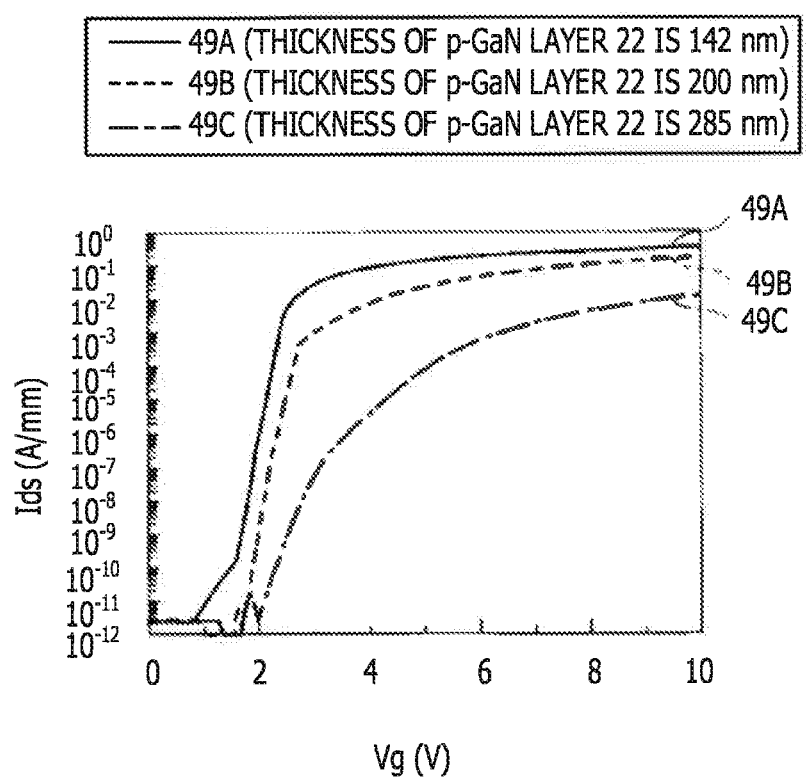
FIG. 49 is an explanatory diagram of an Ids-Vg characteristic in a case of changing the thickness of a p-GaN layer.

With regard to the semiconductor device having the structure, semiconductor devices in which the thickness of the p-GaN layer 22 is different in each case is prepared, and examination results with respect to a relation between a gate voltage Vg and a drain current Ids are illustrated in FIG. 49. In FIG. 49, 49A represents characteristics of a semiconductor device in which the thickness of the p-GaN layer 22 is 142 nm, and 49B represents characteristics of a semiconductor device in which the thickness of the p-GaN layer 22 is 200 nm, and 49C represents characteristics of a semiconductor device in which the thickness of the p-GaN layer 22 is 285 nm. However, the p-GaN layer 22 is doped with Mg as an impurity element at a concentration of the $2 \times 10^{17}$ cm$^{-3}$. As illustrated in FIG. 49, in the order of characteristics 49A, 49B, and 49C, a gate threshold voltage becomes high, and an on-current becomes low. That is, as the thickness of the p-GaN layer 22 increases, the gate threshold voltage becomes high, and the on-current becomes low.

In the semiconductor device, it is preferable that the gate threshold voltage be high and the on-current be high. This is also true of the semiconductor devices in the first embodiment to the sixth embodiment.

Semiconductor Device

Figure 50:
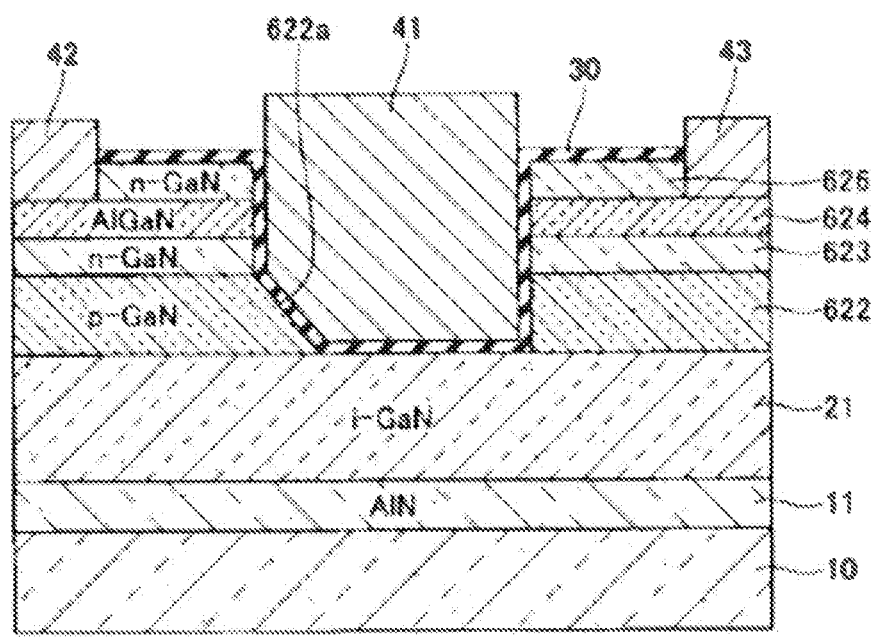
FIG. 50 is a structural diagram of a semiconductor device in a thirteenth embodiment.

Next, a semiconductor device in a thirteenth embodiment will be described with reference to FIG. 50. In the semiconductor device in this embodiment, as nitride semiconductor layers, an AlN layer 11, an i-GaN layer 21, a p-GaN layer 622, an n-GaN layer 623, an AlGaN layer 624, and an n-GaN layer 626 are formed on a substrate 10 that is formed from a semiconductor material and the like. In this embodiment, the i-GaN layer 21, the p-GaN layer 622, the n-GaN layer 623, the AlGaN layer 624, and the n-GaN layer 626 may be described as a first semiconductor layer, a second semiconductor layer, a third semiconductor layer, a fourth semiconductor layer, and a sixth semiconductor layer, respectively.

A source electrode 42 and a drain electrode 43 are formed on the AlGaN layer 624, and in a region in which the gate electrode 41 is formed, the n-GaN layer 626, the AlGaN layer 624, the n-GaN layer 623, and the p-GaN layer 622 are removed.

In this embodiment, with regard to the region that is removed as described above, a side surface on a source electrode 42 side of the p-GaN layer 622 is inclined. That is, with regard to the region that is removed as described above, on a drain electrode 43 side of the p-GaN layer 622, a side surface of the p-GaN layer 622 is formed to be perpendicular to a film surface of the p-GaN layer 622. In contrast, on a source electrode 42 side, the side surface of the p-GaN layer 622 is formed as an inclined surface 622*a* having an inclination of 60° or less with respect to a front surface of the i-GaN layer 21.

According to this, with regard to a length in a depth direction of the p-GaN layer 622 that is affected by the gate electrode 41 through an insulating layer 30, a length on a source electrode 42 side may be further increased in comparison to a length on a drain electrode 43 side. Accordingly, the gate threshold voltage may be increased, and thus the on-current may be increased. That is, on the source electrode 42 side, the side surface of the p-GaN layer 622 is formed as the inclined surface 622*a*, and thus the length in the depth direction of the p-GaN layer 622, which is affected by the gate electrode 41 through the insulating layer 30, becomes long. According to this, it is possible to obtain the same effect as a case where the film thickness of the p-GaN layer 622 is made to be large, and the gate threshold voltage may be increased. On the other hand, on the drain electrode 43 side, the side surface of the p-GaN layer 622 is vertically formed. Accordingly, the length in the depth direction of the p-GaN layer 622 that is affected by the gate electrode 41 through the insulating electrode 30 becomes short, and thus the on-current may be increased. In this embodiment, the second semiconductor layer may be constituted by p-AlGaN in addition to p-GaN.

Figure 51:
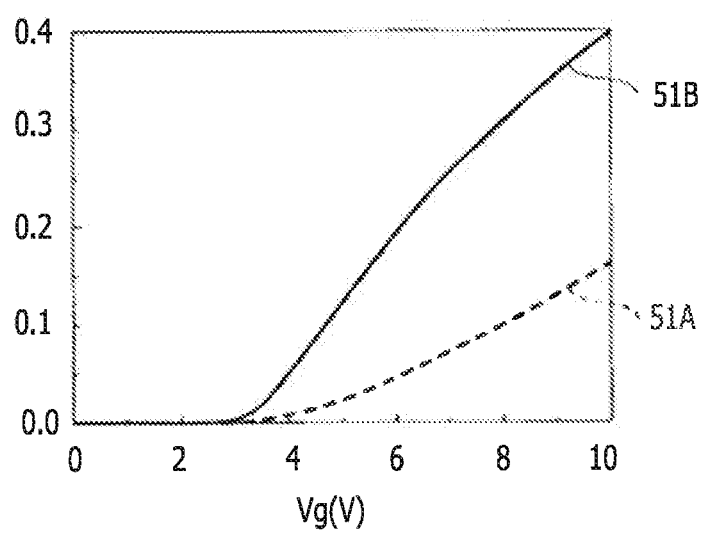
FIG. 51 is an explanatory diagram of an Ids-Vg characteristic in the semiconductor device in the thirteenth embodiment.

Next, description will be given of simulation results with respect to a relation between a gate voltage Vg and a drain current Ids in the semiconductor device in this embodiment. FIG. 51 illustrates the relation between the gate voltage Vg and the drain current Ids in the semiconductor device. 51A represents characteristics of the semiconductor device illustrated in FIG. 48 in a case where the thickness of the p-GaN layer 22 is 200 nm. In addition, 51B represents characteristics of the semiconductor device in this embodiment illustrated in FIG. 50B in a case where the thickness of the p-GaN layer 622 is 141 nm, and the inclination of the inclined surface 622*a* on a source electrode 42 side is approximately 45°. In this case, in the inclined surface 622*a* of the p-GaN layer 622, the length in the depth direction becomes 200 nm.

However, calculation is performed on the assumption that the thickness of the n-GaN layer 623 is set to 300 nm, the AlGaN layer 624 is set to $Al_{0.2}Ga_{0.8}N$ having a thickness of 20 nm, the thickness of the n-GaN layer 626 is set to 4 nm, a gate length is set to 1.5 μm, a distance between a gate and a drain is set to 10 μm, and a distance between a gate and a source is set to 5 μm. In addition, a concentration of acceptors in the p-GaN layer 22 and the p-GaN layer 622 is set to $2\times10^{17}$ cm$^{-3}$, a concentration of donors in the n-GaN layer 623 is set to $1\times10^{18}$ cm$^{-3}$, and a concentration of donors in the n-GaN layer 626 is set to $1.5\times10^{18}$ cm$^{-3}$.

As illustrated in FIG. 51, the gate threshold voltage is approximately the same as 51A and 51B, but the drain current Ids that becomes an on-current in 51B is as high as approximately 2.2 times that in 51A. Accordingly, in the semiconductor device in this embodiment illustrated in FIG. 50, the on-current may be further increased in comparison to the semiconductor device illustrated in FIG. 48. Accordingly, in the semiconductor device in this embodiment, the on-current may be increased without increasing the film thickness of the p-GaN layer 22. However, in the semiconductor device in this embodiment, a current flows due to 2DEG that is generated by AlGaN/GaN. Accordingly, in the description of this embodiment, description is given to a case where the n-GaN layer 623 is used, but the semiconductor device in this embodiment may use an i-GaN layer instead of the n-GaN layer 623.

Method of Manufacturing Semiconductor Device

Next, a method of manufacturing the semiconductor device in this embodiment will be described.

Figure 52A:
FIGS. 52A to 52C are process diagrams (Part 1) of a method of manufacturing the semiconductor device in the thirteenth embodiment.

First, as illustrated in FIG. 52A, a semiconductor substrate formed from silicon and the like is prepared as the substrate 10.

Figure 52B:
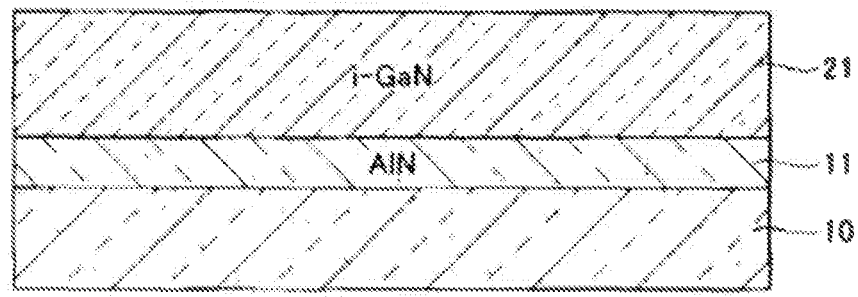

Next, as illustrated in FIG. 52B, the AlN layer 11 that is a buffer layer, and the i-GaN layer 21 that is the first semiconductor layer are formed on the substrate 10 by epitaxial growth. In this embodiment, the thickness of the i-GaN layer 21 that is formed is 3 μm, and the AlN layer 11 and the i-GaN layer 21 are formed by epitaxial growth by metal-organic vapor phase epitaxy (MOVPE).

Figure 52C:
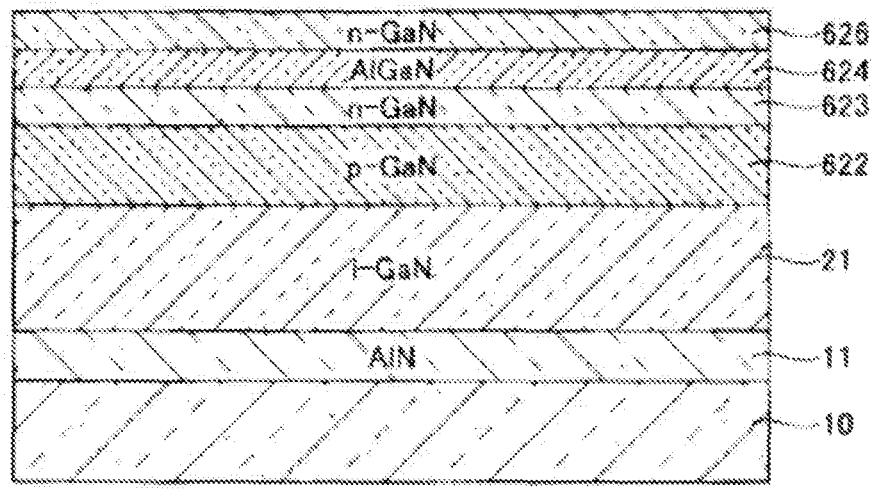

Next, as illustrated in FIG. 52C, the p-GaN layer 622 that is the second semiconductor layer, the n-GaN layer 623 that is the third semiconductor layer, the AlGaN layer 624 that is the fourth semiconductor layer, and the n-GaN layer 626 that is the sixth semiconductor layer are formed on the i-GaN layer 21. In this embodiment, the p-GaN layer 622, the n-GaN layer 623, the AlGaN layer 624, and the n-GaN layer 626 are formed by epitaxial growth by metal-organic vapor phase epitaxy (MOVPE).

In this embodiment, the p-GaN layer 622 has a thickness of 500 nm and is doped with Mg as a p-type impurity element at a concentration of $2\times10^{17}$ cm$^{-3}$. The n-GaN layer 623 has a thickness of 300 nm and is doped with Si as an n-type impurity element at a concentration of $1\times10^{18}$ cm$^{-3}$. The AlGaN layer 624 has a thickness of 20 nm. The n-GaN layer 626 has a thickness of 4 nm and is doped with Si as an n-type impurity element at a concentration of $1.5\times10^{18}$ cm$^{-3}$.

Then, although not shown, an element isolation region may be formed. Specifically, a photoresist is applied onto the n-GaN layer 626, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 53A:
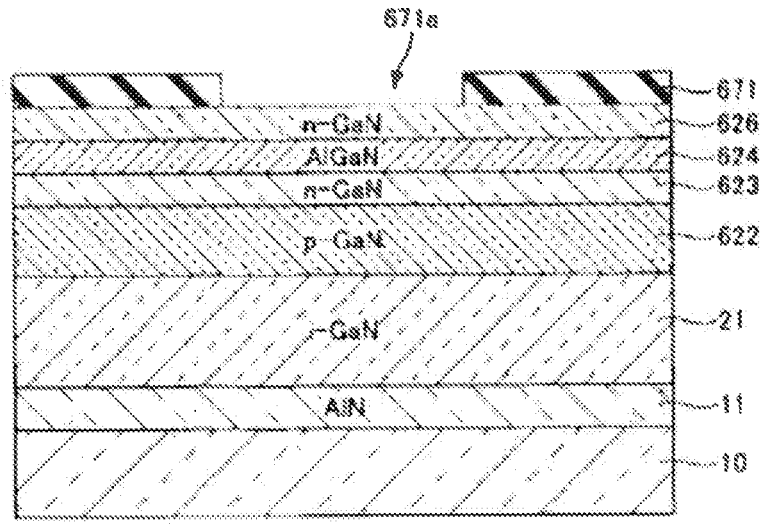
FIGS. 53A to 53C are process diagrams (Part 2) of the method of manufacturing the semiconductor device in the thirteenth embodiment.

Next, as illustrated in FIG. 53A, a hard mask 671, which has an opening 671*a* and is formed from SiN and the like, is formed on the n-GaN layer 626. However, a shape of the opening 671*a* in the hard mask 671 corresponds to a shape of the following first opening 651 that becomes a region in which the gate electrode 41 is formed. Specifically, a SiN film is formed on the n-GaN layer 626 by ALD and the like. Then, a photoresist is applied onto the SiN film that is formed, and exposure by an exposure apparatus and development are performed to form a resist pattern (not shown) having an opening in a region in which the first opening 651 is formed. Then, the SiN film is removed by dry etching or wet etching from a region in which the resist pattern is not formed to form the hard mask 671 by the SiN film that remains. Then, the resist pattern (not shown) is removed by an organic solvent and the like.

Figure 53B:
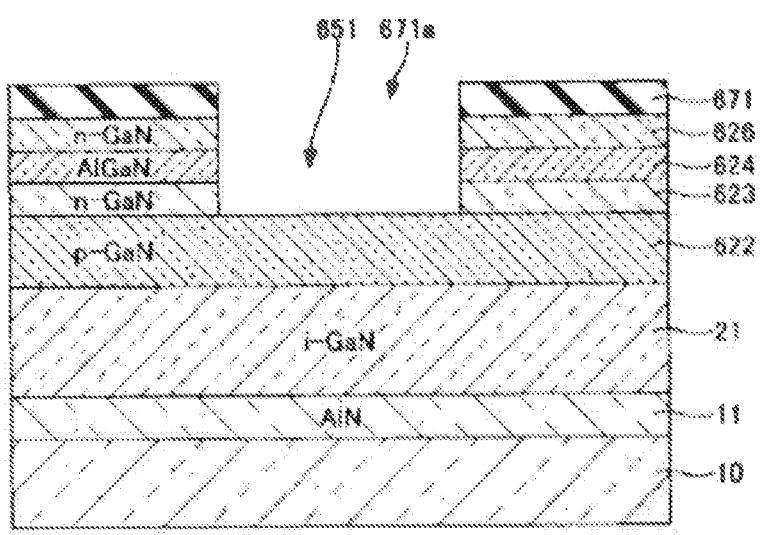

Next, as illustrated in FIG. 53B, the n-GaN layer 626, the AlGaN layer 624, and the n-GaN layer 623 which correspond to the opening 671*a* of the hard mask 671 are removed to expose to a front surface of the p-GaN layer 622, thereby forming the first opening 651. In this embodiment, removal of the n-GaN layer 626, the AlGaN layer 624, and the n-GaN layer 623 is performed by dry etching such as RIE using a chlorine-based gas. According to this, a side surface of the n-GaN layer 623 that forms a side surface of the first opening 651 becomes an a-plane (11-20), and the first opening 651 is formed to follow an m-axis <1-100> direction.

Figure 53C:
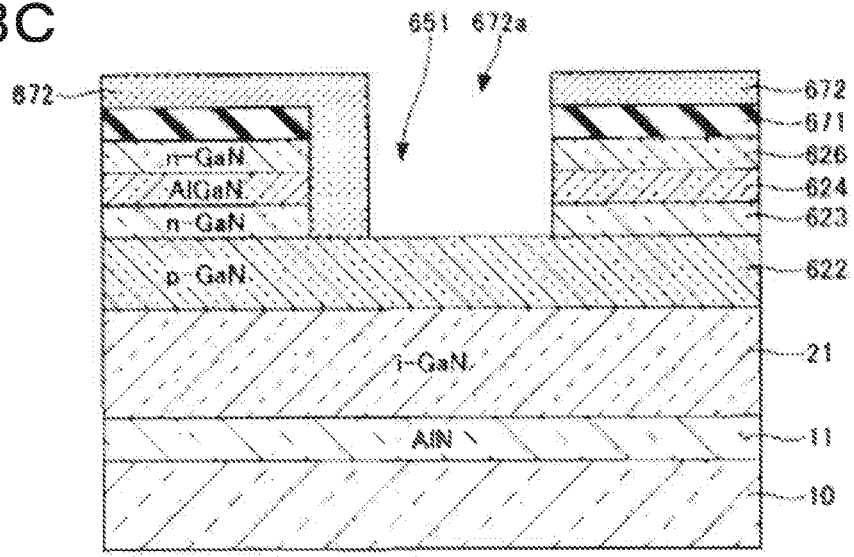

Next, as illustrated in FIG. 53C, a resist pattern 672, which is configured to form a second opening 652 in a bottom surface of the first opening 651, is formed. Specifically, a photoresist is applied onto the hard mask 671 and the p-GaN layer 622 that corresponds to the bottom surface of the first opening 651, and exposure by an exposure apparatus and development are performed to form the resist pattern 672. The resist pattern 672 that is formed has an opening 672a with a shape corresponding to a shape of the second opening 652, which will be described later. Accordingly, the opening 672a is formed inside the opening 671a of the hard mask 671, and is formed in such a manner that a source electrode 42 side on the p-GaN layer 622, which becomes the bottom surface of the first opening 651, is covered. Accordingly, the opening 672a of the resist pattern 672 is smaller than the opening 671a of the hard mask 671.

Figure 54A:
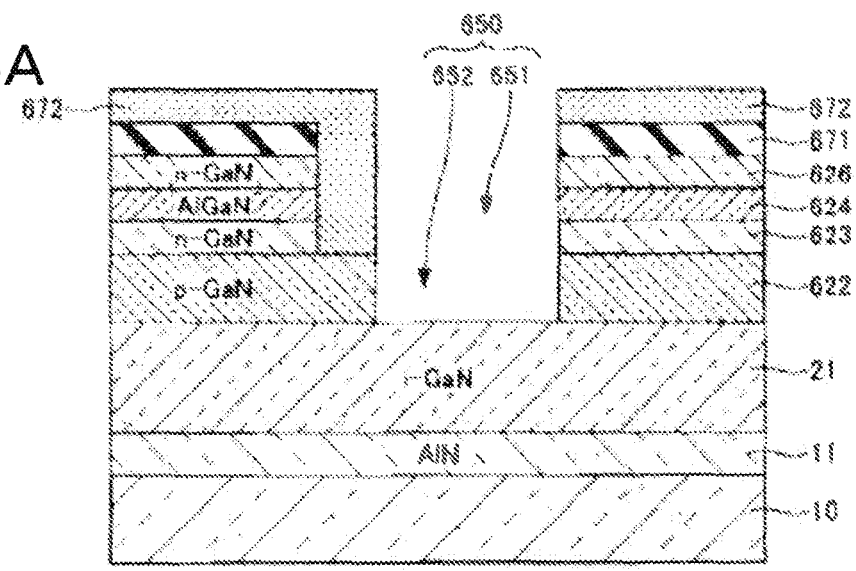
FIGS. 54A to 54C are process diagrams (Part 3) of the method of manufacturing the semiconductor device in the thirteenth embodiment.

Next, as illustrated in FIG. 54A, the p-GaN layer 622 in the opening 672a of the resist pattern 672 is removed to expose to a front surface of the i-GaN layer 21, thereby forming the second opening 652. In this embodiment, removal of the p-GaN layer 622 is performed by dry etching such as RIE using a chlorine-based gas. According to this, a side surface of the p-GaN layer 622 that forms a side surface of the second opening 652 becomes an a-plane (11-20), a front surface of the i-GaN layer 21 which forms a bottom surface of the second opening 652 becomes a c-plane, and the second opening 652 is formed to follow an m-axis <1-100> direction. Then, the resist pattern 672 is removed by an organic solvent and the like.

Figure 54B:
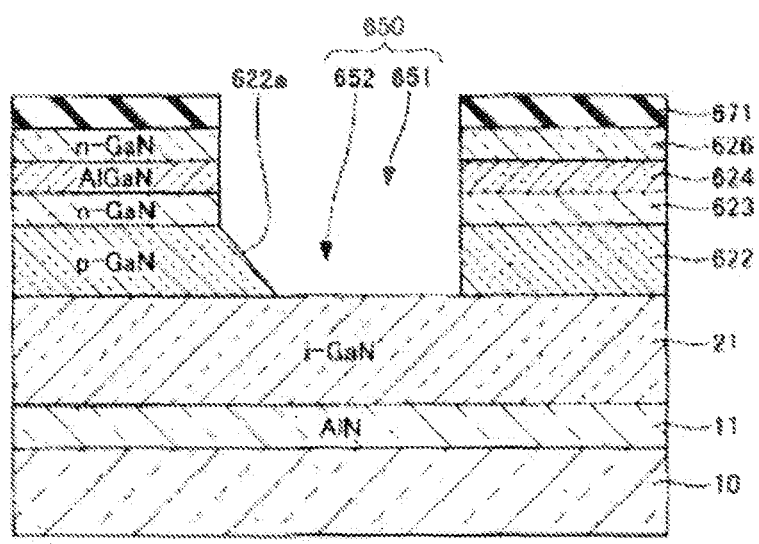

Next, as illustrated in FIG. 54B, wet etching is performed by using the hard mask 671 as a mask to remove the p-GaN layer 622 on a source electrode 42 side in the second opening 652 from a corner side, thereby forming the inclined surface 622a on a side surface of the p-GaN layer 622. The wet etching that is performed at this time is performed by using tetramethylammonium hydroxide (TMAH) or KOH. According to this, the inclined surface 622a is formed on the side surface of the p-GaN layer 622 on a source electrode 42 side in the second opening 652. According to this, an opening 650, in which the gate electrode 41 is formed, is constituted by the second opening 652 in which the inclined surface 622a is formed on the side surface on a source electrode 42 side of the p-GaN layer 622, and the first opening 651.

Figure 54C:
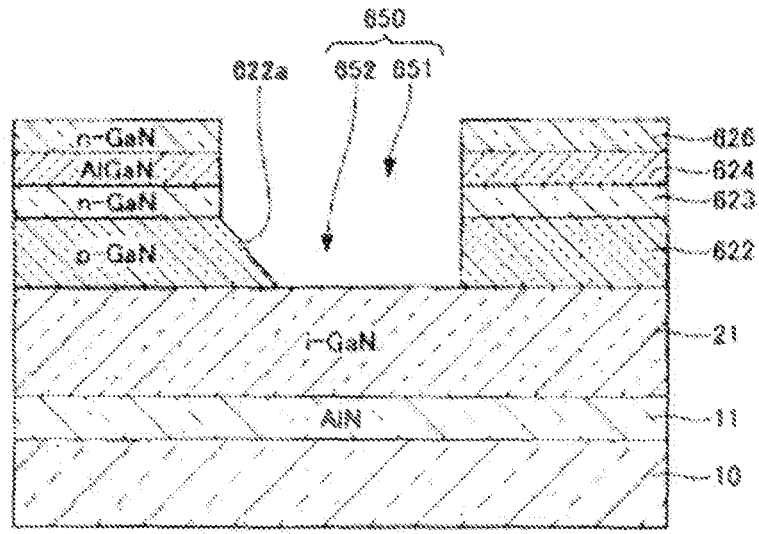

Next, as illustrated in FIG. 54C, the hard mask 671 is removed by wet etching and the like to expose to a front surface of the n-GaN layer 626.

Figure 55A:
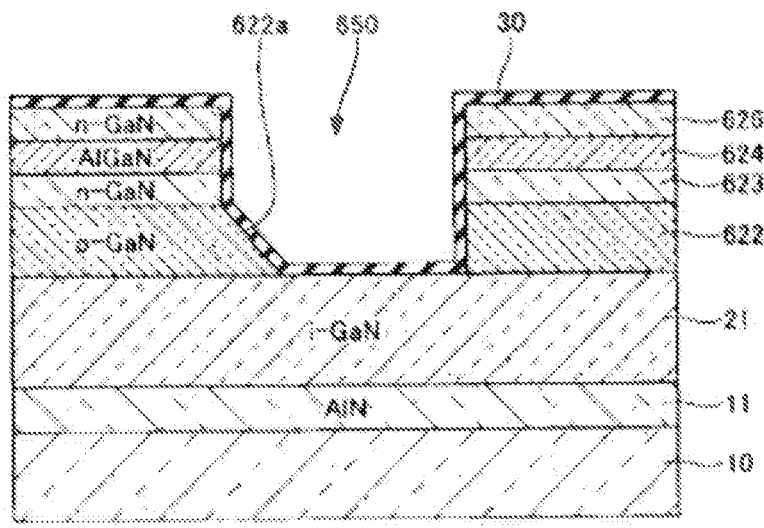
FIGS. 55A to 55C are process diagrams (Part 4) of the method of manufacturing the semiconductor device in the thirteenth embodiment.

Next, as illustrated in FIG. 55A, the insulating layer 30 is formed on a bottom surface and a side surface of the opening 650 and on the n-GaN layer 626. The insulating layer 30 is formed from Al$_2$O$_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 650, on side surfaces of the p-GaN layer 622, the n-GaN layer 623, the AlGaN layer 624, and the n-GaN layer 626 which become a side surface of the opening 650, and on the n-GaN layer 626.

Figure 55B:
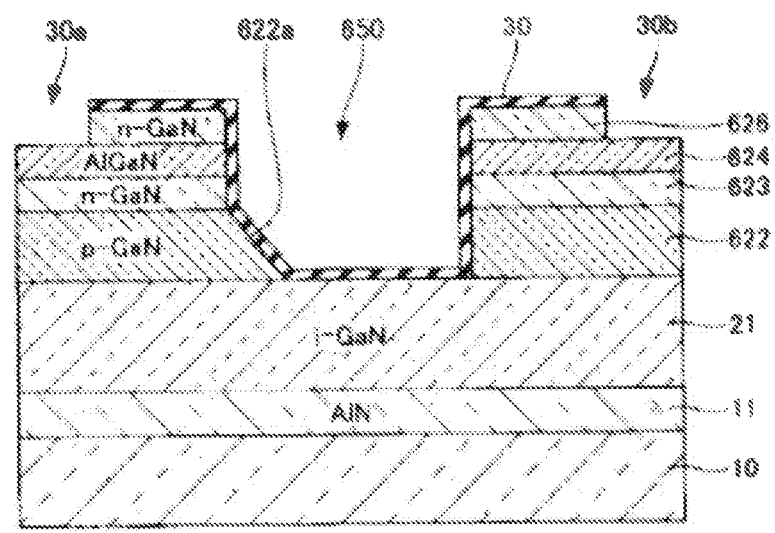

Next, as illustrated in FIG. 55B, the insulating layer 30 and the n-GaN layer 626 in regions in which the source electrode 42 and the drain electrode 43 are formed are removed to expose the AlGaN layer 624, thereby forming the openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 and the n-GaN layer 626 in a region in which the resist pattern is not formed are removed by dry etching using a fluorine-based gas or a chlorine-based gas or wet etching to expose to a front surface of the AlGaN layer 624. According to this, the openings 30a and 30b are formed. Then, the resist pattern (not shown) is removed by an organic solvent and the like.

Figure 55C:
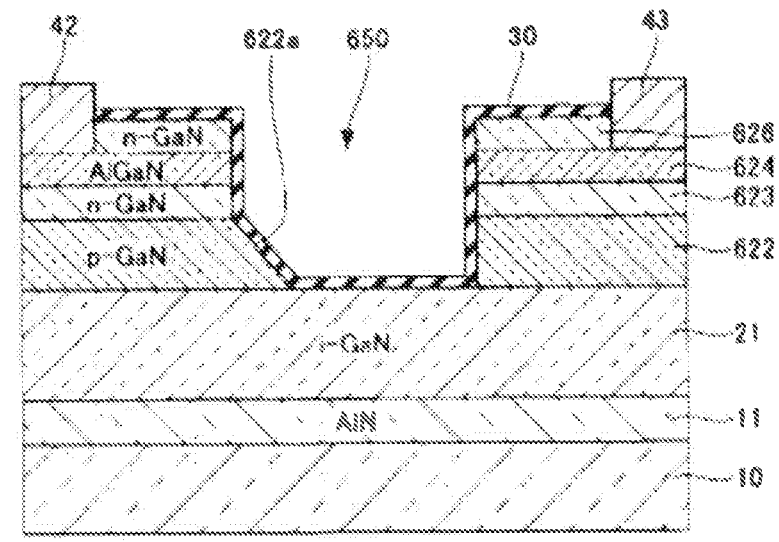

Next, as illustrated in FIG. 55C, the source electrode 42 and the drain electrode 43 are formed in the openings 30a and 30b of the insulating layer 30 through which the AlGaN layer 624 is exposed. Specifically, a photoresist is applied onto the n-GaN layer 626 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 56:
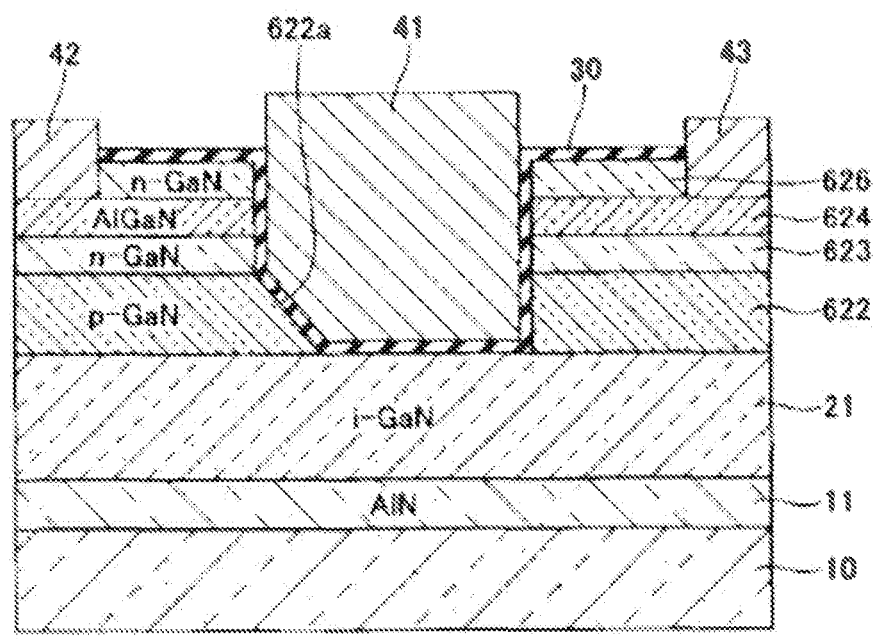
FIG. 56 is a process diagram (Part 5) of the method of manufacturing the semiconductor device in the thirteenth embodiment.

Next, as illustrated in FIG. 56, the gate electrode 41 is formed on the insulating layer 30 in a region in which the opening 650 is formed. Specifically, a photoresist is applied onto the insulating layer 30, and exposure by an exposure apparatus and development are performed to form a resist pattern (not shown) having the opening 650 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 650.

According to the above-described processes, the semiconductor device in this embodiment may be manufactured.

It is noted that contents other than the above-described contents are the same as that of the first embodiment.

Fourteenth Embodiment

Semiconductor Device

Figure 57:
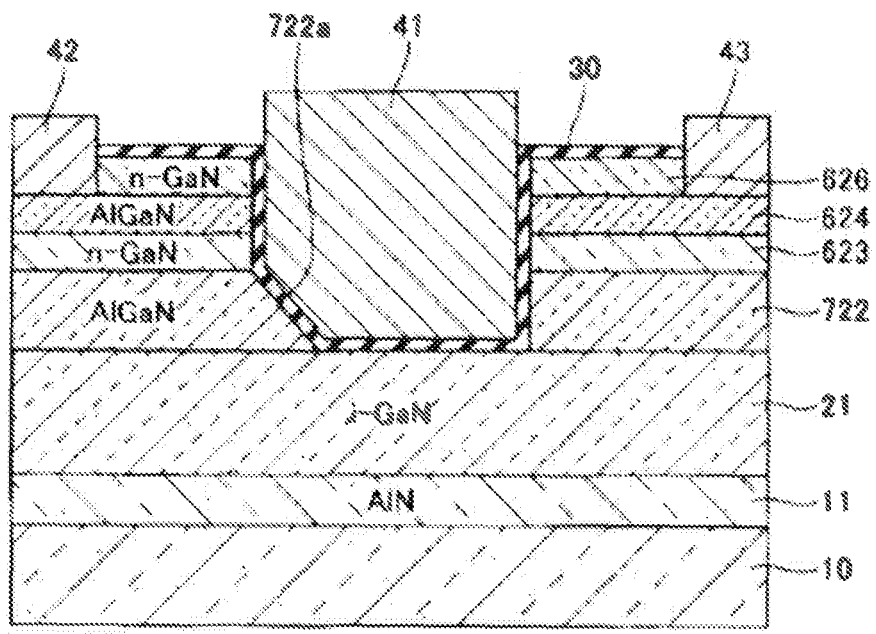
FIG. 57 is a structural diagram of a semiconductor device in a fourteenth embodiment.

Next, a semiconductor device in a fourteenth embodiment will be described with reference to FIG. 57. In the semiconductor device in this embodiment, as nitride semiconductor layers, an AlN layer 11, an i-GaN layer 21, an AlGaN layer 722, an n-GaN layer 623, an AlGaN layer 624, and an n-GaN layer 626 are formed on a substrate 10 that is formed from a semiconductor material and the like. In this embodiment, the i-GaN layer 21, the AlGaN layer 722, the n-GaN layer 623, the AlGaN layer 624, and the n-GaN layer 626 may be described as a first semiconductor layer, a second semiconductor layer, a third semiconductor layer, a fourth semiconductor layer, and a sixth semiconductor layer, respectively.

A source electrode 42 and a drain electrode 43 are formed on the AlGaN layer 624, and in a region in which a gate electrode 41 is formed, the n-GaN layer 626, the AlGaN layer 624, the n-GaN layer 623, and the AlGaN layer 722 are removed.

In this embodiment, with regard to the region that is removed as described above, a side surface on a source electrode 42 side of the AlGaN layer 722 is inclined. That is, with regard to the region that is removed as described above, on a drain electrode 43 side of the AlGaN layer 722, a side surface of the AlGaN layer 722 is formed to be perpendicular to a film surface of the AlGaN layer 722. In contrast, on a source electrode 42 side, the side surface of the AlGaN layer 722 is formed as an inclined surface 722a having an inclination of 60° or less with respect to a front surface of the i-GaN layer 21.

According to this, with regard to a length in a depth direction of the AlGaN layer 722 that is affected by the gate electrode 41 through an insulating layer 30, a length on a source electrode 42 side may be further increased in comparison to a length on a drain electrode 43 side. Accordingly, the gate threshold voltage may be increased, and thus the on-current may be increased. That is, on the source electrode 42 side, the side surface of the AlGaN layer 722 is formed as the inclined surface 722a, and thus the length in the depth direction of the AlGaN layer 722, which is affected by the gate electrode 41 through the insulating layer 30, becomes long. According to this, it is possible to obtain the same effect as in a case where the film thickness of the AlGaN layer 722 is increased, and the gate threshold voltage may be increased. On the other hand, on the drain electrode 43 side, the side surface of the AlGaN layer 722 is vertically formed. Accordingly, the length in the depth direction of the AlGaN layer 722 that is affected by the gate electrode 41 through the insulating layer 30 becomes short, and thus the on-current may be increased.

In this embodiment, the second semiconductor layer may be constituted by InAlN, and a GaN/AlGaN laminated film in addition to AlGaN. In addition, in the semiconductor device in this embodiment, a current flows due to 2DEG that is generated by AlGaN/GaN. Accordingly, in the description of this embodiment, description is given to a case where the n-GaN layer 623 is used, but the semiconductor device in this embodiment may use an i-GaN layer instead of the n-GaN layer 623.

Method of Manufacturing Semiconductor Device

Next, a method of manufacturing the semiconductor device in this embodiment will be described.

Figure 58A:
FIGS. 58A to 58C are process diagrams (Part 1) of a method of manufacturing the semiconductor device in the fourteenth embodiment.

First, as illustrated in FIG. 58A, a semiconductor substrate formed from silicon and the like is prepared as the substrate 10.

Figure 58B:
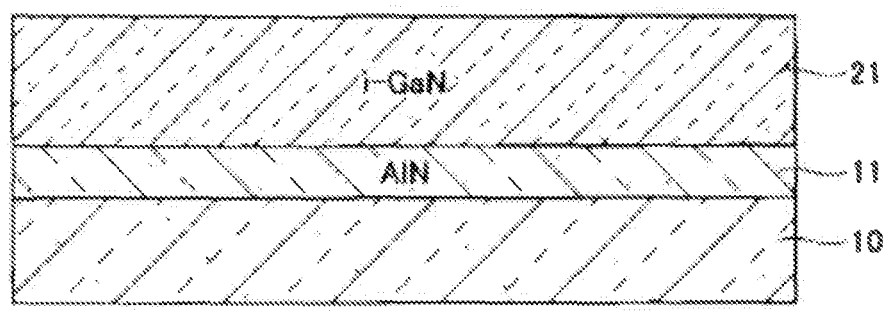

Next, as illustrated in FIG. 58B, the AlN layer 11 that is a buffer layer, and the i-GaN layer 21 that is the first semiconductor layer are formed on the substrate 10 by epitaxial growth. In this embodiment, the thickness of the i-GaN layer 21 that is formed is 3 μm, and the AlN layer 11 and the i-GaN layer 21 are formed by epitaxial growth by metal-organic vapor phase epitaxy (MOVPE).

Figure 58C:
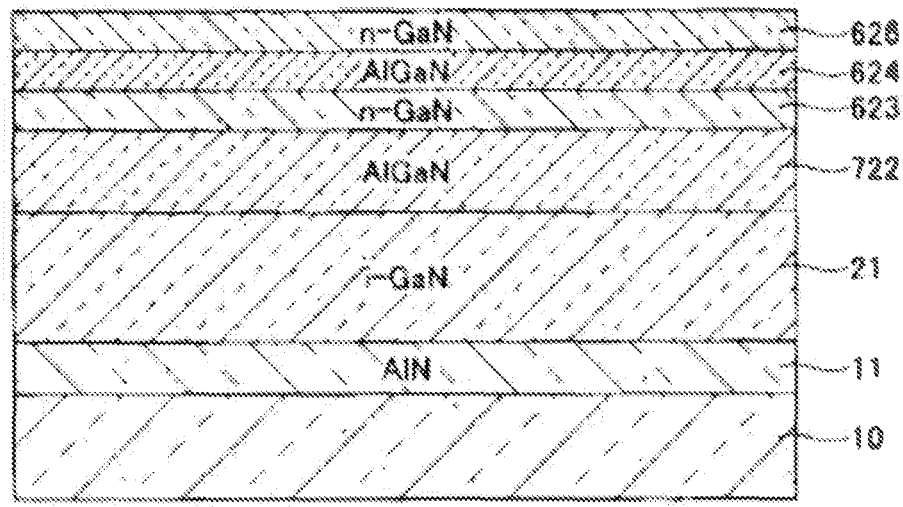

Next, as illustrated in FIG. 58C, the AlGaN layer 722 that is the second semiconductor layer, the n-GaN layer 623 that is the third semiconductor layer, the AlGaN layer 624 that is the fourth semiconductor layer, and the n-GaN layer 626 that is the sixth semiconductor layer are formed on the i-GaN layer 21. In this embodiment, the AlGaN layer 722, the n-GaN layer 623, the AlGaN layer 624, and the n-GaN layer 626 are formed by epitaxial growth by metal-organic vapor phase epitaxy (MOVPE).

In this embodiment, the AlGaN layer 722 has a thickness of 500 nm and is doped with Mg as a p-type impurity element at a concentration of $2 \times 10^{17}$ cm$^{-3}$. The n-GaN layer 623 has a thickness of 300 nm and is doped with Si as an n-type impurity element at a concentration of $1 \times 10^{18}$ cm$^{-3}$. The AlGaN layer 624 has a thickness of 20 nm. The n-GaN layer 626 has a thickness of 4 nm and is doped with Si as an n-type impurity element at a concentration of $1.5 \times 10^{18}$ cm$^{-3}$.

Then, although not shown, an element isolation region may be formed. Specifically, a photoresist is applied onto the n-GaN layer 626, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 59A:
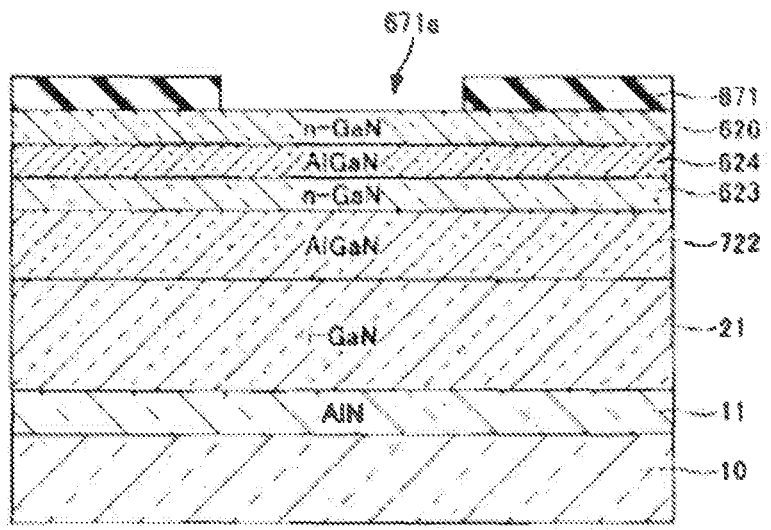
FIGS. 59A to 59C are process diagrams (Part 2) of the method of manufacturing the semiconductor device in the fourteenth embodiment.

Next, as illustrated in FIG. 59A, a hard mask 671, which has an opening 671a and is formed from SiN and the like, is formed on the n-GaN layer 626. However, a shape of the opening 671a in the hard mask 671 corresponds to a shape of the following first opening 651 that becomes a region in which the gate electrode 41 is formed. Specifically, a SiN film is formed on the n-GaN layer 626 by ALD and the like. Then, a photoresist is applied onto the SiN film that is formed, and exposure by an exposure apparatus and development are performed to form a resist pattern (not shown) having an opening in a region in which the first opening 651 is formed. Then, the SiN film is removed by dry etching or wet etching from a region in which the resist pattern is not formed to form the hard mask 671 by the SiN film that remains. Then, the resist pattern (not shown) is removed by an organic solvent and the like.

Figure 59B:
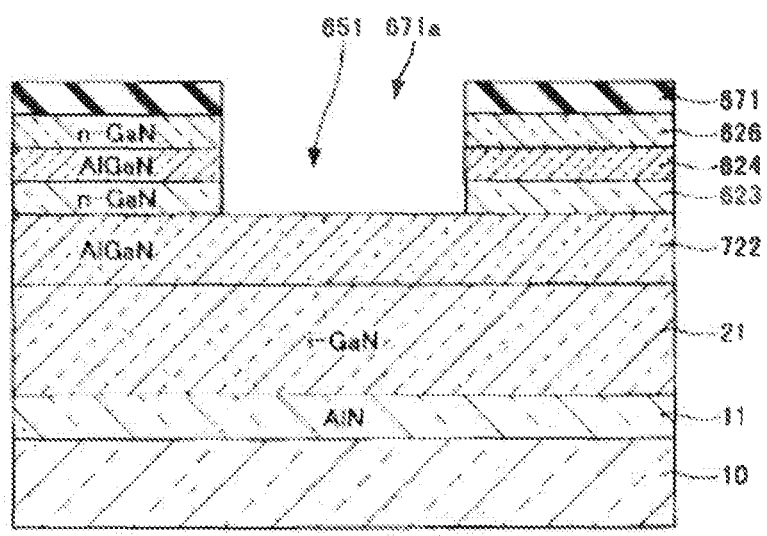

Next, as illustrated in FIG. 59B, the n-GaN layer 626, the AlGaN layer 624, and the n-GaN layer 623 which correspond to the opening 671a of the hard mask 671 are removed to expose to a front surface of the AlGaN layer 722, thereby forming the first opening 651. In this embodiment, removal of the n-GaN layer 626, the AlGaN layer 624, and the n-GaN layer 623 is performed by dry etching such as RIE using a chlorine-based gas. According to this, a side surface of the n-GaN layer 623 that forms a side surface of the first opening 651 becomes an a-plane (11-20), and the first opening 651 is formed to follow an m-axis <1-100> direction.

Figure 59C:
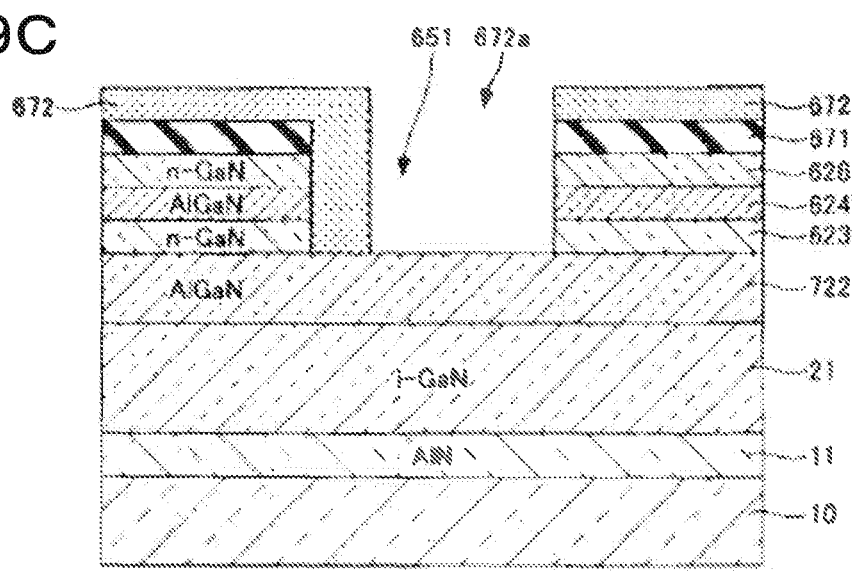

Next, as illustrated in FIG. 59C, a resist pattern 672, which is configured to form a second opening 652 in a bottom surface of the first opening 651, is formed. Specifically, a photoresist is applied onto the hard mask 671 and the AlGaN layer 722 that corresponds to the bottom surface of the first opening 651, and exposure by an exposure apparatus and development are performed to form the resist pattern 672. The resist pattern 672 that is formed has an opening 672a with a shape corresponding to a shape of the second opening 652, which will be described later. Accordingly, the opening 672a is formed inside the opening 671a of the hard mask 671, and is formed in such a manner that a source electrode 42 side on the AlGaN layer 722, which becomes the bottom surface of the first opening 651, is covered. Accordingly, the opening 672a of the resist pattern 672 is smaller than the opening 671a of the hard mask 671.

Figure 60A:
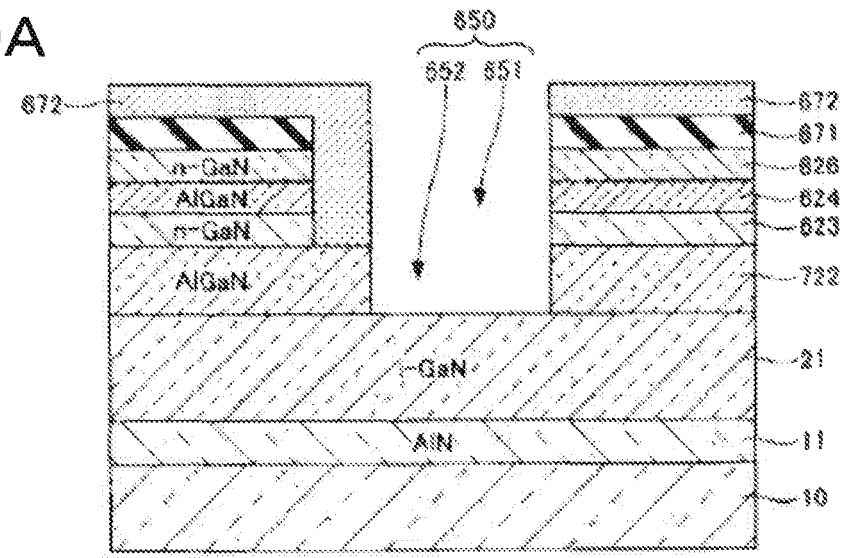
FIGS. 60A to 60C are process diagrams (Part 3) of the method of manufacturing the semiconductor device in the fourteenth embodiment.

Next, as illustrated in FIG. 60A, the AlGaN layer 722 in the opening 672a of the resist pattern 672 is removed to expose to a front surface of the i-GaN layer 21, thereby forming the second opening 652. In this embodiment, removal of the AlGaN layer 722 is performed by dry etching such as RIE using a chlorine-based gas. According to this, a side surface of the AlGaN layer 722 that forms a side surface of the second opening 652 becomes an a-plane (11-20), a front surface of the i-GaN layer 21 that forms a bottom surface of the second opening 652 becomes a c-plane, and the second opening 652 is formed to follow an m-axis <1-100> direction. Then, the resist pattern 672 is removed by an organic solvent and the like.

Figure 60B:
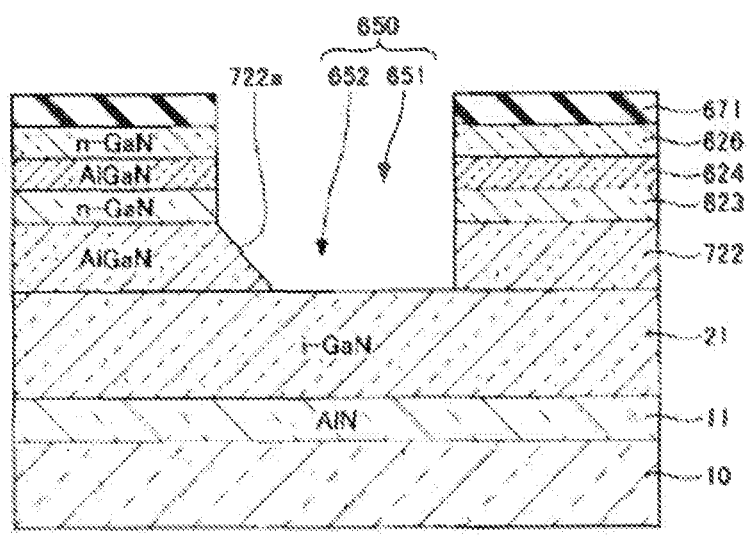

Next, as illustrated in FIG. 60B, wet etching is performed by using the hard mask 671 as a mask to remove the AlGaN layer 722 on a source electrode 42 side in the second opening 652 from a corner side, thereby forming the inclined surface 722a on a side surface of the AlGaN layer 722. The wet etching that is performed at this time is performed by using tetramethylammonium hydroxide (TMAH) or KOH. According to this, the inclined surface 722a is formed on the side surface of the AlGaN layer 722 on a source electrode 42 side in the second opening 652. According to this, an opening 650, in which the gate electrode 41 is formed, is constituted by the second opening 652 in which the inclined surface 722a is formed on the side surface on a source electrode 42 side of the AlGaN layer 722, and the first opening 651.

Figure 60C:
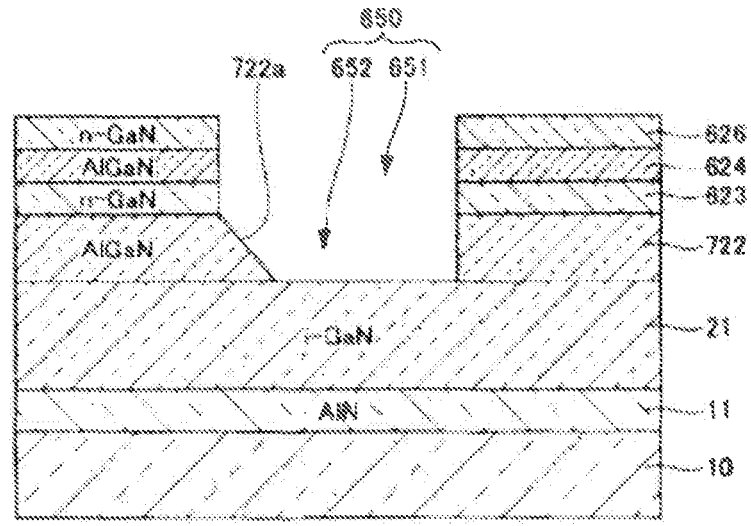

Next, as illustrated in FIG. 60C, the hard mask 671 is removed by wet etching and the like to expose to a front surface of the n-GaN layer 626.

Figure 61A:
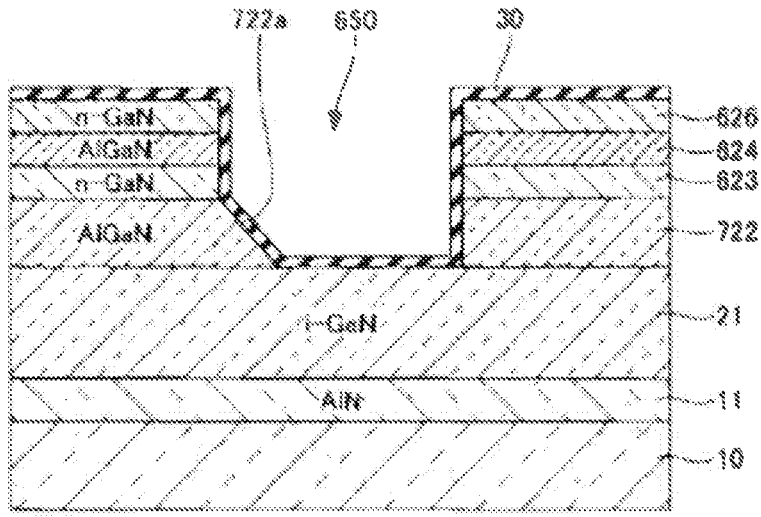
FIGS. 61A to 61C are process diagrams (Part 4) of the method of manufacturing the semiconductor device in the fourteenth embodiment.

Next, as illustrated in FIG. 61A, the insulating layer 30 is formed on a bottom surface and a side surface of the opening 650 and on the n-GaN layer 626. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 650, on side surfaces of the AlGaN layer 722, the n-GaN layer 623, the AlGaN layer 624, and the n-GaN layer 626 which become a side surface of the opening 650, and on the n-GaN layer 626.

Figure 61B:
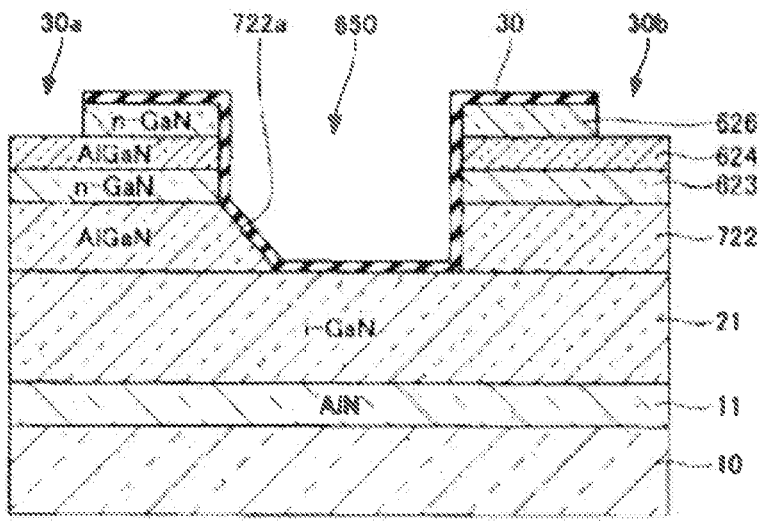

Next, as illustrated in FIG. 61B, the insulating layer 30 and the n-GaN layer 626 in regions in which the source electrode 42 and the drain electrode 43 are formed are removed to expose the AlGaN layer 624, thereby forming the openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 and the n-GaN layer 626 in a region in which the resist pattern is not formed are removed by dry etching using a fluorine-based gas or a chlorine-based gas or wet etching to expose to a front surface of the AlGaN layer 624. According to this, the openings 30a and 30b are formed. Then, the resist pattern (not shown) is removed by an organic solvent and the like.

Figure 61C:
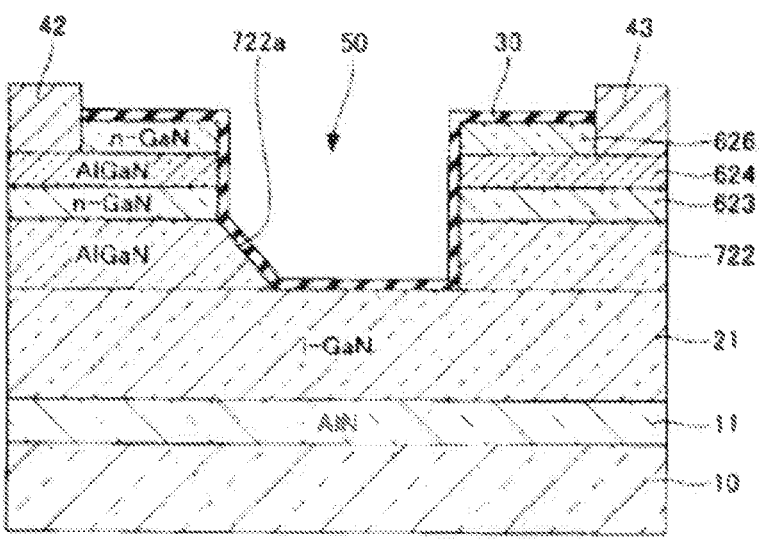

Next, as illustrated in FIG. 61C, the source electrode 42 and the drain electrode 43 are formed in the openings 30a and 30b of the insulating layer 30 through which the AlGaN layer 624 is exposed. Specifically, a photoresist is applied onto the n-GaN layer 626 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 62:
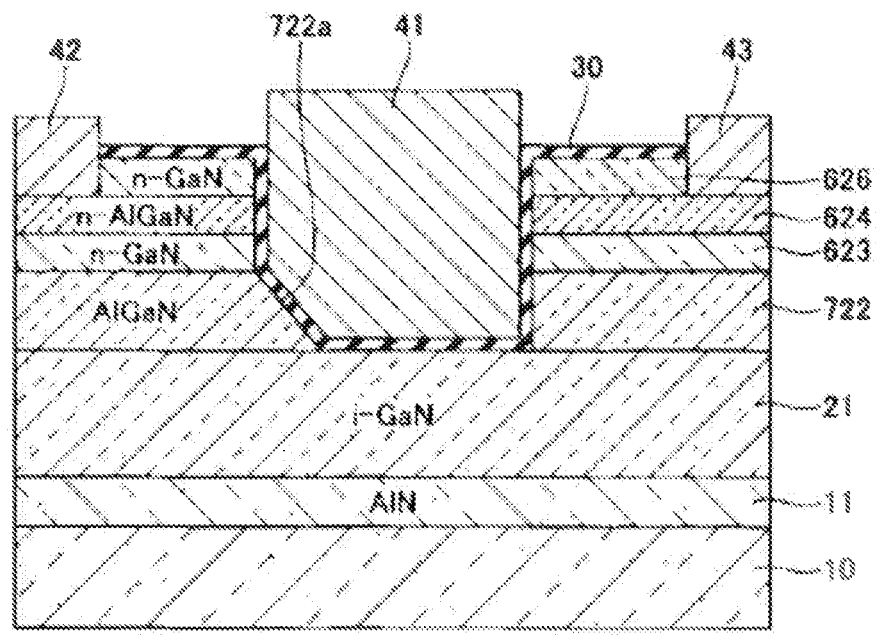
FIG. 62 is a process diagram (Part 5) of the method of manufacturing the semiconductor device in the fourteenth embodiment.

Next, as illustrated in FIG. 62, the gate electrode 41 is formed on the insulating layer 30 in a region in which the opening 650 is formed. Specifically, a photoresist is applied onto the insulating layer 30, and exposure by an exposure apparatus and development are performed to form a resist pattern (not shown) having the opening 650 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 650.

According to the above-described processes, the semiconductor device in this embodiment may be manufactured.

It is noted that contents other than the above-described contents are the same as that of the thirteenth embodiment.

Fifteenth Embodiment

Semiconductor Device

Figure 63:
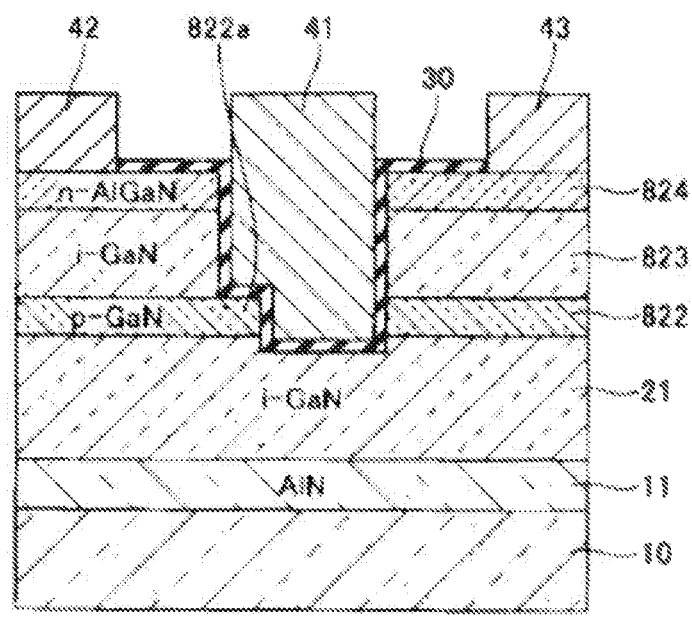
FIG. 63 is a structural diagram of a semiconductor device in a fifteenth embodiment.

Next, a semiconductor device in a fifteenth embodiment will be described with reference to FIG. 63. In the semiconductor device in this embodiment, as nitride semiconductor layers, an AlN layer 11, an i-GaN layer 21, a p-GaN layer 822, an i-GaN layer 823, and an n-AlGaN layer 824 are formed on a substrate 10 that is formed from a semiconductor material and the like. In this embodiment, the i-GaN layer 21, the p-GaN layer 822, the i-GaN layer 823, and the n-AlGaN layer 824 may be described as a first semiconductor layer, a second semiconductor layer, a third semiconductor layer, and a fourth semiconductor layer, respectively.

A source electrode 42 and a drain electrode 43 are formed on the n-AlGaN layer 824, and in a region in which a gate electrode 41 is formed, the n-AlGaN layer 824, the i-GaN layer 823, and the p-GaN layer 822 are removed. However, in the region in which the gate electrode 41 is formed, the i-GaN layer 21 may be partially removed.

In this embodiment, in a corner on a source electrode 42 side in the region that is removed as described above, an overhang portion 822a in which a part of an upper surface and a side surface of the p-GaN layer 822 are exposed is formed. According to this, with regard to a length of the p-GaN layer 822 that is affected by the gate electrode 41 through an insulating layer 30, a length on a source electrode 42 side may be further increased in comparison to a length on a drain electrode 43 side. Accordingly, the gate threshold voltage may be increased, and thus the on-current may be increased. In this embodiment, the overhang portion 822a is formed to have a length of approximately 0.1 μm on an upper surface side of the p-GaN layer 822 in a direction connecting the source electrode 42 and the drain electrode 43.

That is, in the overhang portion 822a of the p-GaN layer 822, a part of the upper surface and the side surface of the p-GaN layer 822 overhang on the source electrode 42 side, and thus a length of the p-GaN layer 822 that is affected by the gate electrode 41 through the insulating layer 30 increases. According to this, it is possible to obtain the same effect in a case where the film thickness of the p-GaN layer 822 is made to be large, and thus the gate threshold voltage may be increased. On the other hand, on a drain electrode 43 side, an overhang portion is not formed on a side surface of the p-GaN layer 822, and thus the length of the p-GaN layer 822 that is affected by the gate electrode 41 through the insulating layer 30 decreases, and thus the on-current may be increased.

Method of Manufacturing Semiconductor Device

Next, a method of manufacturing a semiconductor device in this embodiment will be described.

Figure 64A:
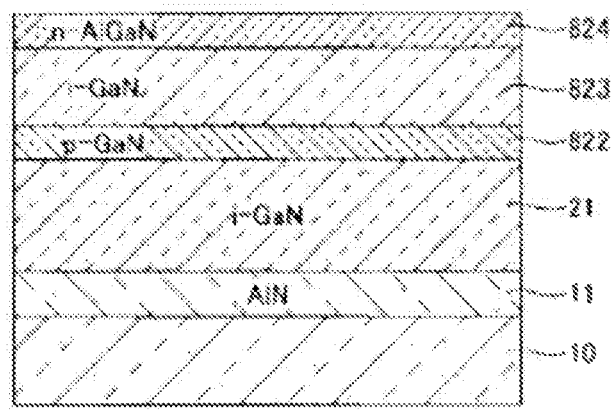
FIGS. 64A to 64C are process diagrams (Part 1) of a method of manufacturing the semiconductor device in the fifteenth embodiment.

First, as illustrated in FIG. 64A, the AlN layer 11, the i-GaN layer 21 that is a first semiconductor layer, the p-GaN layer 822 that is a second semiconductor layer, the i-GaN layer 823 that is a third semiconductor layer, and the n-AlGaN layer 824 that is a fourth semiconductor layer are formed on the substrate 10. In this embodiment, the AlN layer 11, the i-GaN layer 21, the p-GaN layer 822, the i-GaN layer 823, and the n-AlGaN layer 824 are formed from a nitride semiconductor, and are formed by epitaxial growth by metal-organic vapor phase epitaxy (MOVPE).

The substrate 10 is constituted by a silicon semiconductor substrate and the like, and the AlN layer 11 is a buffer layer. The i-GaN layer 21 has a thickness of 3 μm. The p-GaN layer 822 has a thickness of 100 nm and is doped with Mg as a p-type impurity element at a concentration of $1\times10^{19}$ cm$^{-3}$. The i-GaN layer 823 has a thickness of 500 nm. The n-AlGaN layer 824 has a thickness of 30 nm and is doped with Si as an n-type impurity element at a concentration of $5\times10^{18}$ cm$^{-3}$.

Then, although not shown, an element isolation region may be formed. Specifically, a photoresist is applied onto the n-AlGaN layer 824, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 64B:
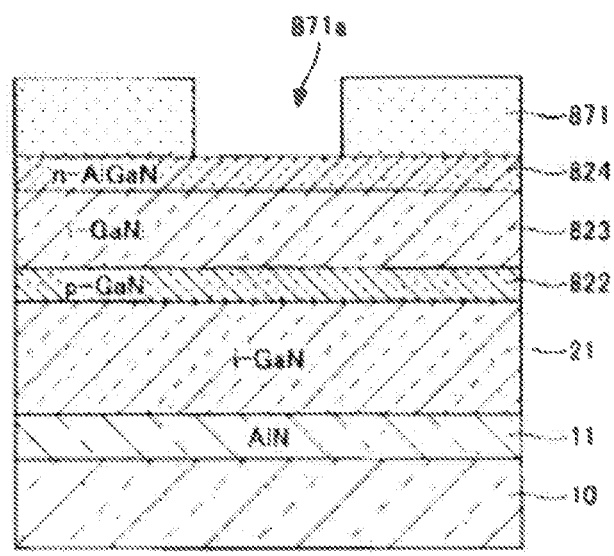

Next, as illustrated in FIG. 64B, a resist pattern 871, which has an opening 871a in a region in which a first opening 851, which will be described later, is formed, is formed on the n-AlGaN layer 824. Specifically, a photoresist is applied onto the n-AlGaN layer 824, and exposure by an exposure apparatus and development are performed to form the resist pattern 871 having the opening 871a.

Figure 64C:
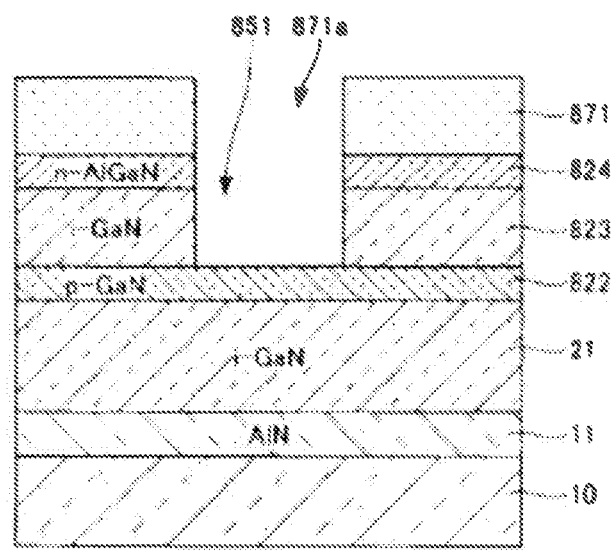

Next, as illustrated in FIG. 64C, the n-AlGaN layer 824 and the i-GaN layer 823 in the opening 871a of the resist pattern 871 are removed by dry etching such as RIE using a chlorine-based gas to expose a front surface of the p-GaN layer 822. According to this, the first opening 851 is formed.

Figure 65A:
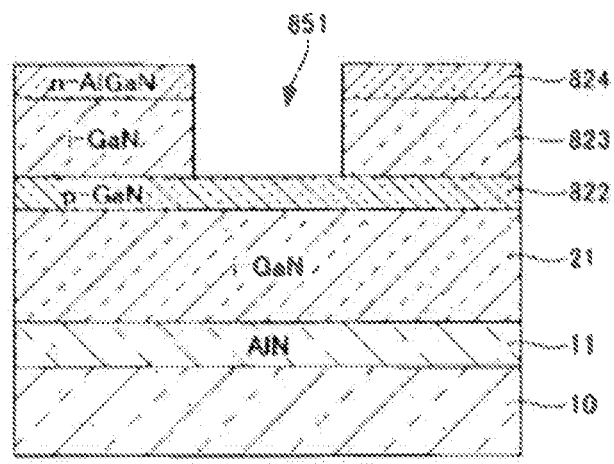
FIGS. 65A to 65C are process diagrams (Part 2) of the method of manufacturing the semiconductor device in the fifteenth embodiment.

Next, as illustrated in FIG. 65A, the resist pattern 871 is removed by an organic solvent and the like.

Figure 65B:
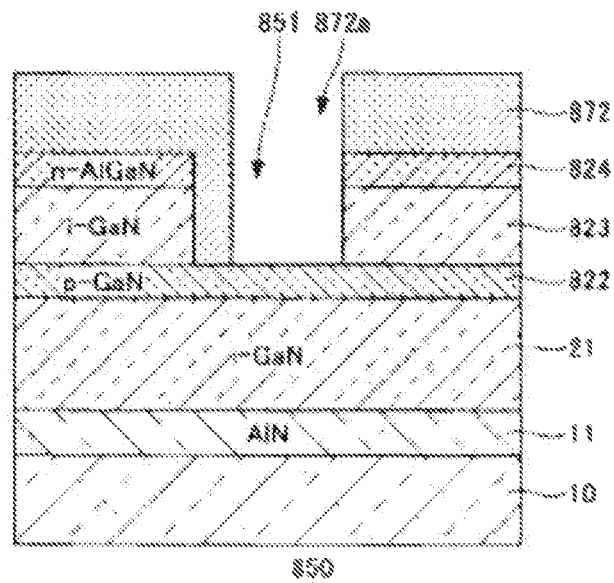

Next, as illustrated in FIG. 65B, a resist pattern 872, which is configured to form a second opening 852, which will be described later, in a bottom surface of the first opening 851, is formed. Specifically, a photoresist is applied onto the n-AlGaN layer 824 and the p-GaN layer 822 that corresponds to the bottom surface of the first opening 851, and exposure by an exposure apparatus and development are performed to form the resist pattern 872. The resist pattern 872 that is formed has an opening 872a with a shape corresponding to a shape of the second opening 852, which will be described later. Accordingly, the opening 872a is formed inside the first opening 851, and is formed in such a manner that a source electrode 42 side on the p-GaN layer 822, which becomes the bottom surface of the first opening 851, is covered. Accordingly, the opening 872a of the resist pattern 872 is smaller than the first opening 851.

Figure 65C:
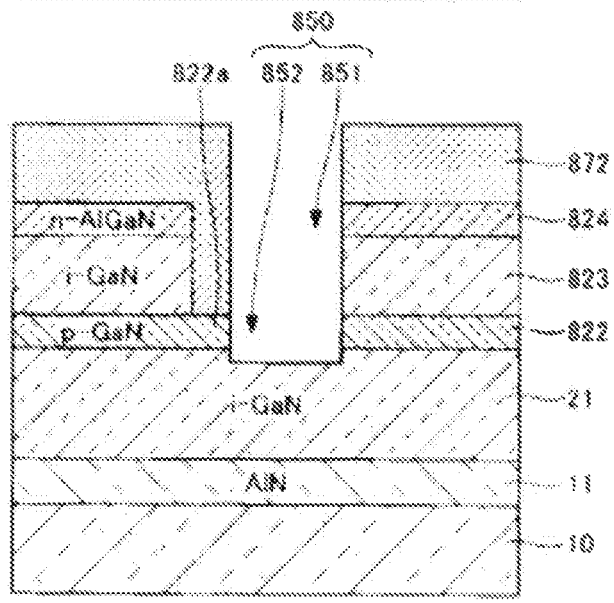

Next, as illustrated in FIG. 65C, the p-GaN layer 822 and a part of the i-GaN layer 21 in the opening 872a of the resist pattern 872 are removed by dry etching such as RIE using a chlorine-based gas to form the second opening 852. According to this, the overhang portion 822a, which overhangs in the second opening 852 in relation to the first opening 851, is formed on a side surface on a source electrode 42 side of the p-GaN layer 822. In this embodiment, an opening 850 is constituted by the first opening 851 in which the overhang portion 822a is formed and the second opening 852.

Figure 66A:
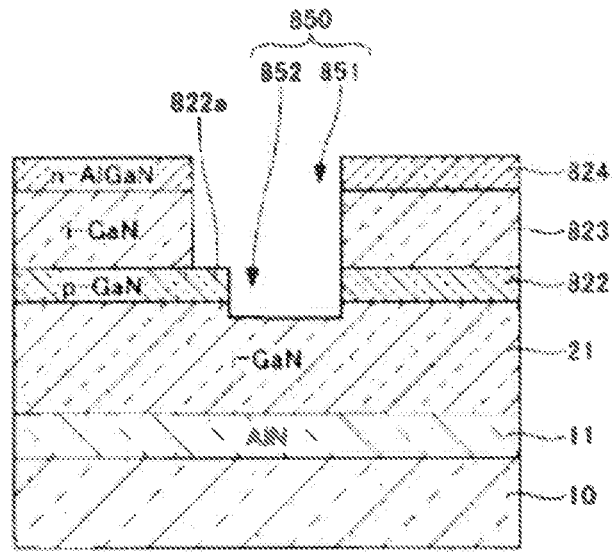
FIGS. 66A to 66C are process diagrams (Part 3) of the method of manufacturing the semiconductor device in the fifteenth embodiment.

Next, as illustrated in FIG. 66A, the resist pattern 872 is removed by an organic solvent and the like.

Figure 66B:
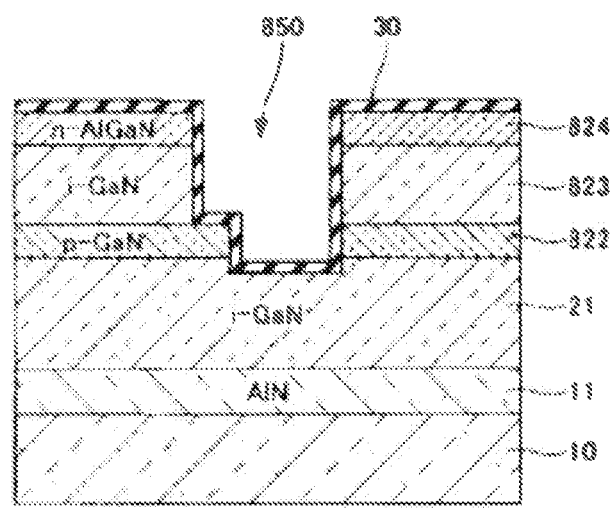

Next, as illustrated in FIG. 66B, the insulating layer 30 is formed on a bottom surface and a side surface of the opening 850 and on the n-AlGaN layer 824. The insulating layer 30 is formed from Al$_2$O$_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 850, on a side surface of the p-GaN layer 822 and on the p-GaN layer 822, on side surfaces of the i-GaN layer 823 and the n-AlGaN layer 824, and on the n-AlGaN layer 824.

Figure 66C:
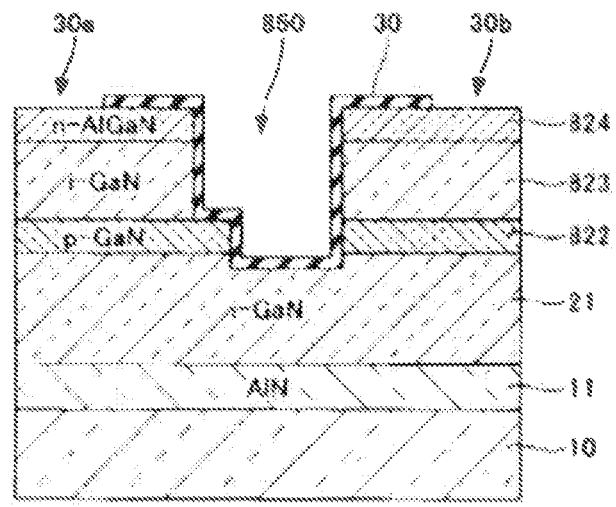

Next, as illustrated in FIG. 66C, the insulating layer 30 in regions in which the source electrode 42 and the drain electrode 43 are formed are removed to expose the n-AlGaN layer 824, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the n-AlGaN layer 824, thereby forming the openings 30a and 30b. Then, the resist pattern (not shown) is removed by an organic solvent and the like.

Figure 67A:
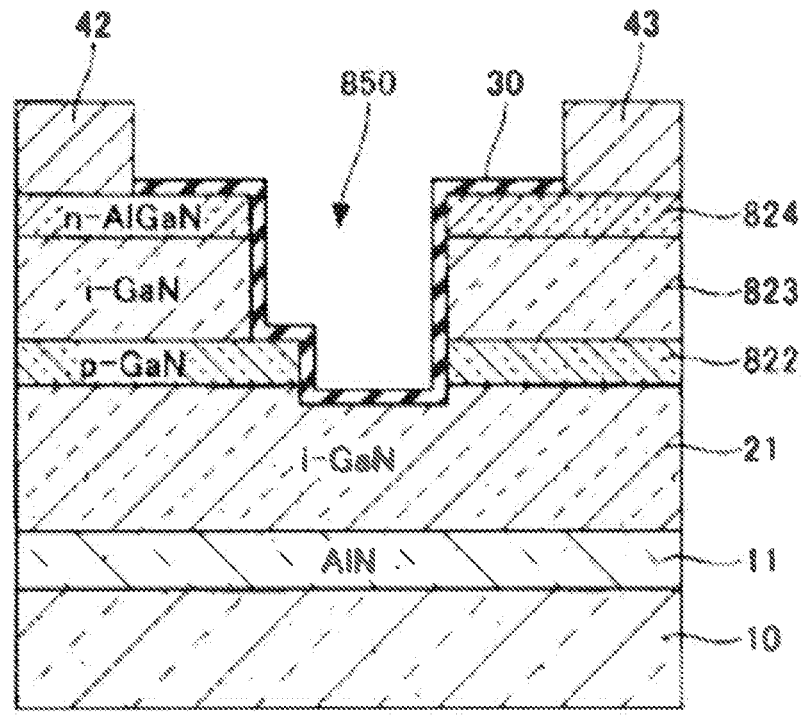
FIGS. 67A and 67B are process diagrams (Part 4) of the method of manufacturing the semiconductor device in the fifteenth embodiment.

Next, as illustrated in FIG. 67A, the source electrode 42 and the drain electrode 43 are formed in the openings 30a and 30b of the insulating layer 30 through which the n-AlGaN layer 824 is exposed. Specifically, a photoresist is applied onto the n-AlGaN layer 824 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 67B:
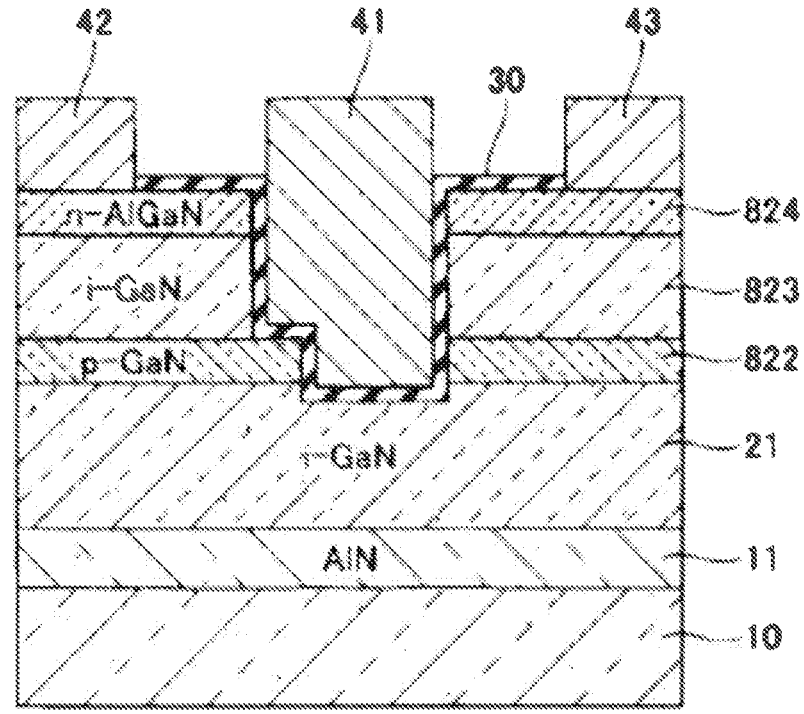

Next, as illustrated in FIG. 67B, the gate electrode 41 is formed on the insulating layer 30 in a region in which the opening 850 is formed. Specifically, a photoresist is applied onto the insulating layer 30, and exposure by an exposure apparatus and development are performed to form a resist pattern (not shown) having the opening 850 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 850.

According to this, the semiconductor device in this embodiment may be manufactured.

It is noted that contents other than the above-described contents are the same as that of the first embodiment.

Sixteenth Embodiment

Semiconductor Device

Figure 68:
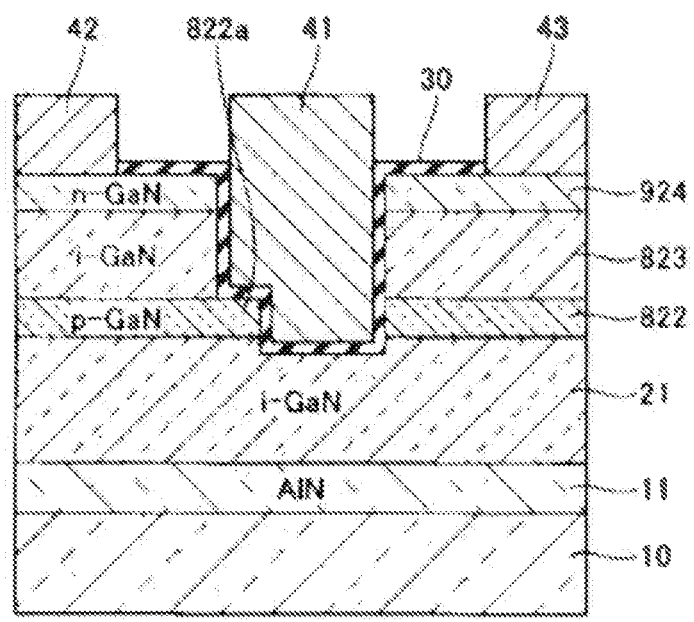
FIG. 68 is a structural diagram of a semiconductor device in a sixteenth embodiment.

Next, a semiconductor device in a sixteenth embodiment will be described with reference to FIG. 68. In the semiconductor device in this embodiment, as nitride semiconductor layers, an AlN layer 11, an i-GaN layer 21, a p-GaN layer 822, an i-GaN layer 823, and an n-GaN layer 924 are formed on a substrate 10 that is formed from a semiconductor material and the like. In this embodiment, the i-GaN layer 21, the p-GaN layer 822, the i-GaN layer 823, and the n-GaN layer 924 may be described as a first semiconductor layer, a second semiconductor layer, a third semiconductor layer, and a fourth semiconductor layer, respectively.

A source electrode 42 and a drain electrode 43 are formed on the n-GaN layer 924, and in a region in which a gate electrode 41 is formed, the n-GaN layer 924, the i-GaN layer 823, and the p-GaN layer 822 are removed. However, in the region in which the gate electrode 41 is formed, the i-GaN layer 21 may be partially removed.

In this embodiment, in a corner on a source electrode 42 side in the region that is removed as described above, an overhang portion 822a in which a part of an upper surface and a side surface of the p-GaN layer 822 are exposed is formed. According to this, with regard to a length of the p-GaN layer 822 that is affected by the gate electrode 41 through an insulating layer 30, a length on a source electrode 42 side may be further increased in comparison to a length on a drain electrode 43 side. Accordingly, the gate threshold voltage may be increased, and thus the on-current may be increased.

That is, in the overhang portion 822a of the p-GaN layer 822, a part of the upper surface and the side surface of the p-GaN layer 822 overhang on the source electrode 42 side, and thus a length of the p-GaN layer 822 that is affected by the gate electrode 41 through the insulating layer 30 increases. According to this, it is possible to obtain the same effect in a case where the film thickness of the p-GaN layer 822 is made to be large, and thus the gate threshold voltage may be increased. On the other hand, on a drain electrode 43 side, an overhang portion is not formed on a side surface of the p-GaN layer 822, and thus the length of the p-GaN layer 822 that is affected by the gate electrode 41 through the insulating layer 30 decreases, and thus the on-current may be increased.

Method of Manufacturing Semiconductor Device

Next, a method of manufacturing a semiconductor device in this embodiment will be described.

Figure 69A:
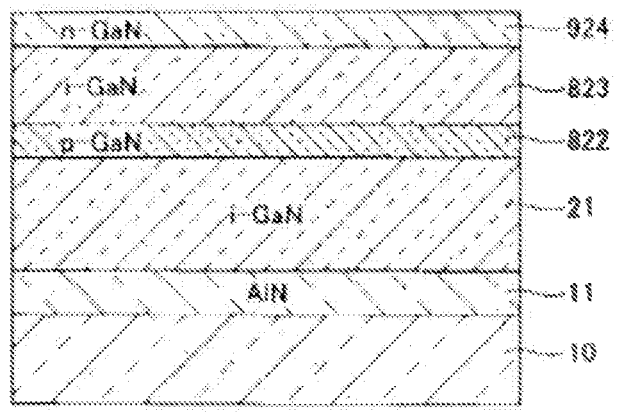
FIGS. 69A to 69C are process diagrams (Part 1) of a method of manufacturing the semiconductor device in the sixteenth embodiment.

First, as illustrated in FIG. 69A, the AlN layer 11, the i-GaN layer 21 that is a first semiconductor layer, the p-GaN layer 822 that is a second semiconductor layer, the i-GaN layer 823 that is a third semiconductor layer, and the n-GaN layer 924 that is a fourth semiconductor layer are formed on the substrate 10. In this embodiment, the AlN layer 11, the i-GaN layer 21, the p-GaN layer 822, the i-GaN layer 823, and the n-GaN layer 924 are formed from a nitride semiconductor, and are formed by epitaxial growth by metal-organic vapor phase epitaxy (MOVPE).

The substrate 10 is constituted by a silicon semiconductor substrate and the like, and the AlN layer 11 is a buffer layer. The i-GaN layer 21 has a thickness of 3 μm. The p-GaN layer 822 has a thickness of 100 nm and is doped with Mg as a p-type impurity element at a concentration of $1 \times 10^{19}$ $cm^{-3}$. The i-GaN layer 823 has a thickness of 500 nm. The n-GaN layer 924 has a thickness of 500 nm and is doped with Si as an n-type impurity element at a concentration of $1 \times 10^{18}$ $cm^{-3}$.

Then, although not shown, an element isolation region may be formed. Specifically, a photoresist is applied onto the n-GaN layer 924, and exposure by an exposure apparatus and development are performed to form a resist pattern (not shown) having an opening in a region in which the element isolation region is formed. Then, dry etching using a chlorine-based gas or ion implantation of Ar and the like is performed to form the element isolation region (not shown). Then, the resist pattern (not shown) is removed by an organic solvent and the like.

Figure 69B:
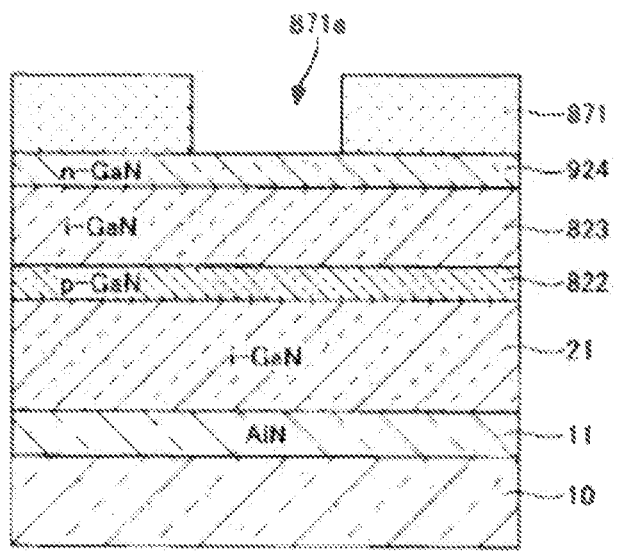

Next, as illustrated in FIG. 69B, a resist pattern 871, which has an opening 871a in a region in which a first opening 851, which will be described later, is formed, is formed on the n-GaN layer 924. Specifically, a photoresist is applied onto the n-GaN layer 924, and exposure by an exposure apparatus and development are performed to form the resist pattern 871 having the opening 871a.

Figure 69C:
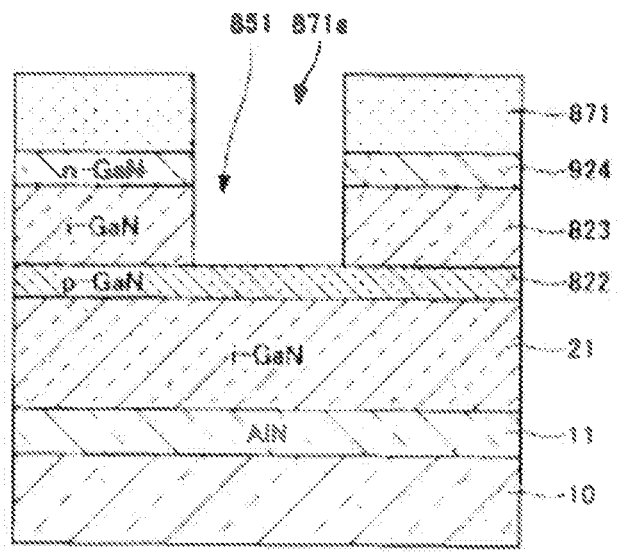

Next, as illustrated in FIG. 69C, the n-GaN layer 924 and the i-GaN layer 823 in the opening 871a of the resist pattern 871 are removed by dry etching such as RIE using a chlorine-based gas to expose a front surface of the p-GaN layer 822. According to this, the first opening 851 is formed.

Figure 70A:
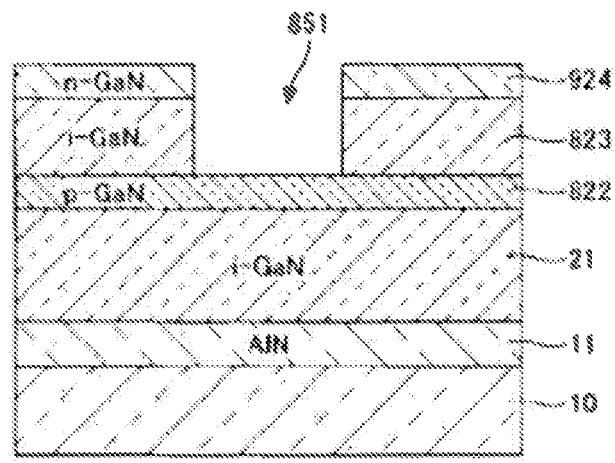
FIGS. 70A to 70C are process diagrams (Part 2) of the method of manufacturing the semiconductor device in the sixteenth embodiment.

Next, as illustrated in FIG. 70A, the resist pattern 871 is removed by an organic solvent and the like.

Figure 70B:
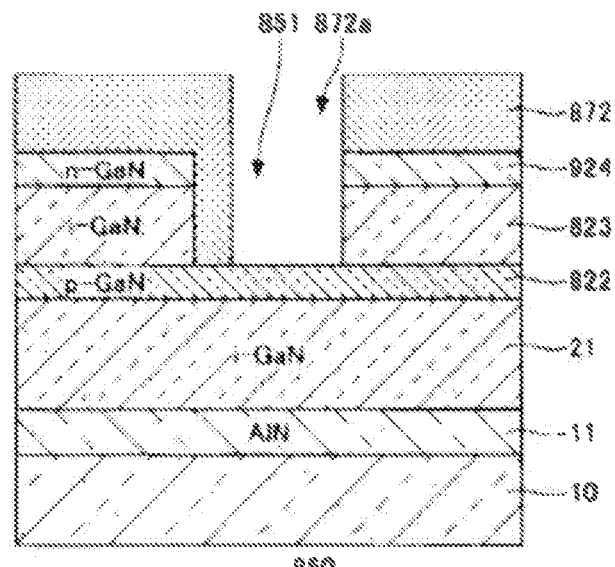

Next, as illustrated in FIG. 70B, a resist pattern 872, which is configured to form a second opening 852, which will be described later, in a bottom surface of the first opening 851, is formed. Specifically, a photoresist is applied onto the n-GaN layer 924 and the p-GaN layer 822 that corresponds to the bottom surface of the first opening 851, and exposure by an exposure apparatus and development are performed to form the resist pattern 872. The resist pattern 872 that is formed has an opening 872a with a shape corresponding to a shape of the second opening 852, which will be described later. Accordingly, the opening 872a is formed inside the first opening 851, and is formed in such a manner that a source electrode 42 side on the p-GaN layer 822, which becomes the bottom surface of the first opening 851, is covered. Accordingly, the opening 872a of the resist pattern 872 is smaller than the first opening 851.

Figure 70C:
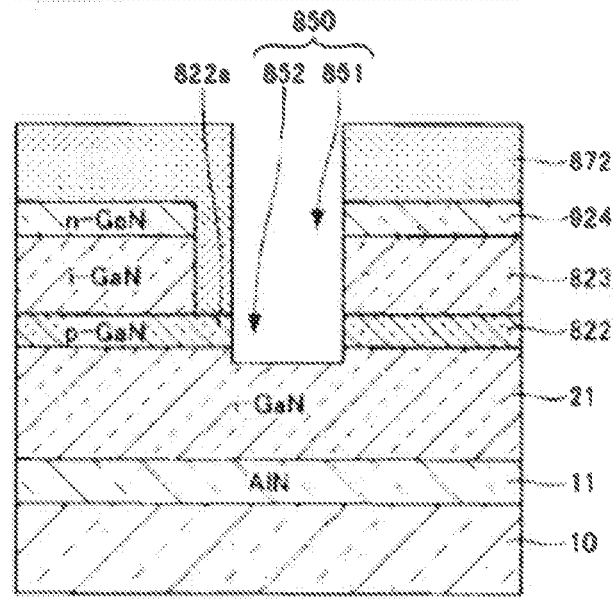

Next, as illustrated in FIG. 70C, the p-GaN layer 822 and a part of the i-GaN layer 21 in the opening 872a of the resist pattern 872 are removed by dry etching such as RIE using a chlorine-based gas to form the second opening 852. According to this, the overhang portion 822a, which overhangs in the second opening 852 in relation to the first opening 851, is formed on a side surface on a source electrode 42 side of the p-GaN layer 822. In this embodiment, an opening 850 is constituted by the first opening 851 in which the overhang portion 822a is formed and the second opening 852.

Figure 71A:
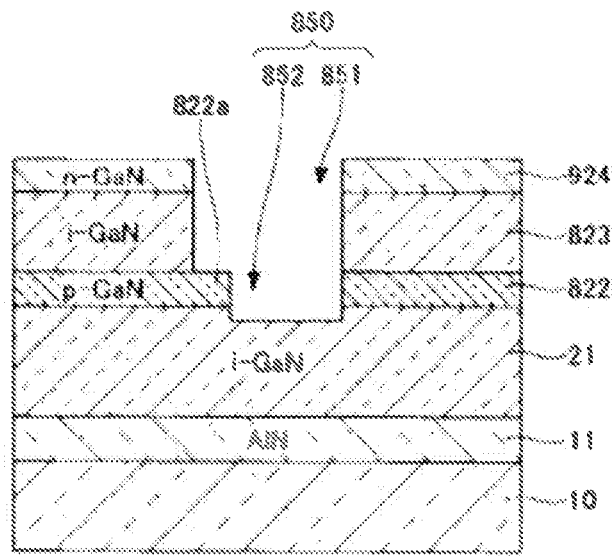
FIGS. 71A to 71C are process diagrams (Part 3) of the method of manufacturing the semiconductor device in the sixteenth embodiment.

Next, as illustrated in FIG. 71A, the resist pattern 872 is removed by an organic solvent and the like.

Figure 71B:
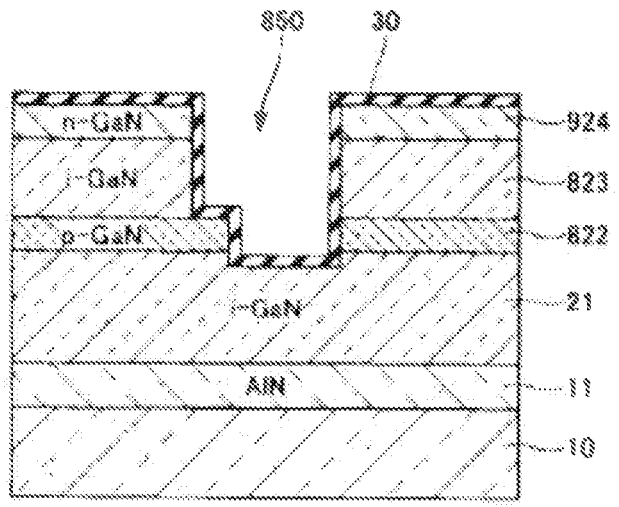

Next, as illustrated in FIG. 71B, the insulating layer 30 is formed on a bottom surface and a side surface of the opening 850 and on the n-GaN layer 924. The insulating layer 30 is formed from $Al_2O_3$ having a film thickness of 2 nm to 200 nm, for example, 20 nm. Examples of a method of forming the insulating layer 30 include ALD, sputtering, plasma CVD, and the like. In this embodiment, the insulating layer 30 is formed by the ALD. According to this, the insulating layer 30 is formed on the i-GaN layer 21 that becomes a bottom surface of the opening 850, on a side surface of the p-GaN layer 822 and on the p-GaN layer 822, on side surfaces of the i-GaN layer 823 and the n-GaN layer 924, and on the n-GaN layer 924.

Figure 71C:
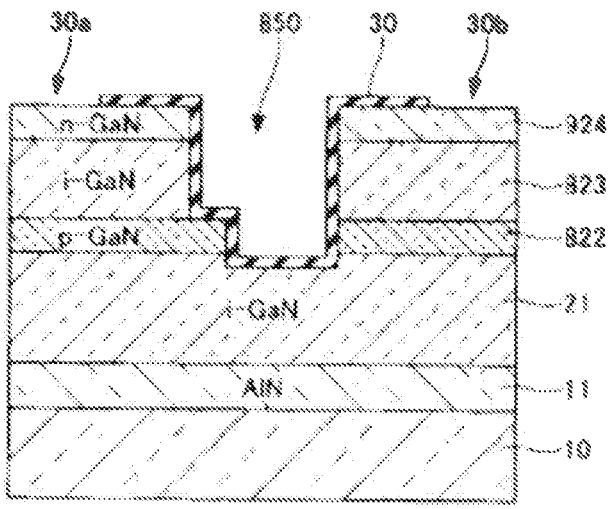

Next, as illustrated in FIG. 71C, the insulating layer 30 in regions in which the source electrode 42 and the drain electrode 43 are formed are removed to expose the n-GaN layer 924, thereby forming openings 30a and 30b. Specifically, a photoresist is applied to a front surface of the insulating layer 30, and exposure by an exposure apparatus and development are performed to form a resist pattern (not shown) having openings in the regions in which the source electrode 42 and the drain electrode 43 are formed. Then, the insulating layer 30 in a region in which the resist pattern is not formed is removed by dry etching using a fluorine-based gas or a chlorine-based gas or wet etching to expose to a front surface of the n-GaN layer 924, thereby forming the openings 30a and 30b. Then, the resist pattern (not shown) is removed by an organic solvent and the like.

Figure 72A:
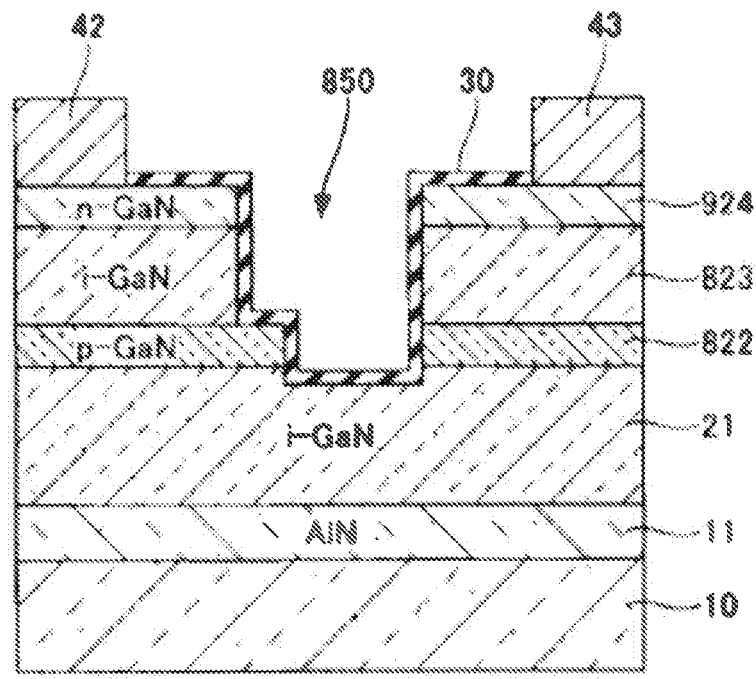
FIGS. 72A and 72B are process diagrams (Part 4) of the method of manufacturing the semiconductor device in the sixteenth embodiment.

Next, as illustrated in FIG. 72A, the source electrode 42 and the drain electrode 43 are formed in the openings 30a and 30b of the insulating layer 30 through which the n-GaN layer 924 is exposed. Specifically, a photoresist is applied onto the n-GaN layer 924 and the insulating layer 30, and exposure by an exposure apparatus and development are performed to form a resist pattern (not shown) having openings in regions in which the source electrode 42 and the drain electrode 43 are formed. Then, Ti having a film thickness of 20 nm and Al having a film thickness of 200 nm are laminated by vacuum deposition and the like to form a film, thereby forming a metal laminated film (Ti/Al). Then, the metal laminated film formed on the resist pattern is removed together with the resist pattern by immersion in an organic solvent and the like to form the source electrode 42 and the drain electrode 43 by the metal laminated film that remains. Then, a heat treatment is performed in a nitrogen atmosphere at a temperature of 400° C. to 1000° C., for example, at a temperature of 550° C. to establish ohmic contact.

Figure 72B:
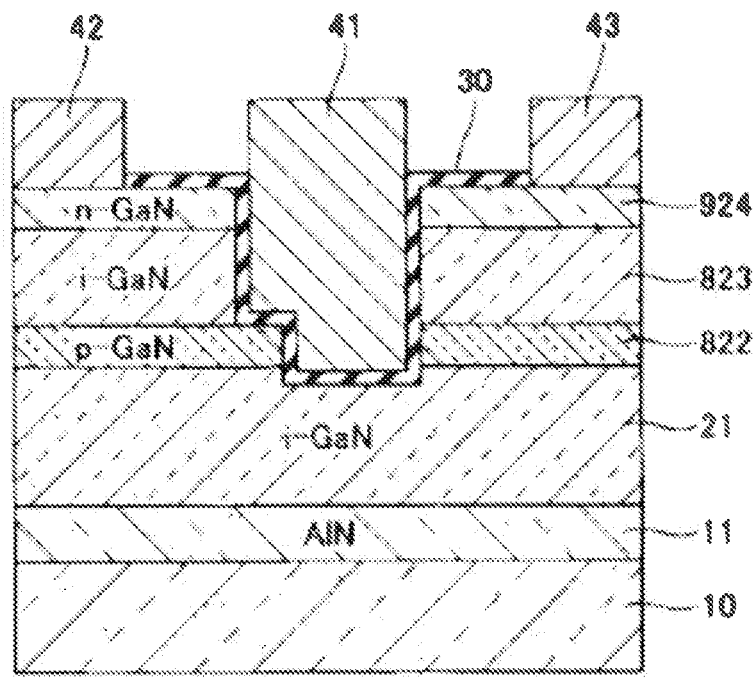

Next, as illustrated in FIG. 72B, the gate electrode 41 is formed on the insulating layer 30 in a region in which the opening 850 is formed. Specifically, a photoresist is applied onto the insulating layer 30, and exposure by an exposure apparatus and development are performed to form a resist pattern (not shown) having the opening 850 through the insulating layer 30, that is, an opening in a region in which the gate electrode 41 is formed. Then, Ni having a film thickness of 30 nm and Au having a film thickness of 400 nm are laminated by vacuum deposition and the like to form a metal laminated film (Ni/Au). Then, the metal laminated film formed on the resist pattern is removed together with the resist pattern by immersion in an organic solvent and the like to form the gate electrode 41 by the metal laminated film that remains in the opening 850.

According to this, the semiconductor device in this embodiment may be manufactured.

It is noted that contents other than the above-described contents are the same as that of the fifteenth embodiment.

Hereinbefore, embodiments have been described in detail, but there is no limitation to specific embodiments. Various modifications and changes may be made in a range of the attached claims.

With regard to the above-described description, the following appendixes are disclosed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device comprising:
a first semiconductor layer which is formed over a substrate and is formed from a nitride semiconductor;
a second semiconductor layer which is formed over the first semiconductor layer and is formed from a nitride semiconductor;
a third semiconductor layer which is formed over the second semiconductor layer and is formed from a nitride semiconductor;
a source electrode and a drain electrode which are formed over the third semiconductor layer;
a recess formed in the first semiconductor layer between the source electrode and the drain electrode;
a trench penetrates the second semiconductor layer and the third semiconductor layer between the source electrode and the drain electrode, and reaches the recess;
an insulating layer which is formed on a side surface and a bottom surface of the trench; and
a gate electrode which is formed in the opening through the insulating layer,
wherein the gate electrode includes a first gate electrode portion which is formed to come into contact with the insulating layer on a source electrode side, and a second gate electrode portion which is formed to come into contact with the insulating layer on a drain electrode side, the first gate electrode portion and the second gate electrode portion being formed in the trench, and
the first gate electrode portion and the second gate electrode portion are formed from materials different from each other.
2. The semiconductor device according to claim 1, wherein the second semiconductor layer is constituted by a first conductive type semiconductor layer, and
the third semiconductor layer is constituted by a second conductive type semiconductor layer.
3. The semiconductor device according to claim 2, wherein the first conductive type is a p-type.
4. The semiconductor device according to claim 2, wherein the second conductive type is an n-type.

5. The semiconductor device according to claim 1,
wherein the third semiconductor layer is constituted by a first conductive type semiconductor layer, and
the second semiconductor layer is formed from a material having a band gap wider than that of the first semiconductor layer and the third semiconductor layer.

6. The semiconductor device according to claim 1,
wherein the first gate electrode portion is formed from a material having a work function higher than that of the second gate electrode portion.

7. The semiconductor device according to claim 1,
wherein the first gate electrode portion is formed from a material having a work function of 4.5 eV or more, and
the second gate electrode portion is formed from a material having a work function of less than 4.5 eV.

8. The semiconductor device according to claim 1,
wherein the second semiconductor layer is formed from a material which contains GaN.

9. The semiconductor device according to claim 1,
wherein the third semiconductor layer is formed from a material which contains GaN.

10. A semiconductor device comprising:
an i-GaN layer formed over a substrate;
a p-GaN layer formed over the i-GaN layer;
an n-GaN layer formed over the p-GaN layer;
a source electrode and a drain electrode which are formed over the an n-GaN layer;
a recess formed in the i-GaN layer between the source electrode and the drain electrode;
a trench penetrates the p-GaN layer and the n-GaN layer between the source electrode and the drain electrode, and reaches the recess;
an insulating layer which is formed on a side surface and a bottom surface of the trench; and
a gate electrode which is formed in the trench through the insulating layer.

* * * * *